US008194094B2

(12) United States Patent
Sakaigawa et al.

(10) Patent No.: US 8,194,094 B2
(45) Date of Patent: Jun. 5, 2012

(54) IMAGE DISPLAY APPARATUS AND DRIVING METHOD THEREOF, AND IMAGE DISPLAY APPARATUS ASSEMBLY AND DRIVING METHOD THEREOF

(75) Inventors: Akira Sakaigawa, Kanagawa (JP); Yukiko Iijima, Tokyo (JP); Amane Higashi, Kanagawa (JP); Koji Noguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 522 days.

(21) Appl. No.: 12/484,585

(22) Filed: Jun. 15, 2009

(65) Prior Publication Data

US 2009/0315921 A1 Dec. 24, 2009

(30) Foreign Application Priority Data

Jun. 23, 2008 (JP) ................................ 2008-163100
Mar. 30, 2009 (JP) ................................ 2009-081605

(51) Int. Cl.

| | |
|---|---|
| ***G09G 5/00*** | (2006.01) |
| ***G09G 3/30*** | (2006.01) |
| ***G09G 5/02*** | (2006.01) |
| ***G09G 5/10*** | (2006.01) |
| ***H04N 5/202*** | (2006.01) |
| ***H04N 1/46*** | (2006.01) |
| ***G06K 9/00*** | (2006.01) |
| *H04N 5/335* | (2006.01) |
| *H04N 5/66* | (2006.01) |
| *H04N 9/12* | (2006.01) |
| *G02F 1/13* | (2006.01) |
| *G02F 1/13335* | (2006.01) |
| *G03F 3/08* | (2006.01) |
| *G06K 9/40* | (2006.01) |

(52) U.S. Cl. ........ 345/589; 345/204; 345/606; 345/690; 345/77; 348/254; 348/273; 348/739; 348/743; 349/1; 349/106; 349/108; 358/512; 358/518; 358/525; 358/448; 382/167; 382/254; 382/260; 382/274

(58) Field of Classification Search .................. 345/581, 345/589–593, 600–606, 618–619, 643–644, 345/204, 690, 77, 87–88, 55, 38, 63; 348/253–256, 348/270–271, 273, 277, 279, 552, 560, 571, 348/630, 671, 739, 743; 349/1, 78, 80, 106, 349/108

See application file for complete search history.

(56) References Cited

U.S. PATENT DOCUMENTS

2005/0243047 A1* 11/2005 Asao ............................... 345/88

(Continued)

FOREIGN PATENT DOCUMENTS

| | | |
|---|---|---|
| JP | 04-130395 | 3/2001 |
| JP | 2004-286814 | 10/2004 |
| JP | 2001-147666 | 5/2005 |

(Continued)

*Primary Examiner* — Wesner Sajous

(74) *Attorney, Agent, or Firm* — Robert J. Depke; Rockey, Depke & Lyons, LLC

(57) ABSTRACT

An image display apparatus includes: an image display panel having a two-dimensional matrix with (P×Q) pixels each including first, second and third sub-pixels for displaying respective first, second and third elementary colors, and fourth sub-pixel for displaying a fourth color; and a signal processing section configured to receive first, second and third sub-pixel input signals respectively provided with signal values of $x_{1-(p,\ q)}$, $x_{2-(p,\ q)}$ and $x_{3-(p,\ q)}$, and to output first, second, third and fourth sub-pixel output signals respectively provided with signal values of $X_{1-(p,\ q)}$, $X_{2-(p,\ q)}$, $X_{3-(p,\ q)}$ and $X_{4-(p,\ q)}$, which used for determining the display gradations of the first, second, third, and fourth sub-pixels, respectively, with regard to a (p, q)th pixel where notations p and q are integers satisfying equations $1 \leqq p \leqq P$ and $1 \leqq q \leqq Q$.

19 Claims, 19 Drawing Sheets

U.S. PATENT DOCUMENTS

| | | | | |
|---|---|---|---|---|
| 2006/0132677 | A1* | 6/2006 | Asao | 349/106 |
| 2007/0080912 | A1* | 4/2007 | Asao | 345/87 |
| 2008/0291289 | A1* | 11/2008 | Kurane | 348/222.1 |
| 2009/0046107 | A1* | 2/2009 | Asao et al. | 345/597 |
| 2009/0085924 | A1* | 4/2009 | Ben-Chorin et al. | 345/591 |
| 2009/0121992 | A1* | 5/2009 | Asao et al. | 345/88 |

FOREIGN PATENT DOCUMENTS

| | | |
|---|---|---|
| JP | 2005-196184 | 7/2005 |
| JP | 2001-147666 | 5/2006 |
| JP | 2009-048166 | 3/2009 |
| JP | 2009-192887 | 8/2009 |
| JP | 2010-020241 | 1/2010 |

* cited by examiner

IMAGE DISPLAY APPARATUS AND DRIVING METHOD THEREOF, AND IMAGE DISPLAY APPARATUS ASSEMBLY AND DRIVING METHOD THEREOF

The present application contains subject matter related to that disclosed in Japanese Priority Patent Applications JP 2008-163100 filed in the Japan Patent Office on Jun. 23, 2008 and JP 2009-081605 filed in the Japan Patent Office on Mar. 30, 2009, the entire content of which is hereby incorporated by reference.

BACKGROUND OF THE INVENTION

1. Field of the Invention

The present invention relates to an image display apparatus, a driving method of the image display apparatus, an image display apparatus assembly employing the image display apparatus and a driving method of the image display apparatus assembly.

2. Description of the Related Art

In recent years, in the case of an image display apparatus such as a color liquid-crystal display apparatus for example, the increased performance raises a problem of the increased power consumption. In particular, with the improved fineness, the widened color reproduction range and the increased luminance, in the case of the color liquid-crystal display apparatus for example, the power consumption of the backlight undesirably rises. In order to solve these problems, attention is paid to a technology for improving the luminance of the display by making use of a white-color display sub-pixel for displaying a white color. In accordance with the technology, a display pixel is configured to include four sub-pixels which are typically the white-color display sub-pixel in addition to three other sub-pixels. i.e., a red-color display sub-pixel for displaying a red color, a green-color display sub-pixel for displaying a green color and a blue-color display sub-pixel for displaying a blue color. In addition, with the same power consumption as the existing image display apparatus, the configuration based on the four sub-pixels gives a high luminance and, therefore, the power consumption of the backlight can be reduced to provide the same luminance as the existing image display apparatus.

In this case, as an example, a color-image display apparatus disclosed in Japanese Patent No. 3167026 employs:

means for generating color signals of three different types in an additive color three elementary color process from an input signal; and means for generating an auxiliary signal by carrying out an additive color process on the color signals having different hues at equal rates and for providing a display section with four different type display signals, i.e., the auxiliary signal and three different-type color signals which are each obtained by subtracting the auxiliary signal from one of the three different color signals having three different hues.

It is to be noted that the color signals of three different types are used for driving the red-color display sub pixel, the green-color display sub pixel and the blue-color display sub pixel respectively. On the other hand, the auxiliary signal is used for driving the white-color display sub pixel.

In addition, Japanese Patent No. 3805150 discloses a liquid-crystal display apparatus capable of color displaying. The liquid-crystal display apparatus is provided with a liquid-crystal panel employing main pixel units which each has a red-color output sub-pixel, a green-color output sub-pixel, a blue-color output sub-pixel, and an intensity sub-pixel. The liquid-crystal display apparatus has operating means for making use of digital values Ri, Gi and Bi, which are obtained for the red-color input sub-pixel, the green-color input sub-pixel and the blue-color input sub-pixel respectively from an input image signal, for finding a digital value W for an intensity sub-pixel as well as a digital value Ro for driving the red-color output sub-pixel, a digital value Go for driving the green-color output sub-pixel and a digital value Bo for the blue-color output sub-pixel. The operating means is characterized in that the operating means finds a digital value Ro, a digital value Go, a digital value Bo and a digital value W which satisfy the following conditions:

$$Ri:Gi:Bi=(Ro+W):(Go+W):(Bo+W),$$

and the values Ro, Go, Bo and W improve the luminance by virtue of the addition of the luminance sub-pixel in a comparison with the configuration including only the red-color input sub-pixel, the green-color input sub-pixel and the blue-color input sub-pixel.

SUMMARY OF THE INVENTION

The technologies disclosed in Japanese Patent No. 3167026 and Japanese Patent No. 3805150 increase the luminance of the white-color display sub-pixel but do not increase the luminance of each of the red-color display sub-pixel, the green-color display sub-pixel and the blue-color display sub-pixel. Thus, the technologies raise a problem that color dullness is generated. The phenomenon of the color-dullness generation is referred to as simultaneous contrast. In particular, in the case of the yellow color with a high luminosity factor, the generation of the simultaneous-contrast phenomenon is striking.

Thus, it is desirable to provide an image display apparatus capable of reliably avoiding the problem of the generation of the color dullness, a driving method for driving the image display apparatus, an image display apparatus assembly and a driving method of the image display apparatus assembly.

In order to solve the problems described above, in accordance with a first form of the present invention, there is provided an image display apparatus (such as an image display apparatus 10 shown in a block diagram of FIG. 1) which employs:

(A): an image display panel (such as an image display panel 30) having a two-dimensional matrix serving as a layout of P×Q pixels each including a first sub-pixel for displaying a first color, a second sub-pixel for displaying a second color, a third sub-pixel for displaying a third color and a fourth sub-pixel for displaying a fourth color; and (B): a signal processing section (such as a signal processing section 20) for receiving a first sub-pixel input signal provided with a signal value of $x_{1-(p,q)}$, a second sub-pixel input signal provided with a signal value of $x_{2-(p,q)}$ and a third sub-pixel input signal provided with a signal value of $x_{3-(p,q)}$ and for outputting a first sub-pixel output signal provided with a signal value of $X_{1-(p,q)}$ and used for determining the display gradation of the first sub-pixel, a second sub-pixel output signal provided with a signal value of $X_{2-(p,q)}$ and used for determining the display gradation of the second sub-pixel, a third sub-pixel output signal provided with a signal value of $X_{3-(p,q)}$ and used for determining the display gradation of the third sub-pixel as well as a fourth sub-pixel output signal provided with a signal value of $X_{4-(p,q)}$ and used for determining the display gradation of the fourth sub-pixel with regard to a (p, q)th pixel where notations p and q are integers satisfying the equations $1 \leqq p \leqq P$ and $1 \leqq q \leqq Q$.

In order to solve the problems described above, there is provided an image display apparatus assembly including the above-described image display apparatus according to the first form of the present invention and a planar light-source apparatus (such as a planar light-source apparatus 50) for radiating light to the back surface of the image display apparatus.

In the image display apparatus according to the first form of the present invention and the image display apparatus assembly, in an HSV color space enlarged by adding the fourth color, a maximum lightness value $V_{max}(S)$ expressed as a function of variable saturation S is stored in the signal processing section. The signal processing section carries out the following processes of:

(B-1): finding the saturation S and the lightness value V(S) for each of a plurality of pixels on the basis of the signal values of sub-pixel input signals in the pixels;

(B-2): finding an extension coefficient α0 on the basis of at least one of ratios $V_{max}(S)/V(S)$ found in the pixels;

(B-3): finding the output signal value $X_{4-(p, q)}$ in the (p, q)th pixel on the basis of at least the input signal values $x_{1-(p, q)}$, $x_{2-(p, q)}$ and $x_{3-(p, q)}$; and (B-4): finding the output signal value $X_{1-(p, q)}$ in the (p, q)th pixel on the basis of the input signal value $x_{1-(p, q)}$, the extension coefficient $\alpha_0$ and the output signal value $X_{4-(p, q)}$, finding the output signal value $X_{2-(p, q)}$ in the (p, q)th pixel on the basis of the input signal value $x_{2-(p, q)}$, the extension coefficient $\alpha_0$ and the output signal value $X_{4-(p, q)}$ and finding the output signal value $X_{3-(p, q)}$ in the (p, q)th pixel on the basis of the input signal value $x_{3-(p, q)}$, the extension coefficient $\alpha_0$ and the output signal value $X_{4-(p, q)}$.

In this case, it is desirable to provide the image display apparatus assembly provided by the present invention with a configuration in which the luminance of light generated by the planar light-source apparatus is reduced on the basis of the extension coefficient $\alpha_0$.

On the other hand, in order to solve the problems described above, in accordance with a second form of the present invention, there is an image display apparatus (such as an image display apparatus shown in the diagram of FIG. 16) which employs:

(A-1): a first image display panel (such as a red-color light emitting device panel 300R) having a two-dimensional-matrix serving as a layout of P×Q first sub-pixels each used for displaying a first elementary color;

(A-2): a second image display panel (such as a green-color light emitting device panel 300G) having a two-dimensional-matrix serving as a layout of P×Q second sub-pixels each used for displaying a second elementary color;

(A-3): a third image display panel (such as a blue-color light emitting device panel 300B) having a two-dimensional-matrix serving as a layout of P×Q third sub-pixels each used for displaying a third elementary color;

(A-4): a fourth image display panel (such as a white-color light emitting device panel 300W) having a two-dimensional-matrix serving as a layout of P×Q fourth sub-pixels each used for displaying a fourth color;

(B): a signal processing section configured to receive a first sub-pixel input signal provided with a signal value of $x_{1-(p, q)}$, a second sub-pixel input signal provided with a signal value of $x_{2-(p, q)}$ and a third sub-pixel input signal provided with a signal value of $x_{3-(p, q)}$ and output a first sub-pixel output signal provided with a signal value of $X_{1-(p, q)}$ and used for determining the display gradation of the first sub-pixel, a second sub-pixel output signal provided with a signal value of $X_{2-(p, q)}$ and used for determining the display gradation of the second sub-pixel, a third sub-pixel output signal provided with a signal value of $X_{3-(p, q)}$ and used for determining the display gradation of the third sub-pixel as well as a fourth sub-pixel output signal provided with a signal value of $X_{4-(p, q)}$ and used for determining the display gradation of the fourth sub-pixel with regard to a (p, q)th first, second and third sub-pixels where notations p and q are integers satisfying the equations $1 \leqq p \leqq P$ and $1 \leqq q \leqq Q$; and (C): a synthesis section configured to synthesize images output by the first, second, third and fourth image display panels.

In addition, in the image display apparatus according to the second form of the present invention, in an HSV color space enlarged by adding the fourth color, a maximum lightness value $V_{max}(S)$ expressed as a function of variable saturation S is stored in the signal processing section. The signal processing section carries out the following processes of:

(B-1): finding the saturation S and the lightness value V(S) for each of a plurality of sets each having first, second and third sub-pixels on the basis of the signal values of sub-pixel input signals in the sets each having first, second and third sub-pixels;

(B-2): finding an extension coefficient $\alpha_0$ on the basis of at least one of ratios $V_{max}(S)/V(S)$ found in the sets each having first, second and third sub-pixels;

(B-3): finding the output signal value $X_{4-(p, q)}$ in the (p, q)th fourth sub-pixel on the basis of at least the input signal values $X_{1-(p, q)}$, $x_{2-(p, q)}$ and $x_{3-(p, q)}$; and (B-4): finding the output signal value $X_{1-(p, q)}$ in the (p, q)th first sub-pixel on the basis of the input signal value $x_{1-(p, q)}$, the extension coefficient $\alpha_0$ and the output signal value $X_{4-(p, q)}$, finding the output signal value $X_{2-(p, q)}$ in the (p, q)th second sub-pixel on the basis of the input signal value $x_{2-(p, q)}$, the extension coefficient $\alpha_0$ and the output signal value $X_{4-(p, q)}$ and finding the output signal value $X_{3-(p, q)}$ in the (p, q)th third sub-pixel on the basis of the input signal value $x_{3-(p, q)}$, the extension coefficient $\alpha_0$ and the output signal value $X_{4-(p, q)}$.

In addition, in order to solve the problems described above, in accordance with a third form of the present invention, there is provided a field sequential system image display apparatus (such as an image display apparatus 10 shown in a block diagram of FIG. 1) employing:

(A): an image display panel (such as an image display panel 30) having a two-dimensional-matrix serving as a layout of P×Q pixels; and (B): a signal processing section (such as a signal processing section 20) for receiving a first input signal provided with a signal value of $x_{1-(p, q)}$, a second input signal provided with a signal value of $x_{2-(p, q)}$ and a third input signal provided with a signal value of $x_{3-(p, q)}$ and for outputting a first output signal provided with a signal value of $X_{1-(p, q)}$ and used for determining the display gradation of the first elementary color, a second output signal provided with a signal value of $X_{2-(p, q)}$ and used for determining the display gradation of the second elementary color, a third output signal provided with a signal value of $X_{3-(p, q)}$ and used for determining the display gradation of the third elementary color as well as a fourth output signal provided with a signal value of $X_{4-(p, q)}$ and used for determining the display gradation of the fourth color with regard to a (p, q)th pixel where notations p and q are integers satisfying the equations $1 \leqq p \leqq P$ and $1 \leqq q \leqq Q$.

In addition, in the image display apparatus according to the third form of the present invention, in an HSV color space enlarged by adding the fourth color, a maximum lightness value $V_{max}$(S) expressed as a function of variable saturation S is stored in the signal processing section. The signal processing section carries out the following processes of:

(B-1): finding the saturation S and the lightness value V(S) for each of a plurality of pixels on the basis of the signal values of first, second and third input signals in the pixels;

(B-2): finding an extension coefficient $\alpha_0$ on the basis of at least one of ratios $V_{max}$(S)/V(S) found in the pixels;

(B-3): finding the output signal value $X_{4-(p,q)}$ in the (p, q)th pixel on the basis of at least the input signal values $x_{1-(p,q)}$, $x_{2-(p,q)}$ and $x_{3-(p,q)}$; and (B-4) finding the output signal value $X_{1-(p,q)}$ in the (p, q)th pixel on the basis of the input signal value $x_{1-(p,q)}$, the extension coefficient $\alpha_0$ and the output signal value $X_{4-(p,q)}$, finding the output signal value $X_{2-(p,q)}$ in the (p, q)th pixel on the basis of the input signal value $x_{2-(p,q)}$, the extension coefficient $\alpha_0$ and the output signal value $X_{4-(p,q)}$ and finding the output signal value $X_{3-(p,q)}$ in the (p, q)th pixel on the basis of the input signal value $x_{3-(p,q)}$, the extension coefficient $\alpha_0$ and the output signal value $X_{4-(p,q)}$.

In addition, an image display apparatus driving method provided by the present invention in accordance with the first form of the present invention in order to solve the problems described above is a method for driving the image display apparatus according to the first form of the present invention.

On top of that, an image display apparatus assembly driving method provided by the present invention for solving the problems described above is a method for driving the image display apparatus assembly according to the present invention.

In addition, in accordance with the method for driving the image display apparatus according to the first form of the present invention and the method for driving the image display apparatus assembly, in an HSV color space enlarged by adding the fourth color, a maximum lightness value $V_{max}$(S) expressed as a function of variable saturation S is stored in the signal processing section. The signal processing section carries out the following steps of:

(a): finding the saturation S and the lightness value V(S) for each of a plurality of pixels on the basis of the signal values of sub-pixel input signals in the pixels;

(b): finding an extension coefficient $\alpha_0$ on the basis of at least one of ratios $V_{max}$(S)/V(S) found in the pixels;

(c): finding the output signal value $X_{4-(p,q)}$ in the (p, q)th pixel on the basis of at least the input signal values $x_{1-(p,q)}$, $x_{2-(p,q)}$ and $x_{3-(p,q)}$; and (d): finding the output signal value $X_{1-(p,q)}$ in the (p, q)th pixel on the basis of the input signal value $x_{1-(p,q)}$, the extension coefficient $\alpha_0$ and the output signal value $X_{4-(p,q)}$, finding the output signal value $X_{2-(p,q)}$ in the (p, q)th pixel on the basis of the input signal value $x_{2-(p,q)}$, the extension coefficient $\alpha_0$ and the output signal value $X_{4-(p,q)}$ and finding the output signal value $X_{3-(p,q)}$ in the (p, q)th pixel on the basis of the input signal value $x_{3-(p,q)}$, the extension coefficient $\alpha_0$ and the output signal value $X_{4-(p,q)}$.

In addition, in the case of the method for driving the image display apparatus assembly, after the step (d), a step (e) is executed to reduce the luminance of light generated by the planar light-source apparatus on the basis of the extension coefficient $\alpha_0$.

On top of that, an image display apparatus driving method provided by the present invention in accordance with the second form of the present invention for solving the problems described above is a method for driving the image display apparatus according to the second form of the present invention.

In addition, in accordance with the method for driving the image display apparatus according to the second form of the present invention, in an HSV color space enlarged by adding the fourth color, a maximum lightness value $V_{max}$(S) expressed as a function of variable saturation S is stored in the signal processing section. The signal processing section carries out the following steps of:

(a): finding the saturation S and the lightness value V(S) for each of a plurality of sets each having first, second and third sub-pixels on the basis of the signal values of sub-pixel input signals in the sets each having first, second and third sub-pixels;

(b): finding an extension coefficient $\alpha_0$ on the basis of at least one of ratios $V_{max}$(S)/V(S) found in the sets each having first, second and third sub-pixels;

(c): finding the output signal value $X_{4-(p,q)}$ in the (p, q)th fourth sub-pixel on the basis of at least the input signal values $x_{1-(p,q)}$, $x_{2-(p,q)}$ and $x_{3-(p,q)}$; and (d): finding the output signal value $X_{1-(p,q)}$ in the (p, q)th first sub-pixel on the basis of the input signal value $x_{1-(p,q)}$, the extension coefficient $\alpha_0$ and the output signal value $X_{4-(p,q)}$, finding the output signal value $X_{2-(p,q)}$ in the (p, q)th second sub-pixel on the basis of the input signal value $x_{2-(p,q)}$, the extension coefficient $\alpha_0$ and the output signal value $X_{4-(p,q)}$ and finding the output signal value $X_{3-(p,q)}$ in the (p, q)th third sub-pixel on the basis of the input signal value $x_{3-(p,q)}$, the extension coefficient $\alpha_0$ and the output signal value $X_{4-(p,q)}$.

In addition, an image display apparatus driving method provided by the present invention in accordance with the third form of the present invention for solving the problems described above is a method for driving the image display apparatus according to the third form of the present invention.

On top of that, in accordance with the method for driving the image display apparatus according to the third form of the present invention, in an HSV color space enlarged by adding the fourth color, a maximum lightness value $V_{max}$(S) expressed as a function of variable saturation S is stored in the signal processing section. The signal processing section carries out the following steps of:

(a): finding the saturation S and the lightness value V(S) for each of a plurality of pixels on the basis of the signal values of first, second and third input signals in the pixels;

(b): finding an extension coefficient $\alpha_0$ on the basis of at least one of ratios $V_{max}$(S)/V(S) found in the pixels;

(c): finding the output signal value $X_{4-(p,q)}$ in the (p, q)th pixel on the basis of at least the input signal values $x_{1-(p,q)}$, $x_{2-(p,q)}$ and $x_{3-(p,q)}$; and (d): finding the output signal value $X_{1-(p,q)}$ in the (p, q)th pixel on the basis of the input signal value $x_{1(p,q)}$, the extension coefficient $\alpha_0$ and the output signal value $X_{4-(p,q)}$, finding the output signal value $X_{2-(p,q)}$ in the (p, q)th pixel on the basis of the input signal value $x_{2-(p,q)}$, the extension coefficient $\alpha_0$ and the output signal value $X_{4-(p,q)}$ and finding the output signal value $X_{3-(p,q)}$ in the (p, q)th pixel on the basis of the input signal value $x_{3-(p,q)}$, the extension coefficient $\alpha_0$ and the output signal value $X_{4-(p,q)}$.

In accordance with the image display apparatus according to the first to third forms of the present invention or the methods for driving the image display apparatus and in accordance with the image display apparatus assembly provided by the present invention or the method for driving the image display apparatus assembly, in an HSV color space enlarged by adding the fourth color, a maximum lightness value $V_{max}$(S) expressed as a function of variable saturation S is stored in the signal processing section. The signal processing section carries out the following processes (or the following steps) of:

finding the saturation S and the lightness value V(S) for each of a plurality of pixels (or a plurality of sets each having first, second and third sub-pixels) on the basis of the signal values of sub-pixel input signals in the pixels (or on the basis of the signal values of the first, second and third input signals in the sets each having first, second and third sub-pixels);

finding an extension coefficient $\alpha_0$ on the basis of at least one of ratios $V_{max}(S)/V(S)$; and finding the output signal value $X_{4-(p, q)}$ in the (p, q)th pixel (or in the (p, q)th fourth sub-pixel) on the basis of at least the input signal values $x_{1-(p, q)}$, $x_{2-(p, q)}$ and $x_{3-(p, q)}$; and finding the output signal value $X_{1-(p, q)}$ on the basis of the input signal value $x_{1-(p, q)}$, the extension coefficient $\alpha_0$ and the output signal value $X_{4-(p, q)}$, finding the output signal value $X_{2-(p, q)}$ on the basis of the input signal value $x_{2-(p, q)}$, the extension coefficient $\alpha_0$ and the output signal value $X_{4-(p, q)}$ and finding the output signal value $X_{3-(p, q)}$ on the basis of the input signal value $x_{3-(p, q)}$, the extension coefficient $\alpha_0$ and the output signal value $X_{4-(p, q)}$.

As a result of extending the output signal values $X_{1-(p, q)}$, $X_{2-(p, q)}$, $X_{3-(p, q)}$ and $X_{4-(p, q)}$ on the basis of the extension coefficient $\alpha_0$ as described above, the luminance of the white-color display sub-pixel increases in the same way as the existing technology. Unlike the existing technology, however, there is no case in which the luminance of the red-color display sub-pixel, the luminance of the green-color display sub-pixel or the luminance of the blue-color display sub-pixel does not increase. That is to say, the image display apparatus or the methods for driving the image display apparatus and the image display apparatus assembly or the method for driving the image display apparatus assembly raise not only the luminance of the white-color display sub-pixel but also the luminance of the red-color display sub-pixel, the luminance of the green-color display sub-pixel or the luminance of the blue-color display sub-pixel. Therefore, the image display apparatus or the methods for driving the image display apparatus and the image display apparatus assembly or the method for driving the image display apparatus assembly are capable of avoiding the problem of the generation of the color dullness with a high degree of reliability.

In addition, in accordance with the image display apparatus according to the first to third forms of the present invention or the methods for driving the apparatus, the luminance of the displayed image can be raised. Thus, the image display apparatus is optimum for displaying an image such as a static image, an advertisement image or an image in an idle screen of a cellular phone. In accordance with the image display apparatus assembly or the method for driving the assembly, on the other hand, the luminance of light generated by the planar light-source apparatus can be reduced on the basis of the extension coefficient $\alpha_0$. Thus, the power consumption of the planar light-source apparatus can be decreased as well.

BRIEF DESCRIPTION OF THE DRAWINGS

FIG. 3A is a conceptual diagram showing a general cylindrical HSV color space whereas

FIG. 3C is a conceptual diagram showing a cylindrical HSV color space enlarged by addition of the white color to serve as the fourth color in the first embodiment whereas

FIG. 14A is a diagram showing an equivalent circuit of an image display apparatus according to a fourth embodiment of the present invention whereas

DETAILED DESCRIPTION OF THE PREFERRED EMBODIMENTS

Figure 1:
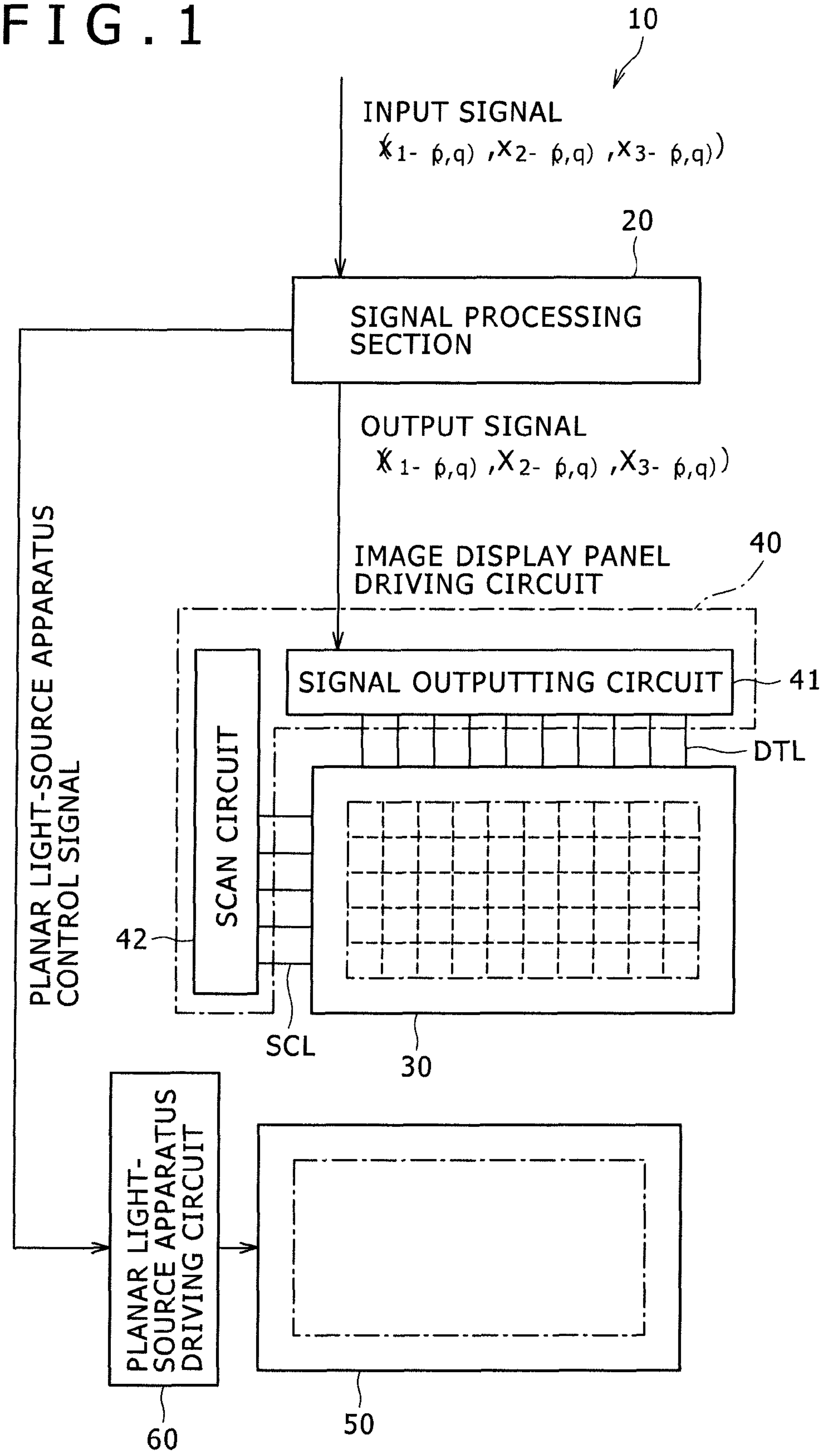
FIG. 1 is a conceptual diagram showing an image display apparatus according to a first embodiment of the present invention.

Preferred embodiments of the present invention are explained below by referring to diagrams. However, implementations of the present invention are by no means limited to the embodiments. That is to say, a variety of numerical values, materials, configurations and structures in the embodiments are typical. It is to be noted that the present invention is explained in chapters arranged as follows:

1: General explanations of image display apparatus according to first to third forms of the present invention and their driving methods as well as an image display apparatus assembly of the present invention and its driving method 2: First Embodiment (The image display apparatus according to the first embodiment of the present invention and its driving method as well as the image display apparatus assembly of the present invention and its driving method)

3: Second Embodiment (Modified version of the first embodiment)

4: Third Embodiment (Another modified version of the first embodiment)

6: Fourth Embodiment (The image display apparatus according to the second form of the present invention and its driving method)

7: Fifth Embodiment (The image display apparatus according to the third form of the present invention and its driving method as well as others) <General explanations of image display apparatus according to first to third forms of the present invention and their driving methods as well as an image display apparatus assembly of the present invention and its driving method>

In image display apparatus according to first to third forms of the present invention and driving methods for driving the image display apparatus according to the first to third forms of the present invention as well as an image display apparatus assembly provided by the present invention in a desirable form and a driving method for driving the image display apparatus assembly provided by the present invention (hereinafter, they are also referred to simply as the present invention which is a generic technical term of the apparatus and the driving methods), a signal processing section is capable to find signal values on the basis of the following equations:

$$X_{1\text{-}(p,q)}=\alpha_0 \cdot x_{1\text{-}(p,q)}-\chi \cdot X_{4\text{-}(p,q)} \tag{1-1}$$

$$X_{2\text{-}(p,q)}=\alpha_0 \cdot x_{2\text{-}(p,q)}-\chi \cdot X_{4\text{-}(p,q)} \tag{1-2}$$

$$X_{3\text{-}(p,q)}=\alpha_0 \cdot x_{3\text{-}(p,q)}-\chi \cdot X_{4\text{-}(p,q)} \tag{1-3}$$

In the above equations, reference notation $\chi$ denotes a constant dependent on the image display apparatus, reference notations $X_{1\text{-}(p,q)}$, $X_{2\text{-}(p,q)}$ and $X_{3\text{-}(p,q)}$ each denote an output signal value in a (p, q)th pixel (or a (p, q)th set of first, second and third sub-pixels) On the other hand, reference notation $x_{1\text{-}(p,q)}$ denotes the signal value of a first sub-pixel input signal, reference notation $x_{2\text{-}(p,q)}$ denotes the signal value of a second sub-pixel input signal and reference notation $x_{3\text{-}(p,q)}$ denotes the signal value of a third sub-pixel input signal.

In this case, the constant $\chi$ cited above is expressed as follows:

$$\chi=BN_4/BN_{1\text{-}3}$$

In the above equation, reference notation $BN_{1\text{-}3}$ denotes the luminance of a set of first, second and third sub-pixels for an assumed case in which a signal having a value corresponding to the maximum signal value of a first sub-pixel output signal is supplied to the first sub-pixel, a signal having a value corresponding to the maximum signal value of a second sub-pixel output signal is supplied to the second sub-pixel and a signal having a value corresponding to the maximum signal value of a third sub-pixel output signal is supplied to the third sub-pixel. On the other hand, reference notation $BN_4$ denotes the luminance of a fourth sub-pixel for an assumed case in which a signal having a value corresponding to the maximum signal value of a fourth sub-pixel output signal is supplied to the fourth sub-pixel.

It is to be noted that the constant $\chi$ has a value peculiar to the image display apparatus and the image display apparatus assembly and is, thus, determined uniquely in accordance with the image display apparatus and the image display apparatus assembly.

In the present invention having a desirable configuration described above, it is possible to find a saturation $S_{(p,q)}$ and a lightness value $V_{(p,q)}$ in an HSV color space in a (p, q)th pixel (or a (p, q)th set of first, second and third sub-pixels) on the basis of the following equations:

$$S_{(p,q)}=(\mathrm{Max}_{(p,q)}-\mathrm{Min}_{(p,q)})/\mathrm{Max}_{(p,q)} \tag{2-1}$$

$$V_{(p,q)}=\mathrm{Max}_{(p,q)} \tag{2-2}$$

It is to be noted that notation H in the technical term 'HSV color space' denotes the hue indicating a color type, notation S in the technical term 'HSV color space' denotes the saturation (or the chroma) meaning the sharpness of the color whereas notation V in the technical term 'HSV color space' denotes the lightness value meaning the brightness or lightness of the color. In the above equations, notation $\mathrm{Max}_{(p,q)}$ denotes the maximum value of the signal values of the three sub-pixel input signals $x_{1\text{-}(p,q)}$, $x_{2\text{-}(p,q)}$ and $x_{3\text{-}(p,q)}$ whereas notation $\mathrm{Min}_{(p,q)}$ denotes the minimum value of the signal values of the three sub-pixel input signals $x_{1\text{-}(p,q)}$, $x_{2\text{-}(p,q)}$ and $x_{3\text{-}(p,q)}$. The saturation S can have a value in the range 0 to 1, the lightness value V can have a value in the range 0 to $(2^n-1)$ and notation n in the expression $(2^n-1)$ is an integer representing the number of display gradation bits.

In addition, in this case, the output signal value $X_{4\text{-}(p,q)}$ can have a form which is determined on the basis of the minimum value $\mathrm{Min}_{(p,q)}$ and the extension coefficient $\alpha_0$.

As an alternative, the output signal value $X_{4\text{-}(p,q)}$ can have a form which is determined on the basis of the minimum value $\mathrm{Min}_{(p,q)}$. As another alternative, the output signal value $X_{4\text{-}(p,q)}$ can be obtained typically on the basis of one of equations given as follows.

$$X_{4\text{-}(p,q)}=C_1[\mathrm{Min}_{(p,q)}]^2\cdot\alpha_0 \text{ or}$$

$$X_{4\text{-}(p,q)}=C_2[\mathrm{Max}_{(p,q)}]^{1/2}\cdot\alpha_0 \text{ or}$$

$$X_{4\text{-}(p,q)}=C_3[\mathrm{Min}_{(p,q)}/\mathrm{Max}_{(p,q)}]\cdot\alpha_0 \text{ or}$$

$$X_{4\text{-}(p,q)}=(2^n-1)\cdot\alpha_0 \text{ or}$$

$$X_{4\text{-}(p,q)}=C_4(\{(2^n-1)\times[\mathrm{Min}_{(p,q)}]/[\mathrm{Max}_{(p,q)}-\mathrm{Min}_{(p,q)}]\}\cdot\alpha_0 \text{ or}$$

$$X_{4\text{-}(p,q)}=(2^n-1)\cdot\alpha_0 \text{ or}$$

$$X_{4\text{-}(p,\,q)}=\alpha_0\cdot(\text{the smaller of } X_{4\text{-}(p,\,q)}=C_5[\text{Max}_{(p,\,q)}]^{1/2} \text{ and } \text{Min}_{(p,\,q)})$$

In the equations given above, each of notations $C_1$, $C_2$, $C_3$, $C_4$ and $C_5$ denotes a constant. It is to be noted that the value of $X_{4\text{-}(p,\,q)}$ is properly selected in a process of prototyping the image display apparatus or the image display apparatus assembly. For example, an image observer evaluates the image and determines an F appropriate value of $X_{4\text{-}(p,\,q)}$ accordingly.

In addition, in the embodiments of the present invention including the desirable configuration and the desirable form which have been described above, the extension coefficient $\alpha_0$ is found on the basis of at least one value of $V_{max}(S)/V(S)$ [$\equiv\alpha(S)$] in a plurality of pixels (or a plurality of sets each having first, second and third sub-pixels). However, it is also possible to provide a configuration in which the extension coefficient $\alpha_0$ can also be found on the basis of one value such as the smallest value ($\alpha_{min}$). As an alternative, in accordance with the image to be displayed, typically, a value within the range of $(1\pm0.4)\cdot\alpha_{min}$ is taken as the extension coefficient $\alpha_0$.

In addition, the extension coefficient $\alpha_0$ is found on the basis of at least one value of $V_{max}(S)/V(S)$ [$\equiv\alpha(S)$] in a plurality of pixels (or a plurality of sets each having first, second and third sub-pixels). However, it is also possible to provide a configuration in which the extension coefficient $\alpha_0$ can also be found on the basis of one value such as the smallest value ($\alpha_{min}$). As another alternative, a plurality of relatively small values of $\alpha(S)$ are sequentially found, starting with the smallest value $\alpha_{min}$, and an average ($\alpha_{ave}$) of the relatively small values of $\alpha(S)$ starting with the smallest value $\alpha_{min}$ is taken as the extension coefficient $\alpha_0$. As a further alternative, a value within the range of $(1\pm0.4)\cdot\alpha_{ave}$ is taken as the extension coefficient $\alpha_0$. As a still further alternative, if the number of pixels (or the number of sets each having first, second and third sub-pixels) used in the operation to sequentially find the relatively small values of $\alpha(S)$, starting with the smallest value $\alpha_{min}$ is equal to or smaller than a value determined in advance, the number of pixels (or the number of sets each having first, second and third sub-pixels) used in the operation to sequentially find the relatively small values of $\alpha(S)$, starting with the smallest value $\alpha_{min}$ is changed and, then, relatively small values of $\alpha(S)$ are sequentially found again, starting with the smallest value $\alpha_{min}$.

In addition, it is possible to provide the embodiments of the present invention including the desirable configuration and the desirable form which have been described above with a configuration making use of the white color as the fourth color. However, the fourth color is by no means limited to the white color. That is to say, the fourth color can be a color other than the white color. For example, the fourth color can also the yellow, cyan or magenta color. If a color other than the white color is used as the fourth color and a color liquid-crystal display apparatus is constructed on the basis of the image display apparatus, it is possible to provide a configuration which further includes a first color filter placed between the first sub-pixel and the image observer to serve as a filter for passing light of the first elementary color, a second color filter placed between the second sub-pixel and the image observer to serve as a filter for passing light of the second elementary color and a third color filter placed between the third sub-pixel and the image observer to serve as a filter for passing light of the third elementary color.

In addition, it is possible to provide the embodiments of the present invention including the desirable configuration and the desirable form which have been described above with a configuration taking all P×Q pixels (or all P>Q sets each having first, second and third sub-pixels) as a plurality of pixels (or a plurality of sets each having first, second and third sub-pixels) for each of which the saturation S and the lightness value V are to be found. As an alternative, it is also possible to provide the embodiments of the present invention including the desirable configuration and the desirable form which have been described above with a configuration taking $(P/P_0\times Q/Q_0)$ pixels (or $(P/P_0\times Q/Q_0)$ sets each having first, second and third sub-pixels) as a plurality of pixels (or a plurality of sets each having first, second and third sub-pixels) for each of which the saturation S and the lightness value V are to be found. In this case, notations $P_0$ and $Q_0$ represent values which satisfy the equations $P\geqq P_0$ and $Q\geqq Q_0$. In addition, at least one of the ratios $P/P_0$ and $Q/Q_0$ are integers each equal to or greater than 2. It is to be noted that concrete examples of the ratios $P/P_0$ and $Q/Q_0$ are 2, 4, 8, 16 and so on which are each an nth power of 2 where notation n is a positive integer. By adopting the former configuration, there are no image quality changes and the image quality can thus be sustained well to a maximum extent. If the latter configuration is adopted, on the other hand, the circuit of the signal processing section can be simplified.

It is to be noted that, in such a case, with the ratio $P/P_0$ set at 4 (that is, $P/P_0=4$) and the ratio $Q/Q_0$ set at 4 (that is, $Q/Q_0=4$) for example, a saturation S and a lightness value V are found for every four pixels (or every four sets each having first, second and third sub-pixels). In addition, for the remaining three of the four pixels (or the four sets each having first, second and third sub-pixels), the value of $V_{max}(S)/V(S)$ [$\equiv\alpha(S)$] may be smaller than the extension coefficient $\alpha_0$ in some cases. That is to say, the value of the extended output signal may exceed $V_{max}(S)$ in some cases. In such cases, the upper limit of the extended output signal may be set at a value matching $V_{max}(S)$.

In addition, it is possible to provide the embodiments of the present invention including the desirable configuration and the desirable form which have been described above with a configuration in which the extension coefficient $\alpha_0$ is determined for every image display frame.

A light emitting device can be used as each light source composing the planar light-source apparatus. To put it more concretely, an LED (Light Emitting Diode) can be used as the light source. This is because the light emitting diode serving as a light emitting device occupies only a small space so that a plurality of light emitting devices can be arranged with ease. A typical example of the light emitting diode serving as a light emitting device is a white-light emitting diode. The white-light emitting diode is a light emitting diode which emits light of the white color. The white-light emitting diode is obtained by combining an ultraviolet-light emitting diode or a blue-light emitting diode with a light emitting particle.

Typical examples of the light emitting particle are a red-light emitting fluorescent particle, a green-light emitting fluorescent particle and a blue-light emitting fluorescent particle. Materials for making the red-light emitting fluorescent particle are $Y_2O_3$: Eu, $YVO_4$: Eu, Y(P, V)$O_4$: Eu, 3.5MgO. 0.5Mg$F_2$. $Ge_2$: Mn, $CaSiO_3$: Pb, Mn, $Mg_6AsO_{11}$: Mn, $(Sr, Mg)_3(PO_4)_3$: Sn, $La_2O_2S$: Eu, $Y_2O_2S$: Eu, (ME: Eu)S, $(M: Sm)_x(Si, Al)_{12}(O, N)_{16}$, $ME_2Si_5N_8$: Eu, (Ca: Eu)$SiN_2$ and (Ca: Eu) $AlSiN_3$. Symbol ME in (ME: Eu)S means an atom of at least one type selected from groups of Ca, Sr and Ba. Symbol ME in the material names following (ME: Eu)S means the same as that in (ME: Eu)S. On the other hand, symbol M in $(M: Sm)_x(Si, Al)_{12}(O, N)_{16}$ means an atom of at least one type selected from groups of Li, Mg and Ca. Symbol M in the material names following $(M: Sm)_x(Si, Al)_{12}(O, N)_{16}$ means the same as that in $(M: Sm)_x(Si, Al)_{12}(O, N)_{16}$.

In addition, materials for making the green-light emitting fluorescent particle are $LaPO_4$: Ce, Tb, $BaMgAl_{10}O_{17}$: Eu, Mn, $Zn_2SiO_4$: Mn, $MgA_{11}O_{19}$: Ce, Tb, $Y_2SiO_5$: Ce, Tb, $MgA_{11}O_{19}$: CE, Tb and Mn. Materials for making the green-light emitting fluorescent particle also include (ME: Eu)$Ga_2S_4$, (M: RE)$_x$(Si, Al)$_{12}$(O, N)$_{16}$, (M: Tb)$_x$(Si, Al)$_{12}$(O, N)$_{16}$ and (M: Yb)$_x$(Si, Al)$_{12}$(O, N)$_{16}$. Symbol RE in (M: RE)$_x$(Si, Al)$_{12}$(O, N)$_{16}$ means Tb and Yb.

In addition, materials for making the blue-light emitting fluorescent particle are $BaMgAl_{10}O_{17}$: Eu, $BaMg_2Al_{16}O_{27}$: Eu, $Sr_2P_2O_7$: Eu, $Sr_5(PO_4)_3Cl$: Eu, (Sr, Ca, Ba, Mg)$_5$($PO_4$)$_3$Cl: Eu, $CaWO_4$, and $CaWO_4$: Pb.

However, the light emitting particle is by no means limited to the fluorescent particle. For example, the light emitting particle can be a light emitting particle having a quantum well structure such as a two-dimensional quantum well structure, a 1-dimensional quantum well structure (or a quantum fine line) or a 0-dimensional quantum well structure (or a quantum dot). The light emitting particle having a quantum well structure typically makes use of a quantum effect by localizing a wave function of carriers in order to convert the carriers into light with a high degree of efficiency in a silicon-based material of an indirect transition type in the same way as a direct transition type.

In addition, in accordance with a generally known technology, a rare earth atom added to a semiconductor material sharply emits light by virtue of an intra-cell transition phenomenon. That is to say, the light emitting particle can be a light emitting particle applying this technology.

As an alternative, the light source of the planar light-source apparatus can be configured as a combination of a red-light emitting device for emitting light of the red color, a green-light emitting device for emitting light of the green color and a blue-light emitting element for emitting light of the blue color. A typical example of the light of the red color is light having a main light emission waveform of 640 nm, a typical example of the light of the green color is light having a main light emission waveform of 530 nm and a typical example of the light of the blue color is light having a main light emission waveform of 450 nm. A typical example of the red-light emitting device is a light emitting diode, a typical example of the green-light emitting device is a light emitting diode of the GaN base and a typical example of the blue-light emitting device is a light emitting diode of the GaN base. In addition, the light source may also include light emitting devices for emitting light of the fourth color, the fifth color and so on which are other than the red, green and blue colors.

The LED (light emitting diode) may have the so-called phase-up structure or a flip-chip structure. That is to say, the light emitting diode is configured to have a substrate and a light emitting layer created on the substrate. The substrate and the light emitting layer form a structure in which light is radiated from the light emitting layer to the external world by way of the substrate. To put it more concretely, the light emitting diode has a laminated structure typically including a substrate, a first chemical compound semiconductor layer created on the substrate to serve as a layer of a first conduction type such as the n-conduction type, an active layer created on the first chemical compound semiconductor layer and a second chemical compound semiconductor layer created on the active layer to serve as a layer of a second conduction type such as the p-conduction type. In addition, the light emitting diode has a first electrode electrically connected to the first chemical compound semiconductor layer and a second electrode electrically connected to the second chemical compound semiconductor layer. Each of the layers composing the light emitting device can be made from a generally known chemical compound semiconductor material which is selected on the basis of the wavelength of light to be emitted by the light emitting diode.

The planar light-source apparatus also referred to as a backlight can have one of two types. That is to say, the planar light-source apparatus can be a planar light-source apparatus of a right-below type disclosed in documents such as Japanese Utility Model Laid-open No. Sho 63-187120 and Japanese Patent Laid-open No. 2002-277870 or a planar light-source apparatus of an edge-light type (or a side-light type) disclosed in documents such as Japanese Patent Laid-open No. 2002-131552.

In the case of the planar light-source apparatus of the right-below type, the light emitting devices each described previously to serve as a light source can be laid out to form an array in a case. However, the arrangement of the light emitting devices is by no means limited to such a configuration. In the case of a configuration in which a plurality of red-color light emitting devices, a plurality of green-color light emitting devices and a plurality of blue-color light emitting devices are laid out to form an array inside a case, the array of these light emitting devices is composed of a plurality of sets each having a red-color light emitting device, a green-color light emitting device and a blue-color light emitting device. The set is a group of light emitting devices employed in an image display panel. To put it more concretely, the groups each having light emitting devices compose an image display apparatus. A plurality of light emitting device groups are laid out in the horizontal direction of the display screen of the image display panel to form an array of groups each having light emitting devices. A plurality of such arrays of groups each having light emitting devices are laid out in the vertical direction of the display screen of the image display panel to form a matrix. As is obvious from the above description, a light emitting device group is composed of one red-color light emitting device, one green-color light emitting device and one blue-color light emitting device. As an alternative, however, a light emitting device group may be composed of one red-color light emitting device, two green-color light emitting devices and one blue-color light emitting device. As another alternative, a light emitting device group may be composed of two red-color light emitting devices, two green-color light emitting devices and one blue-color light emitting device. That is to say, a light emitting device group is one of a plurality of combinations each composed of red-color light emitting devices, green-color light emitting devices and blue-color light emitting devices.

It is to be noted that the light emitting device can be provided with a light fetching lens like one described on page 128 of Nikkei Electronics, No. 889, Dec. 20, 2004.

If the planar light-source apparatus of the right-below type is configured to include a plurality of planar light-source units, each of the planar light-source units can be implemented as one aforementioned group of light emitting devices or at least two such groups each having light emitting devices. As an alternative, each planar light-source unit can be implemented as one white-color light emitting diode or at least two white-color light emitting diodes.

If the planar light-source apparatus of the right-below type is configured to include a plurality of planar light-source units, a separation wall can be provided between every two adjacent planar light-source units. The separation wall can be made from a nontransparent material which does not pass on light radiated by a light emitting device of the planar light-source apparatus. Concrete examples of such a material are the acryl-based resin, the polycarbonate resin and the ABS resin. As an alternative, the separation wall can also be made from a material which passes on light radiated by a light emitting device of the planar light-source apparatus. Concrete examples of such a material are the polymethacrylic methyl acid resin (PMMA), the polycarbonate resin (PC), the polyarylate resin (PAR), the polyethylene terephthalate resin (PET) and glass.

A light diffusion/reflection function or a mirror-surface reflection function can be provided on the surface of the partition wall. In order to provide the light diffusion/reflection function on the surface of the partition wall, unevenness is created on the surface of the partition wall by adoption of a sand blast technique or by pasting a film having unevenness on the surface thereof to the surface of the separation wall to serve as a light diffusion film. In addition, in order to provide the mirror-surface reflection function on the surface of the partition wall, typically, a light reflection film is pasted to the surface of the partition wall or a light reflection layer is created on the surface of the partition wall by carrying out a coating process for example.

The planar light-source apparatus of the right-below type can be configured to have a light diffusion plate, an optical function sheet group and a light reflection sheet. The optical function sheet group typically includes a light diffusion sheet, a prism sheet and a light polarization conversion sheet. A commonly known material can be used for making each of the light diffusion plate, the light diffusion sheet, the prism sheet, the light polarization conversion sheet and the light reflection sheet. The optical function sheet group may include a light diffusion sheet, a prism sheet and a light polarization conversion sheet which are separated from each other by a gap or stacked on each other to form a laminated structure. For example, the light diffusion sheet, the prism sheet and the light polarization conversion sheet can be stacked on each other to form a laminated structure. The light diffusion plate and the optical function sheet group are provided between the planar light-source apparatus and the image display panel.

In the case of the planar light-source apparatus of the edge-light type, on the other hand, a light guiding plate is provided to face the image display panel which is typically a liquid-crystal display apparatus. On a side face of the light guiding plate, light emitting devices are provided. In the following description, the side face of the light guiding plate is referred to as a first side face. The light guiding plate has a bottom face serving as a first face, a top face serving as a second face, the first side face cited above, a second side face, a third side face facing the first side face and a fourth side face facing the second side face. A typical example of a more concrete whole shape of the light guiding plate is a top-cut square conic shape resembling a wedge. In this case, the two mutually facing side faces of the top-cut square conic shape correspond to the first and second faces respectively whereas the bottom face of the top-cut square conic shape corresponds to the first side face. In addition, it is desirable to provide the surface of the bottom face serving as the first face with protrusions and/or dents. Incident light is received from the first side face of the light guiding plate and radiated to the image display panel from the top face which serves as the second face. The second face of the light guiding plate can be made smooth like a mirror surface or provided with blast texture having a light diffusion effect so as to create a surface with infinitesimal unevenness portions.

It is desirable to provide the bottom face (or the first face) of the light guiding plate with protrusions and/or dents. That is to say, it is desirable to provide the first face of the light guiding plate with protrusions, dents or unevenness portions having protrusions and dents. If the first face of the light guiding plate is provided with unevenness portions having protrusions and dents, a protrusion and a dent can be placed at contiguous locations or noncontiguous locations. It is possible to provide a configuration in which the protrusions and/or the dents provided on the first face of the light guiding plate are aligned in a stretching direction which forms an angle determined in advance in conjunction with the direction of light incident to the light guiding plate. In such a configuration, the cross-sectional shape of contiguous protrusions or contiguous dents for a case in which the light guiding plate is cut over a virtual plane vertical to the first face in the direction of light incident to the light guiding plate is typically the shape of a triangle, the shape of any quadrangle such as a square, a rectangle or a trapezoid, the shape of any polygon or a shape enclosed by a smooth curve. Examples of the shape enclosed by a smooth curve are a circle, an eclipse, a paraboloid, a hyperboloid and a catenary. It is to be noted that the predetermined angle formed by the direction of light incident to the light guiding plate in conjunction with the stretching direction of the protrusions and/or the dents provided on the first face of the light guiding plate has a value in the range 60 to 120 degrees. That is to say, if the direction of light incident to the light guiding plate corresponds to the angle of 0 degrees, the stretching direction corresponds to an angle in the range 60 to 120 degrees.

As an alternative, every protrusion and/or every dent which are provided on the first face of the light guiding plate can be configured to serve respectively as every protrusion and/or every dent which are laid out non-contiguously in a stretching direction forming an angle determined in advance in conjunction with the direction of light incident to the light guiding plate. In this configuration, the shape of noncontiguous protrusions and noncontiguous dents can be the shape of a pyramid, the shape of a circular cone, the shape of a cylinder, the shape of a polygonal column such as a triangular column or a rectangular column or any of a variety of cubical shapes enclosed by a smooth curved surface. Typical examples of a cubical shape enclosed by a smooth curved surface are a portion of a sphere, a portion of a spheroid, a portion of a cubic paraboloid and a portion of a cubic hyperboloid. It is to be noted that, in some cases, the light guiding plate may include protrusions and dents. These protrusions and dents are formed on the peripheral edges of the first face of the light guiding plate. In addition, light emitted by a light source to the light guiding plate collides with either of a protrusion and a dent which are created on the first face of the light guiding plate and dispersed. The height, depth, pitch and shape of every protrusion and/or every dent can be fixed or changed in accordance with the distance from the light source. If the height, depth, pitch and shape of every protrusion and/or every dent are changed in accordance with the distance from the light source, for example, the pitch of every protrusion and the pitch of every dent can be made smaller as the distance from the light source increases. The pitch of every protrusion or the pitch of every dent means a pitch extended in the direction of light incident to the light guiding plate.

In a planar light-source apparatus provided with a light guiding plate, it is desirable to provide a light reflection member facing the first face of the light guiding plate. In addition, an image display panel is placed to face the second face of the light guiding plate. To put it more concretely, the liquid-crystal display apparatus is placed to face the second face of the light guiding plate. Light emitted by a light source reaches the light guiding plate from the first side face (which is typically the bottom face of the top-cut square conic shape) of the light guide plate. Then, the light collides with a protrusion or a dent and is dispersed. Subsequently, the light is radiated from the first face and reflected by the light reflection member to again arrive at the first face. Finally, the light is radiated from the second face to the image display panel. For example, a light diffusion sheet or a prism sheet can be placed at a location between the second face of the light guiding plate and the image display panel. In addition, the light emitted by the light source can be led directly or indirectly to the light guiding plate. If the light emitted by the light source is led indirectly to the light guiding plate, an optical fiber is typically used for leading the light to the light guiding plate.

It is desirable to make the light guiding plate from a material that does not much absorb light emitted by the light source. Typical examples of the material for making the light guiding plate are the polymethacrylic methyl acid resin (PMMA), the polycarbonate resin (PC), the acryl-based resin, the amorphous polypropylene-based resin and the styrene-based resin including the AS resin.

In this present invention, the method for driving the planar light-source apparatus and the condition for driving the apparatus are not prescribed in particular. Instead, the light sources can be controlled collectively. That is to say, for example, a plurality of light emitting devices can be driven at the same time. As an alternative, the light emitting devices are driven in units each having a plurality of light emitting devices. This driving method is referred to as a group driving technique. To put it concretely, the planar light-source apparatus is composed of a plurality of planar light-source units whereas the display area of the image display panel is divided into the same plurality of virtual display area units. For example, the planar light-source apparatus is composed of S×T planar light-source units whereas the display area of the image display panel is divided into S×T virtual display area units each associated with one of the S×T planar light-source units. In such a configuration, the light emission state of each of the S×T planar light-source units is driven individually.

A driving circuit for driving the planar light-source apparatus includes a planar light-source apparatus driving circuit which typically has an LED (Light Emitting Device) driving circuit, a processing circuit and a storage device (to serve as a memory). On the other hand, a driving circuit for driving the image display panel includes an image display panel driving circuit which is composed of commonly known circuits. It is to be noted that a temperature control circuit may be employed in the planar light-source apparatus driving circuit. The control of the display luminance and the light-source luminance is executed for each image display frame. The display luminance is the luminance of light radiated from a display area whereas the light-source luminance is the luminance of light emitted by a planar light-source unit. It is to be noted that, as electrical signals, the driving circuits described above receive a frame frequency also referred to as a frame rate and a frame time which is expressed in terms of seconds. The frame frequency is the number of images transmitted per second whereas the frame time is the reciprocal of the frame frequency.

A transmission-type liquid-crystal display apparatus typically includes a front panel, a rear panel and a liquid-crystal material sandwiched by the front and rear panels. The front panel employs first transparent electrodes whereas the rear panel employs second transparent electrodes.

To put it more concretely, the front panel typically has a first substrate, the aforementioned first transparent electrodes each also referred to as a common electrode, and a polarization film. The first substrate is typically a glass substrate or a silicon substrate. The first transparent electrodes which are provided on the inner face of the first substrate are typically each an ITO device. The polarization film is provided on the outer face of the first substrate. In addition, in a transmission-type color liquid-crystal display apparatus, color filters covered by an overcoat layer made of acryl resin or epoxy resin are provided on the inner face of the first substrate. The layout pattern of the color filters can typically be an array resembling a delta array, an array resembling a stripe array, an array resembling a diagonal array or an array resembling a rectangular array. In addition, the front panel has a configuration in which the first transparent electrode is created on the overcoat layer. It is to be noted that an orientation film is created on the first transparent electrode. On the other hand, to put it more concretely, the rear panel typically has a second substrate, switching devices, the aforementioned second transparent electrodes each also referred to as a pixel electrode, and a polarization film. The second substrate is typically a glass substrate or a silicon substrate. The switching devices are provided on the inner face of the second substrate. The second transparent electrodes which are each controlled by one of the switching devices to a conductive or a non-conductive state are typically each an ITO device. The polarization film is provided on the outer face of the second substrate. On the entire face including the second transparent electrodes, an orientation film is created. A variety of members or liquid-crystal materials composing or making the liquid-crystal display apparatus including the transmission-type color liquid-crystal display apparatus can be selected from commonly known members or materials. Typical examples of the switching device are a three-terminal device and a two-terminal device. Typical examples of the three-terminal device include a MOS-type FET (Field Effect Transistor) and a TFT (Thin Film Transistor) which are transistors created on a single-crystal silicon semiconductor substrate. On the other hand, typical examples of the two-terminal device are a MIM (Metal-Insulator-Metal) device, a varistor device and a diode.

Let notation (P, Q) denotes a pixel count P×Q representing the number of pixels laid out to form a two-dimensional matrix on the image display panel 30. Actual numerical values of the pixel count (P, Q) are VGA (640, 480), S-VGA (800, 600), XGA (1,024, 768), APRC (1,152, 900), S-XGA (1,280, 1,024), U-XGA (1,600, 1,200), HD-TV (1,920, 1,080), Q-XGA (2,048, 1,536), (1,920, 1,035), (720, 480) and (1,280, 960) which each represent an image display resolution. However, numerical values of the pixel count (P, Q) are by no means limited to these typical examples. Typical relations between the values of the pixel count (P, Q) and the values (S, T) are shown in Table 1 given below even though relations between the values of the pixel count (P, Q) and the values (S, T) are by no means limited to those shown in the table. Typically, the number of pixels composing one display area unit is in the range 20×20 to 32×240. It is desirable to set the number of pixels composing one display area unit in the range 50×50 to 200×200. The number of pixels composing one display area unit can be fixed or changed from unit to unit.

TABLE 1

| | S value | T value |
|---|---|---|
| VGA (640, 480) | 2 to 32 | 2 to 24 |
| S-VGA (800, 600) | 3 to 40 | 2 to 30 |
| XGA (1024, 768) | 4 to 50 | 3 to 39 |
| APRC (1152, 900) | 4 to 58 | 3 to 45 |
| S-XGA (1280, 1024) | 4 to 64 | 4 to 51 |
| U-XGA (1600, 1200) | 6 to 80 | 4 to 60 |
| HD-TV (1920, 1080) | 6 to 86 | 4 to 54 |
| Q-XGA (2048, 1536) | 7 to 102 | 5 to 77 |
| (1920, 1035) | 7 to 64 | 4 to 52 |
| (720, 480) | 3 to 34 | 2 to 24 |
| (1280, 960) | 4 to 64 | 3 to 48 |

The layout pattern of sub-pixels can typically be an array resembling a delta array (or a triangular array), an array resembling a stripe array, an array resembling a diagonal array (or a mosaic array) or an array resembling a rectangular array. In general, the array resembling a stripe array is proper for displaying data or a string of characters in a personal computer or the like. On the other hand, the array resembling a diagonal array (or a mosaic array) is proper for displaying a natural image on apparatus such as a video camera recorder and a digital still camera.

With regard to the image display apparatus according to the second form of the present invention and the method for driving the image display apparatus, the image display apparatus can typically be a color image display apparatus of either a direct-view type or a projection type. As an alternative, the image display apparatus can be a direct-view type or a projection type color image display apparatus adopting the field sequential system. It is to be noted that the number of light emitting devices composing the image display apparatus is determined on the basis of specifications required of the apparatus. In addition, on the basis of the specifications required of the image display apparatus, the apparatus can be configured to further include light bulbs.

The image display apparatus is by no means limited to a color liquid-crystal display apparatus. Other typical examples of the image display apparatus are an organic electro luminescence display apparatus (or an organic EL display apparatus), an inorganic electro luminescence display apparatus (or an inorganic EL display apparatus), a cold cathode field electron emission display apparatus (FED), a surface transmission type electron emission display apparatus (SED), a plasma display apparatus (PDP), a diffraction lattice-light conversion apparatus employing diffraction lattice-light conversion devices (GLV), a digital micro-mirror device (DMD) and a CRT. In addition, the color image display apparatus is also by no means limited to a transmission-type liquid-crystal display apparatus. For example, the color image display apparatus can also be a reflection-type liquid-crystal display apparatus or a semi-transmission-type liquid-crystal display apparatus.

First Embodiment

A first embodiment implements an image display apparatus 10 according to a first form of the present invention, a method for driving the image display apparatus 10, an image display apparatus assembly employing the image display apparatus 10 and a method for driving the image display apparatus assembly.

Figure 2A:
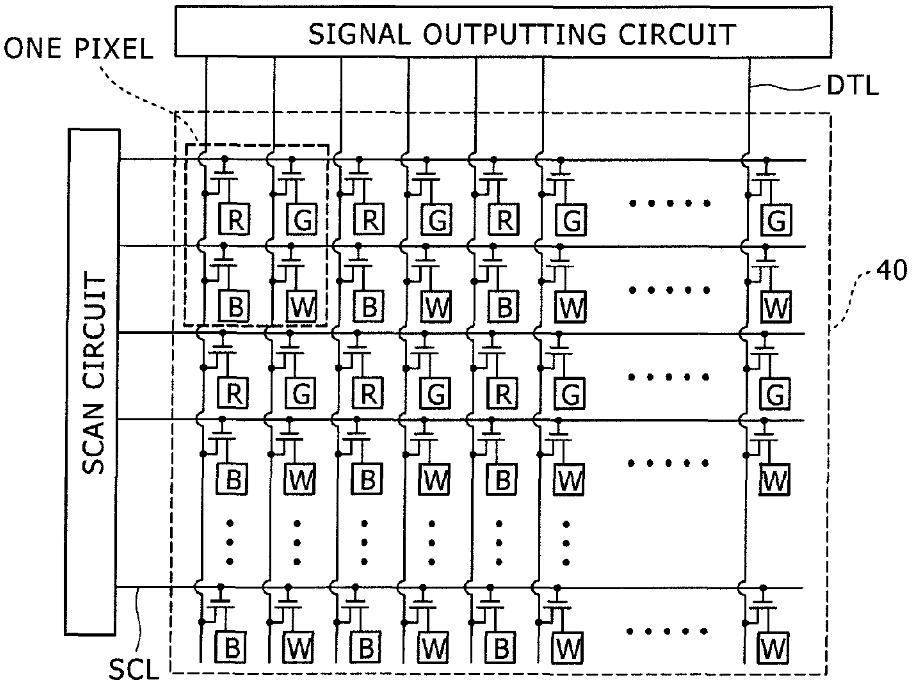
FIGS. 2A and 2B are each a conceptual diagram showing an image display panel and image display panel driving circuits in the image display apparatus according to the first embodiment.
Figure 2B:
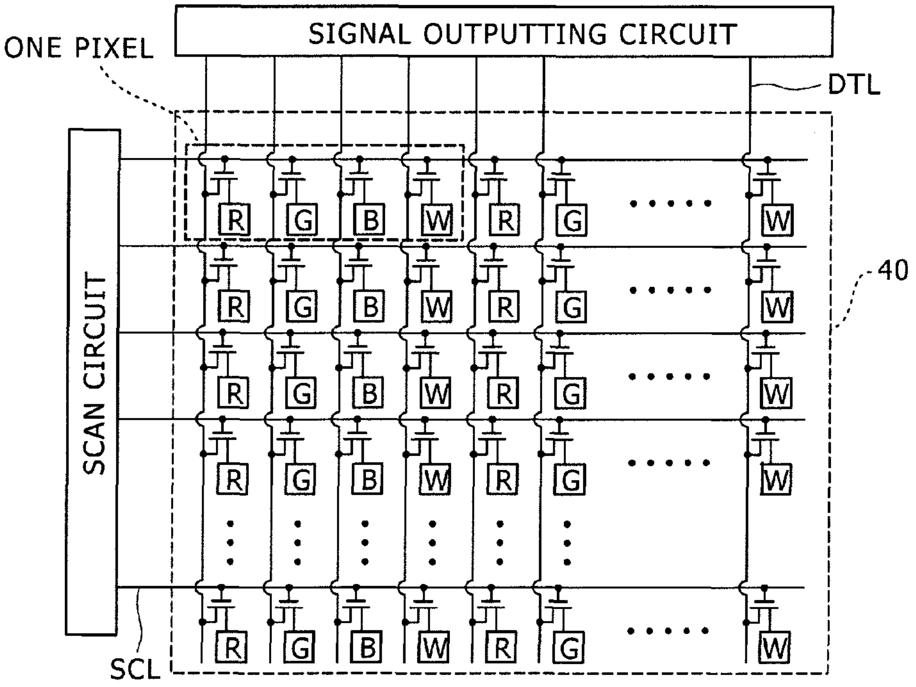

As shown in a conceptual diagram of FIG. 1, the image display apparatus 10 according to the first embodiment employs a image display panel 30 and a signal processing section 20. The image display apparatus assembly according to the first embodiment employs the image display apparatus 10 and a planar light-source apparatus 50 for radiating illuminating light to the rear face of the image display apparatus 10. To put it more concretely, the planar light-source apparatus 50 is a section for radiating illuminating light to the rear face of the image display panel 30 employed in the image display apparatus 10. As shown in conceptual diagrams of FIGS. 2A and 2B, the image display panel 30 employs (P×Q) pixels laid out to form a two-dimensional matrix which has P rows and Q columns. Each of the pixels is a sub-pixel set which includes a first sub-pixel R for displaying a first color such as the red color, a second sub-pixel G for displaying a second color such as the green color, a third sub-pixel B for displaying a third color such as the blue color and a fourth sub-pixel W for displaying a fourth color. In the case of the first embodiment, the fourth color is the white color.

To put it more concretely, the image display apparatus 10 according to the first embodiment is a transmission-type color liquid-crystal display apparatus and, thus, the image display panel 30 is a color liquid-crystal display panel. Each first color filter for passing the first color is located at a position between one of the first sub-pixels and the observer of the displayed image. By the same token, each second color filter for passing the second color is located at a position between one of the second sub-pixels and the observer of the displayed image. In the same way, each third color filter for passing the third color is located at a position between one of the third sub-pixels and the observer of the displayed image. It is to be noted that the fourth sub-pixels are not provided with a color filter. In place of a color filter, the fourth sub-pixels can be provided with a transparent resin layer for preventing a large quantity of unevenness to be generated due to the fourth sub-pixels. In the typical configuration shown in the diagram of FIG. 2A, the first, second, third and fourth sub-pixels R, G, B and W are arrayed in an array which resembles a diagonal array (mosaic array). On the other hand, in the typical configuration shown in the diagram of FIG. 2B, the first, second, third and fourth sub-pixels R, G, B and W are laid out to form an array which resembles a stripe array.

In the first embodiment, the signal processing section 20 supplies output signals to an image display panel driving circuit 40 for driving the image display panel 30 which is actually a color liquid-crystal display panel and supplies control signals to a planar light-source apparatus driving circuit 60 for driving the planar light-source apparatus 50. The image display panel driving circuit 40 employs a signal outputting circuit 41 and a scan circuit 42. It is to be noted that the scan circuit 42 controls switching devices in order to put the switching devices in turned-on and turned-off states. Each of the switching devices is typically a TFT for controlling the operation (that is, the optical transmittance) of a sub-pixel employed in the image display panel 30. On the other hand, the signal outputting circuit 41 holds video signals to be sequentially output to the image display panel 30. The signal outputting circuit 41 is electrically connected to the image display panel 30 by lines DTL whereas the scan circuit 42 is electrically connected to the image display panel 30 by lines SCL.

The signal processing section 20 receives a first sub-pixel input signal provided with a signal value of $x_{1-(p, q)}$, a second sub-pixel input signal provided with a signal value of $x_{2-(p, q)}$ and a third sub-pixel input signal provided with a signal value of $x_{3-(p, q)}$ and outputs a first sub-pixel output signal provided with a signal value of $X_{1-(p, q)}$ and used for determining the display gradation of the first sub-pixel, a second sub-pixel output signal provided with a signal value of $X_{2-(p, q)}$ and used for determining the display gradation of the second sub-pixel, a third sub-pixel output signal provided with a signal value of $X_{3-(p, q)}$ and used for determining the display gradation of the third sub-pixel as well as a fourth sub-pixel output signal provided with a signal value of $X_{4-(p, q)}$ and used for determining the display gradation of the fourth sub-pixel with regard to a (p, q)th pixel where notations p and q are integers satisfying the equations $1 \leqq p \leqq P$ and $1 \leqq q \leqq Q$.

In the first embodiment, a maximum lightness value Vmax (S) expressed as a function of variable saturation S in an HSV color space enlarged by adding the fourth color which is the white color as described above is stored in the signal processing section 20. That is to say, by adding the fourth color which is the white color, the dynamic range of the lightness value V in the HSV color space is widened.

Then, the signal processing section 20 carries out the following processes of:

(B-1): finding the saturation S and the lightness value V(S) for each of a plurality of pixels on the basis of the signal values of sub-pixel input signals in the plurality of pixels;

(B-2): finding an extension coefficient $\alpha_0$ on the basis of at least one of ratios $V_{max}(S)/V(S)$ found in the plurality of pixels;

(B-3): finding the output signal value $X_{4-(p,q)}$ in the (p, q)th pixel on the basis of at least the input signal values $x_{1-(p,q)}$, $x_{2-(p,q)}$ and $x_{3-(p,q)}$; and (B-4): finding the output signal value $X_{1-(p,q)}$ in the (p, q)th pixel on the basis of the input signal value $x_{1-(p,q)}$, the extension coefficient $\alpha_0$ and the output signal value $X_{4-(p,q)}$, finding the output signal value $X_{2-(p,q)}$ in the (p, q)th pixel on the basis of the input signal value $x_{2-(p,q)}$, the extension coefficient $\alpha_0$ and the output signal value $X_{4-(p,q)}$ and finding the output signal value $X_{3-(p,q)}$ in the (p, q)th pixel on the basis of the input signal value $x_{3-(p,q)}$, the extension coefficient $\alpha_0$ and the output signal value $X_{4-(p,q)}$.

In the first embodiment, the output signal value $X_{4-(p,q)}$ can be found on the basis of a product of $\mathrm{Min}_{(p,q)}$ to be described later and the extension coefficient $\alpha_0$. To put it more concretely, the output signal value $X_{4-(p,q)}$ can be typically expressed as by Eq. (3) follows:

$$X_{4-(p,q)}=(\mathrm{Min}_{(p,q)}\cdot\alpha_0)/\chi \quad (3)$$

A quantity denoted by reference notation $\chi$ in Eq. (3) given above is a constant which will be described later. In accordance with Eq. (3), the output signal value $X_{4-(p,q)}$ is found as a ratio of the product of $\mathrm{Min}_{(p,q)}$ and the extension coefficient $\alpha_0$ to $\chi$. However, the output signal value $X_{4-(p,q)}$ is by no means limited to the value of this expression. In addition, the extension coefficient $\alpha_0$ is determined for every image display frame.

These points are described more as follows.

Figure 3A:
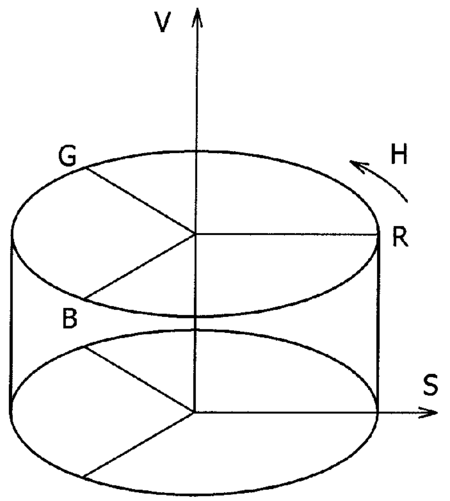
Figure 3B:
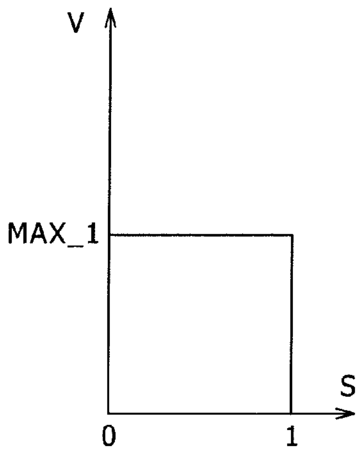
FIG. 3B is diagram showing a model of a relation between the saturation (S) and the lightness value (V)

In general, the saturation $S_{(p,q)}$ and the lightness value $V_{(p,q)}$ in a cylindrical HSV color space can be found on the basis of the input signal value $x_{1-(p,q)}$ of the first sub-pixel input signal, the input signal value $x_{2-(p,q)}$ of the second sub-pixel input signal and the input signal value $x_{3-(p,q)}$ of the third sub-pixel input signal in accordance with Eqs. (2-1) and (2-2) given below. It is to be noted that FIG. 3A is a conceptual diagram showing a general cylindrical HSV color space whereas FIG. 3B is diagram showing a model of a relation between the saturation (S) and the lightness value (V). It is also worth noting that, in the diagrams of FIG. 3B as well as FIGS. 3D, 4A and 4B to be described later, the value of the lightness V $(2^n-1)$ is denoted by reference notation MAX_1 whereas the value of the lightness V $(2^n-1)\times(\chi+1)$ is denoted by reference notation MAX_2.

$$S_{(p,q)}=(\mathrm{Max}_{(p,q)}-\mathrm{Min}_{(p,q)})/\mathrm{Max}_{(p,q)} \quad (2\text{-}1)$$

$$V_{(p,q)}=\mathrm{Max}_{(p,q)} \quad (2\text{-}2)$$

Reference notation $\mathrm{Max}_{(p,q)}$ used in the above equation denotes the maximum of the three values $(x_{1-(p,q)}, x_{2-(p,q)}, x_{3-(p,q)})$ which are the input signal value $x_{1-(p,q)}$ of the first sub-pixel input signal, the input signal value $x_{2-(p,q)}$ of the second sub-pixel input signal and the input signal value $x_{3-(p,q)}$ of the third sub-pixel input signal. On the other hand, reference notation $\mathrm{Min}_{(p,q)}$ used in the above equation denotes the minimum of the three values $(x_{1-(p,q)}, x_{2-(p,q)}, x_{3-(p,q)})$ which are the input signal value $x_{1-(p,q)}$ of the first sub-pixel input signal, the input signal value $x_{2-(p,q)}$ of the second sub-pixel input signal and the input signal value $x_{3-(p,q)}$ of the third sub-pixel input signal. The saturation S can have a value in the range zero to one whereas the lightness value V can have a value in the range zero to $(2^n-1)$. Reference notation n in the expression $(2^n-1)$ denotes a display gradation bit count which represents the number of display gradation bits. In the case of the first embodiment, the display gradation bit count n is eight (that is, n=8). In other words, the number of display gradation bits is eight bits. Thus, the lightness value V representing the value of the display gradation has a value in the range zero to 255.

Figure 3C:
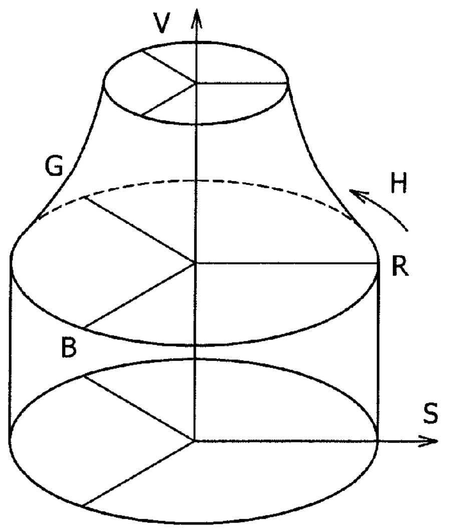
Figure 3D:
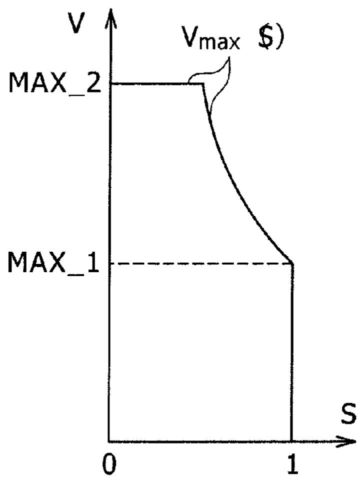
FIG. 3D is diagram showing a model of a relation between the saturation (S) and the lightness value (V)

FIG. 3C is a conceptual diagram showing a cylindrical HSV color space enlarged by addition of the white color to serve as the fourth color in the first embodiment whereas FIG. 3D is diagram showing a model of a relation between the saturation (S) and the lightness value (V). The fourth sub-pixel for displaying the white color is not provided with a color filter.

The aforementioned constant $\chi$ dependent on the image display apparatus is expressed as follows:

$$\chi=BN_4/BN_{1-3}$$

In the above equation, reference notation $BN_{1-3}$ denotes the luminance of a set of first, second and third sub-pixels for a case in which it is assumed that a signal having a value corresponding to the maximum signal value of a first sub-pixel output signal is supplied to the first sub-pixel, a signal having a value corresponding to the maximum signal value of a second sub-pixel output signal is supplied to the second sub-pixel and a signal having a value corresponding to the maximum signal value of a third sub-pixel output signal is supplied to the third sub-pixel. On the other hand, reference notation $BN_4$ denotes the luminance of a fourth sub-pixel for a case in which it is assumed that a signal having a value corresponding to the maximum signal value of a fourth sub-pixel output signal is supplied to the fourth sub-pixel. That is to say, a white color having a maximum luminance is displayed by the set of first, second and third sub-pixels whereas the luminance of the white color is represented by the luminance $BN_{1-3}$.

To put it more concretely, the luminance $BN_4$ of the fourth sub-pixel is typically 1.5 times the luminance $BN_{1-3}$ of the white color. That is to say, in the case of the first embodiment, the constant $\chi$ has a typical value of 1.5. In this case, the luminance $BN_{1-3}$ of the white color is a luminance which is obtained when the input signals $x_{1-(p,q)}=255$, $x_{2-(p,q)}=255$ and $x_{3-(p,q)}=255$ which have the display gradation value are supplied to the set of first, second and third sub-pixels respectively. On the other hand, the luminance $BN_4$ of the fourth sub-pixel is a luminance which is obtained when it is assumed that an input signal having the display gradation value of 255 is supplied to the fourth sub-pixel.

By the way, if the output signal value $X_{4-(p,q)}$ is expressed by Eq. (3) given earlier, the maximum brightness/lightness value $V_{max}(S)$ is given by the following equations:

For $S\leqq S_0$:

$$V_{max}(S)=(\chi+1)\cdot(2^n-1) \quad (4\text{-}1)$$

For $S_0<S\leqq 1$:

$$V_{max}(S)=(2^n-1)\cdot(1/S) \quad (4\text{-}2)$$

Here, $S_0$ is expressed by the following equation:

$$S_0=1/(\chi+1)$$

The maximum lightness value $V_{max}(S)$ is obtained as described above. The maximum lightness value $V_{max}(S)$ expressed as a function of variable saturation S in the enlarged HSV color space is stored in a kind of lookup table in the signal processing section 20.

The following description explains extension processing to find the output signal values $X_{1-(p, q)}$, $X_{2-(p, q)}$ and $X_{3-(p, q)}$ in the (p, q)th pixel. It is to be noted that the processing described below is carried out to sustain the ratios among the luminance of the first elementary color displayed by (the first and the fourth sub-pixels), the second elementary color displayed by (the second and the fourth sub-pixels) and the third elementary color displayed by (the third and the fourth sub-pixels). In addition, the extension processing described below is carried out to sustain (or hold) the color hues. On top of that, the extension processing described below is carried out also to sustain (or hold) gradation-luminance characteristics, that is, gamma and γ characteristics.

In addition, if any of the input signal value $x_{1-(p, q)}$ of the first sub-pixel input signal, the input signal value $x_{2-(p, q)}$ of the second sub-pixel input signal and the input signal value $x_{3-(p, q)}$ of the third sub-pixel input signal in any pixel is zero, the output signal value $X_{4-(p, q)}$ of the fourth sub-pixel is also zero. Thus, in such a case, the processing described below is not carried out. Instead, 1 image display frame is displayed. As an alternative, a pixel in which any of the input signal value $x_{1-(p, q)}$ of the first sub-pixel input signal, the input signal value $x_{2-(p, q)}$ of the second sub-pixel input signal and the input signal value $x_{3-(p, q)}$ of the third sub-pixel input signal is zero is ignored. Then, the processing described below is carried out on pixels in which none of the input signal value $x_{1-(p, q)}$ of the first sub-pixel input signal, the input signal value $x_{2-(p, q)}$ of the second sub-pixel input signal and the input signal value $x_{3-(p, q)}$ of the third sub-pixel input signal is zero.

[Process 100]

First of all, the signal processing section 20 finds the saturation S and the lightness value V(S) for each of a plurality of pixels on the basis of the signal values of sub-pixel input signals in the plurality of pixels. To put it more concretely, the signal processing section 20 finds the saturation S and the lightness value V(S) in a (p, q)th pixel on the basis of the input signal value $x_{1-(p, q)}$ of the first sub-pixel input signal in the (p, q)th pixel, the input signal value $x_{2-(p, q)}$ of the second sub-pixel input signal in the (p, q)th pixel and the input signal value $x_{3-(p, q)}$ of the third sub-pixel input signal in the (p, q)th pixel in accordance with Eqs. (2-1) and (2-2) respectively. Process 100 is carried out on every pixel to result in (P×Q) pairs each having a saturation $S_{(p, q)}$ and a lightness value $V_{(p, q)}$.

[Process 110]

Then, the signal processing section 20 finds an extension coefficient $\alpha_0$ on the basis of at least one of ratios $V_{max}(S)/V(S)$ found in the plurality of pixels.

Figure 4A:
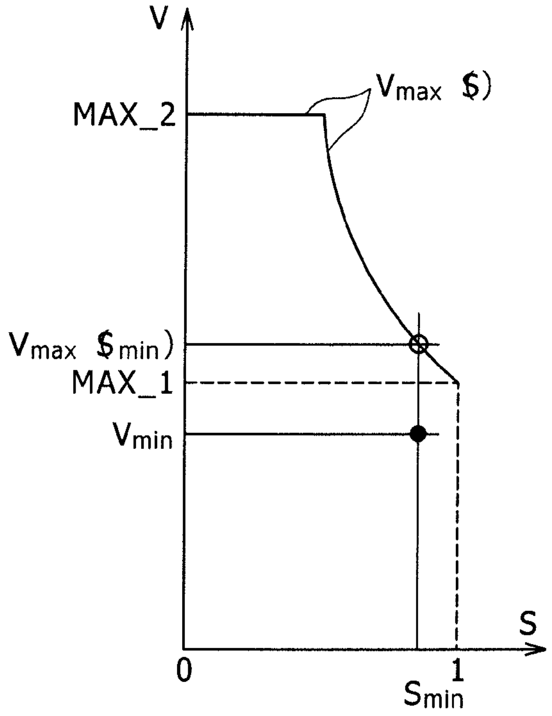
FIGS. 4A and 4B are each a diagram showing a model of a relation between the saturation (S) and the lightness value (V) in a cylindrical HSV color space enlarged by adding a white color to serve as a fourth color in the first embodiment.
Figure 4B:
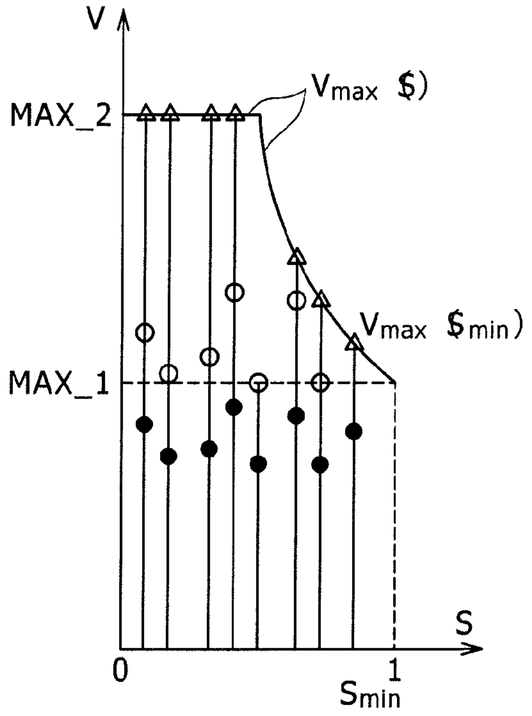

To put it more concretely, in the first embodiment, a value smallest among the ratios $V_{max}(S)/V(S)$ found in the (P×Q) pixels is taken as the extension coefficient $\alpha_0$. The smallest value is referred to as the minimum value denoted by reference notation $\alpha_{min}$. That is to say, the ratio $\alpha_{(p, q)}=V_{max}(S)/V_{(p, q)}(S)$ is found for each of the (P×Q) pixels and the smallest value $\alpha_{min}$ among the values of the ratio $\alpha_{(p, q)}$ is taken as the extension coefficient $\alpha_0$. It is to be noted that FIGS. 4A and 4B are each a diagram showing a model of a relation between the saturation (S) and the lightness value (V) in a cylindrical HSV color space enlarged by adding a white color to serve as a fourth color in the first embodiment. In the diagrams of FIGS. 4A and 4B, reference notation $S_{min}$ denotes the value of the saturation S that gives the smallest extension coefficient $\alpha_{min}$ whereas reference notation $V_{min}$ denotes the value of the lightness value V(S) at the saturation $S_{min}$. Reference notation $V_{max}(S_{min})$ denotes the maximum lightness value $V_{max}(S)$ at the saturation $S_{min}$. In the diagram of FIG. 4B, each of black circles indicates the lightness value V(S) whereas each of white circles indicates the value of $V(S)\times\alpha_0$. Each of triangular marks indicates the maximum lightness value $V_{max}(S)$ at a saturation S.

[Process 120]

Then, the signal processing section 20 finds the output signal value $X_{4-(p, q)}$ in the (p, q)th pixel on the basis of at least the input signal values $x_{1-(p, q)}$, $x_{2-(p, q)}$ and $x_{3-(p, q)}$. To put it concretely, in the first embodiment, the output signal value $X_{4-(p, q)}$ is determined on the basis of $Min_{(p, q)}$, the extension coefficient $\alpha_0$ and the constant X. To put it more concretely, in the first embodiment, the output signal value $X_{4-(p, q)}$ is determined in accordance with the following equation:

$$X_{4-(p, q)}=(Min_{(p, q)}\cdot\alpha_0)/\chi \qquad (3)$$

It is to be noted that the output signal value $X_{4-(p, q)}$ is found for each of the (P×Q) pixels.

[Process 130]

Then, the signal processing section 20 determines the output signal values $X_{1-(p, q)}$, $X_{2-(p, q)}$ and $X_{3-(p, q)}$ on the basis of the ratio of the upper limit value Vmax to the lightness value V in the color space and the input signal values $x_{1-(p, q)}$, $x_{2-(p, q)}$ and $X_{3-(p, q)}$ respectively. That is to say, the signal processing section 20 finds the output signal value $X_{1-(p, q)}$ in the (p, q)th pixel on the basis of the input signal value $x_{1-(p, q)}$, the extension coefficient $\alpha_0$ and the output signal value $X_{4-(p, q)}$, finds the output signal value $X_{2-(p, q)}$ in the (p, q)th pixel on the basis of the input signal value $x_{2-(p, q)}$, the extension coefficient $\alpha_0$ and the output signal value $X_{4-(p, q)}$ and finds the output signal value $X_{3-(p, q)}$ in the (p, q)th pixel on the basis of the input signal value $x_{3-(p, q)}$, the extension coefficient $\alpha_0$ and the output signal value $X_{4-(p, q)}$.

To put it more concretely, the output signal values $X_{1-(p, q)}$, $X_{2-(p, q)}$ and $X_{3-(p, q)}$ in the (p, q)th pixel are found in accordance with respectively Eqs. (1-1), (1-2) and (1-3) given as follows:

$$X_{1-(p, q)}=\alpha_0\cdot x_{1-(p, q)}-\chi\cdot X_{4-(p, q)} \qquad (1-1)$$

$$X_{2-(p, q)}=\alpha_0\cdot x_{2-(p, q)}-\chi\cdot X_{4-(p, q)} \qquad (1-2)$$

$$X_{3-(p, q)}=\alpha_0\cdot x_{3-(p, q)}-\chi\cdot X_{4-(p, q)} \qquad (1-3)$$

Figure 5:
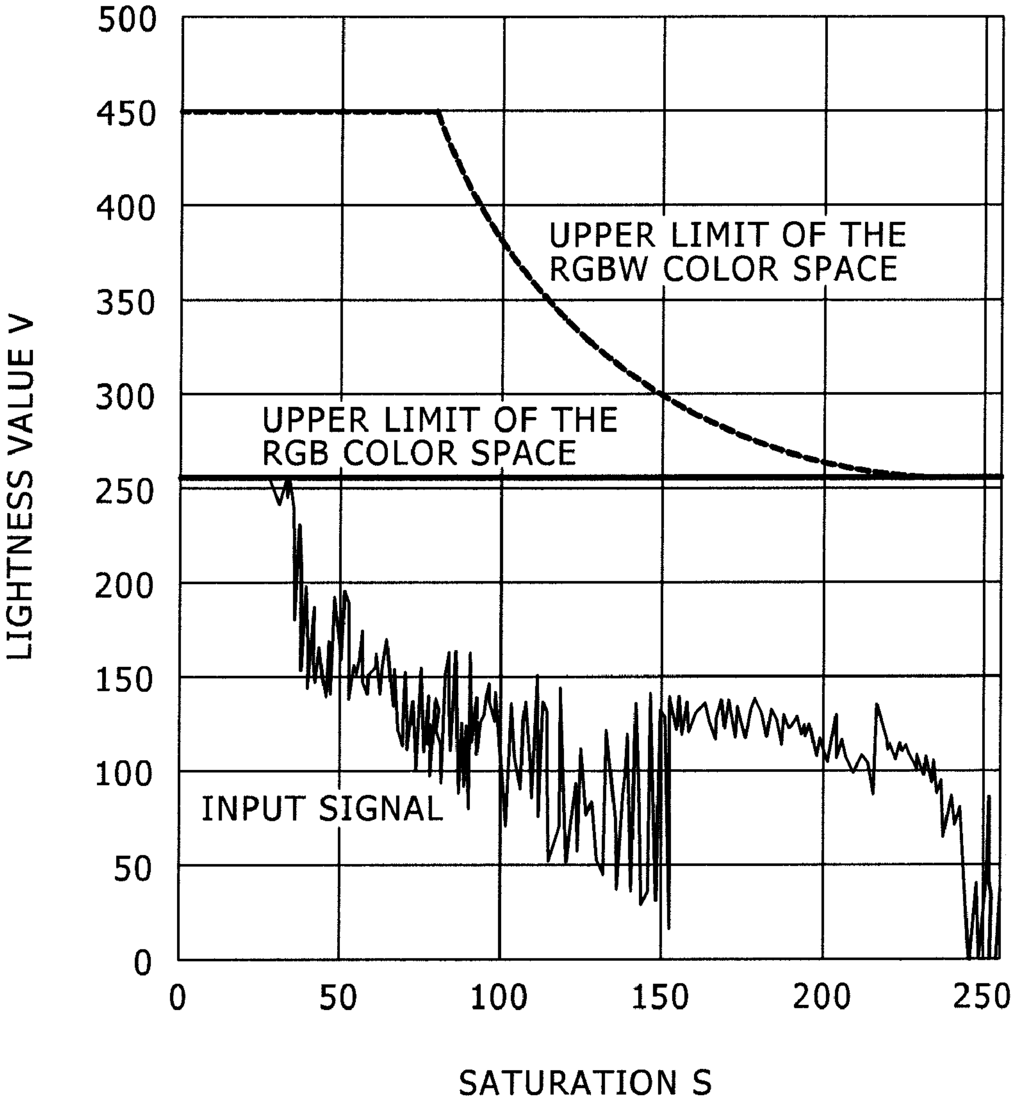
FIG. 5 is a diagram showing an existing HSV color space prior to addition of a white color to serve as a fourth color in the first embodiment, an HSV color space enlarged by adding a white color to serve as a fourth color in the first embodiment and a typical relation between the saturation (S) and lightness value (V) of an input signal.
Figure 6:
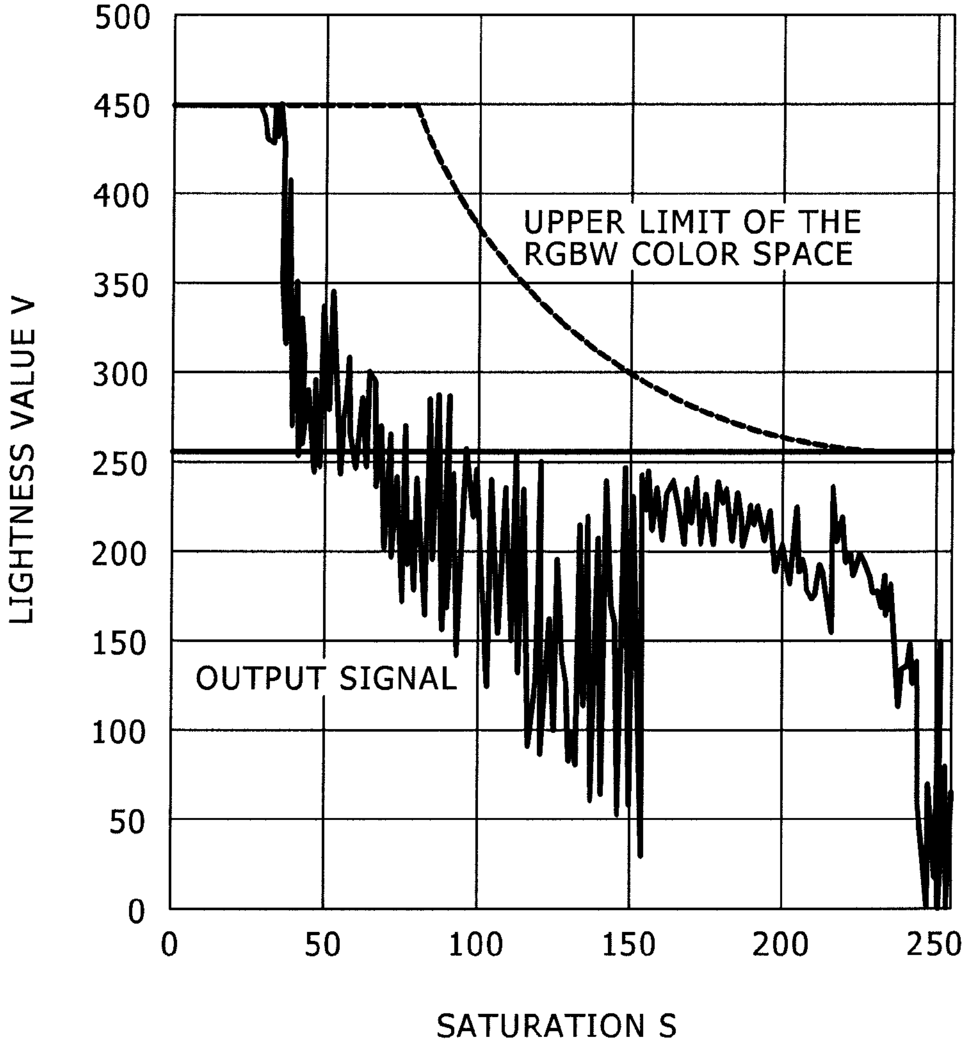
FIG. 6 is a diagram showing an existing HSV color space prior to addition of a white color to serve as a fourth color in the first embodiment, an HSV color space enlarged by adding a white color to serve as a fourth color in the first embodiment and a typical relation between the saturation (S) and lightness value (V) of an output signal completing an extension process.

FIG. 5 is a diagram showing a conventional HSV color space prior to addition of a white color to serve as a fourth color in the first embodiment, an HSV color space enlarged by adding a white color to serve as a fourth color in the first embodiment and a typical relation between the saturation (S) and lightness value (V) of an input signal. FIG. 6 is a diagram showing a conventional HSV color space prior to addition of a white color to serve as a fourth color in the first embodiment, an HSV color space enlarged by adding a white color to serve as a fourth color in the first embodiment and a typical relation between the saturation (S) and lightness value (V) of an output signal completing an extension process. It is to be noted that the saturation (S) represented by the horizontal axis in the diagrams of FIGS. 5 and 6 has a value in the range zero to 255 even though the saturation (S) naturally has a value in the range zero to one. That is to say, the value of the saturation (S) represented by the horizontal axis in the diagrams of FIGS. 5 and 6 is multiplied by 255.

An important point in this case is that the value of Min(p, q) is extended by the extension coefficient $\alpha_0$. By extending the value of $Min_{(p, q)}$ through the use of the extension coefficient $\alpha_0$ in this way, not only is the luminance of the white-color display sub-pixel serving as the fourth sub-pixel increased, but the luminance of each of the red-color display sub-pixel serving as the first sub-pixel, the green-color display sub-pixel serving as the second sub-pixel and the blue-color display sub-pixel serving as the third sub-pixel is also raised as well as indicated by respectively Eqs. (1-1), (1-2) and (1-3) given above. Therefore, it is possible to avoid the problem of the generation of the color dullness with a high degree of reliability. That is to say, in comparison with a case in which the value of $Min_{(p, q)}$ is not extended by the extension coefficient $\alpha_0$, by extending the value of $Min_{(p, q)}$ through the use of the extension coefficient $\alpha_0$, the luminance of the whole image is multiplied by the extension coefficient $\alpha_0$. Thus, an image such as a static image can be displayed at a high luminance. That is to say, the driving method is optimum for such applications.

For $\chi$=1.5 and $(2^n-1)$=255, the output signal values $X_{1-(p, q)}$, $X_{2-(p, q)}$, $X_{3-(p, q)}$ and $X_{4-(p, q)}$ obtained from the input signal values $x_{1-(p, q)}$, $x_{2-(p, q)}$ and $x_{3-(p, q)}$ are related with the input signal values $x_{1-(p, q)}$, $x_{2-(p, q)}$ and $x_{3-(p, q)}$ in accordance with Table 2. The upper table of Table 2 is a table showing inputs while the lower table of Table 2 is a table showing outputs.

In Table 2, the value of $\alpha_{min}$ is 1.467 shown at the intersection of the fifth input row and the right-most column. Thus, if the extension coefficient $\alpha_0$ is set at 1.467 (=$\alpha_{min}$), the output signal value by no means exceeds $(2^8-1)$.

If the value of α(S) on the third input row is used as the extension coefficient $\alpha_0$ (=1.592), however, the output signal value for the input values on the third row by no means exceeds $(2^8-1)$. Nevertheless, the output signal value for the input values on the fifth row exceeds $(2^8-1)$ as indicated by Table 3. Much like Table 2, the upper table of Table 3 is a table showing inputs while the lower table of Table 3 is a table showing outputs. If the value of $\alpha_{min}$ is used as the extension coefficient α0 in this way, the output signal value by no means exceeds $(2^8-1)$.

TABLE 2

| No | $x_1$ | $x_2$ | $x_3$ | Max | Min | S | V | $V_{max}$ | $\alpha = V_{max}/V$ |
|---|---|---|---|---|---|---|---|---|---|
| 1 | 240 | 255 | 160 | 255 | 160 | 0.373 | 255 | 638 | 2.502 |
| 2 | 240 | 160 | 160 | 240 | 160 | 0.333 | 240 | 638 | 2.658 |
| 3 | 240 | 80 | 160 | 240 | 80 | 0.667 | 240 | 382 | 1.592 |
| 4 | 240 | 100 | 200 | 240 | 100 | 0.583 | 240 | 437 | 1.821 |
| 5 | 255 | 81 | 160 | 255 | 81 | 0.682 | 255 | 374 | 1.467 |

| No | $X_4$ | $X_1$ | $X_2$ | $X_3$ |
|---|---|---|---|---|
| 1 | 156 | 118 | 140 | 0 |
| 2 | 156 | 118 | 0 | 0 |
| 3 | 78 | 235 | 0 | 118 |
| 4 | 98 | 205 | 0 | 146 |
| 5 | 79 | 255 | 0 | 116 |

TABLE 3

| No | $x_1$ | $x_2$ | $x_3$ | Max | Min | S | V | $V_{max}$ | $\alpha = V_{max}/V$ |
|---|---|---|---|---|---|---|---|---|---|
| 1 | 240 | 255 | 160 | 255 | 160 | 0.373 | 255 | 638 | 2.502 |
| 2 | 240 | 160 | 160 | 240 | 160 | 0.333 | 240 | 638 | 2.658 |
| 3 | 240 | 80 | 160 | 240 | 80 | 0.667 | 240 | 382 | 1.592 |
| 4 | 240 | 100 | 200 | 240 | 100 | 0.583 | 240 | 437 | 1.821 |
| 5 | 255 | 81 | 160 | 255 | 81 | 0.682 | 255 | 374 | 1.467 |

| No | $X_4$ | $X_1$ | $X_2$ | $X_3$ |
|---|---|---|---|---|
| 1 | 170 | 127 | 151 | 0 |
| 2 | 170 | 127 | 0 | 0 |
| 3 | 85 | 255 | 0 | 127 |
| 4 | 106 | 223 | 0 | 159 |
| 5 | 86 | 277 | 0 | 126 |

In the case of the first input row of Table 2 for example, the input signal values $x_{1-(p, q)}$, $x_{2-(p, q)}$ and $x_{3-(p, q)}$ are 240, 255 and 160 respectively. By making use of the extension coefficient $\alpha_0$ (=1.467), the luminance values of signals to be displayed are found on the basis of the input signal values $x_{1-(p, q)}$, $x_{2-(p, q)}$ and $x_{3-(p, q)}$ as values conforming to the eight-bit display as follows:

The luminance value of the first sub-pixel=
$\alpha_0 \cdot x_{1-(p,q)}$=1.467×240=352

The luminance value of the second sub-pixel=
$\alpha_0 \cdot x_{2-(p,q)}$=1.467×255=374

The luminance value of the third sub-pixel=
$\alpha_0 \cdot x_{3-(p,q)}$=1.467×160=234

On the other hand, the output signal value $X_{4-(p, q)}$ found for the fourth sub-pixel is 156. Thus, the luminance value of the fourth sub-pixel is $\chi \cdot X_{4-(p, q)}$=1.5×156=234.

As a result, the output signal value $X_{1-(p, q)}$ of the first sub-pixel, the output signal value $X_{2-(p, q)}$ of the second sub-pixel and the output signal value $X_{3-(p, q)}$ of the third sub-pixel are found as follows:

$X_{1-(p,q)}$=352−234=118

$X_{2-(p,q)}$=374−234=140

$X_{3-(p,q)}$=234−234=0

Thus, in the case of sub-pixels pertaining to a pixel receiving input signals with values shown on the first input row of Table 2, the output signal value of a sub-pixel with a smallest input signal value is zero. In the case of typical data shown in Table 2, the sub-pixel with a smallest input signal value is the third sub-pixel. Accordingly, the display of the third sub-pixel is replaced by the fourth sub-pixel. In addition, the output signal value $X_{1-(p, q)}$ of the first sub-pixel, the output signal value $X_{2-(p, q)}$ of the second sub-pixel and the output signal value $X_{3-(p, q)}$ of the third sub-pixel are smaller than the naturally desired values.

In the image display apparatus assembly according to the first embodiment and the method for driving the image display apparatus assembly, the output signal values $X_{1-(p, q)}$, $X_{2-(p, q)}$, $X_{3-(p, q)}$ and $X_{4-(p, q)}$ in the (p, q)th pixel are extended by making use of the extension coefficient $\alpha_0$ as a multiplication factor. Therefore, in order to obtain the same image luminance as that of an image with the output signal values $X_{1-(p, q)}$, $X_{2-(p, q)}$, $X_{3-(p, q)}$ and $X_{4-(p, q)}$ in the (p, q)th pixel not extended, it is necessary to reduce the luminance of light generated by the planar light-source apparatus 50 on the basis of the extension coefficient $\alpha_0$. To put it more concretely, the luminance of light generated by the planar light-source apparatus 50 may be multiplied by $(1/\alpha_0)$. Thus, the power consumption of the planar light-source apparatus 50 can be decreased.

Figure 7A:
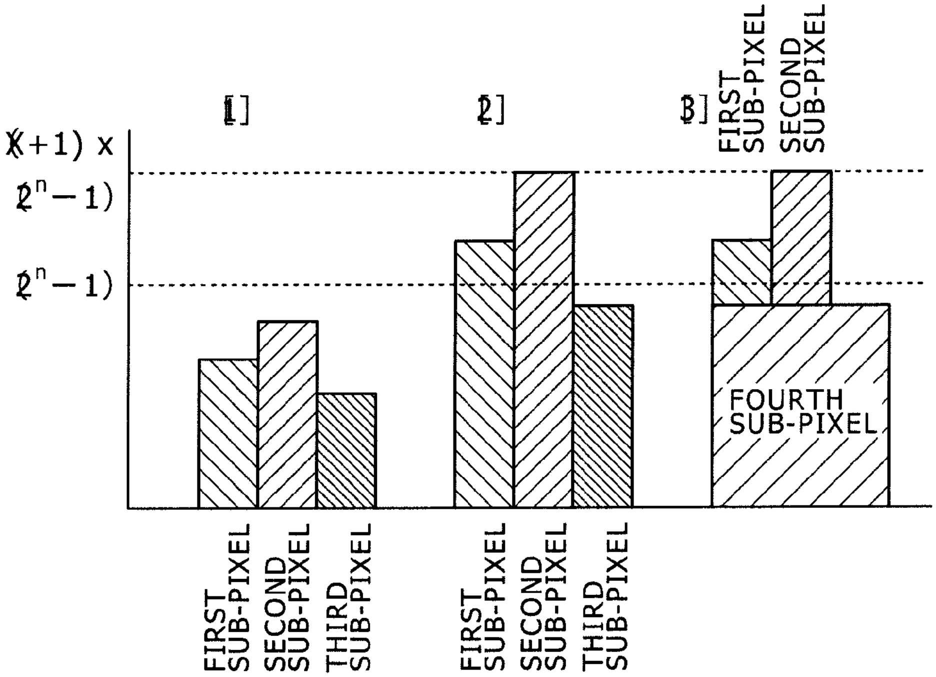
FIGS. 7A and 7B are each used as a diagram showing a model of input and output signal values and referred to in explanation of differences between an extension process executed in implementing a method for driving the image display apparatus according to the first embodiment as well as a method for driving an image display apparatus assembly and a process according to a processing method disclosed in Japanese Patent No. 3805150.
Figure 7B:
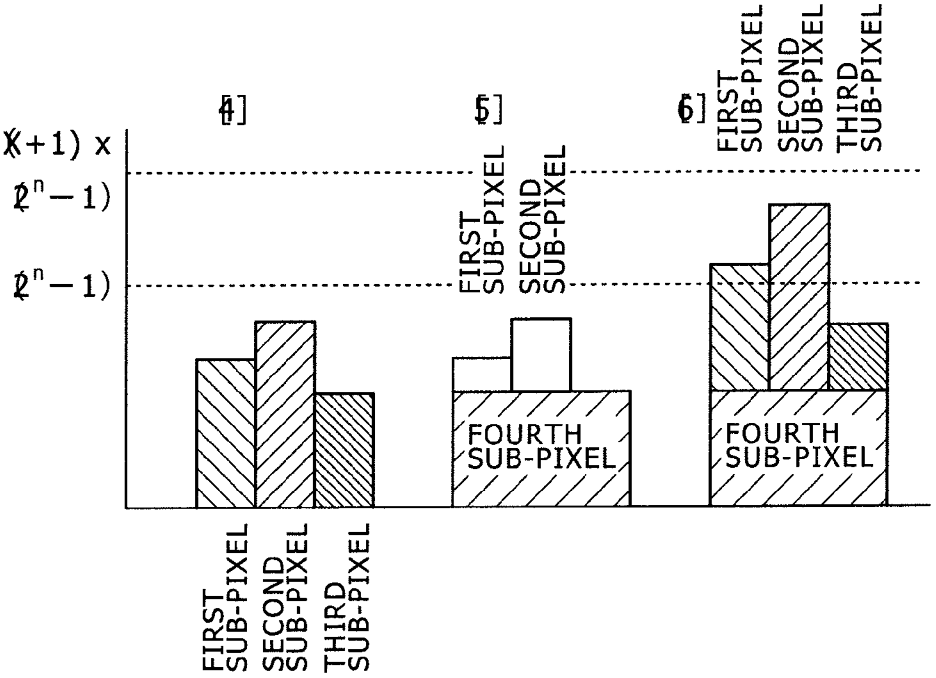

By referring to diagrams of FIGS. 7A and 7B, the following description explains differences between an extension process executed in implementing a method for driving the image display apparatus according to the first embodiment as well as a method for driving an image display apparatus assembly including the image display apparatus and a process according to a processing method disclosed in Japanese Patent No. 3805150. FIGS. 7A and 7B are each used as a diagram showing a model of input and output signal values and referred to in explanation of the differences between an extension process executed in implementing a method for driving the image display apparatus according to the first embodiment as well as a method for driving an image display apparatus assembly including the image display apparatus and a process according to a processing method disclosed in Japanese Patent No. 3805150. In a typical example shown in the diagram of FIG. 7A, notation [1] indicates input signal values of a set having first, second and third sub-pixels for which $\alpha_{min}$ has been obtained. In addition, notation [2] indicates the state of the extension processing or an operation to find the product of the input signal values and the extension coefficient $\alpha_0$. In addition, notation [3] indicates the state after the extension process has been carried out, that is, the state in which the output signal values $X_{1-(p, q)}$, $X_{2-(p, q)}$, $X_{3-(p, q)}$, and $X_{4-(p, q)}$ have been obtained.

In a typical example shown in the diagram of FIG. 7B, notation [4] indicates input signal values of a set having of first, second and third sub-pixels for the processing method disclosed in Japanese Patent No. 3805150. It is to be noted that the input signal values indicated by notation [4] are the same as those indicated by notation [1] in the diagram of FIG. 7A. In addition, notation [5] indicates a digital value Ri of the red-input sub-pixel, a digital value Gi of the green-input sub-pixel and a digital value Bi of the blue-input sub-pixel as well as a digital value W for driving the luminance sub-pixel. In addition, notation [6] indicates resulting values Ro, Go, Bo and W. As obvious from the diagrams of FIGS. 7A and 7B, in accordance with the method for driving the image display apparatus according to the first embodiment and the method for driving an image display apparatus assembly including the image display apparatus, an implementable maximum luminance is obtained in the second sub-pixel. In accordance with the processing method disclosed in Japanese Patent No. 3805150, on the other hand, it is obvious that the implementable maximum luminance is not attained. As described above, in comparison with the processing method disclosed in Japanese Patent No. 3805150, the method for driving the image display apparatus according to the first embodiment and the method for driving an image display apparatus assembly including the image display apparatus are capable of displaying an image at a higher luminance.

Second Embodiment

A second embodiment is obtained by modifying the first embodiment. Even though the planar light-source apparatus of the right-below type in the past can be employed as the planar light-source apparatus, in the case of the second embodiment, a planar light-source apparatus 150 of a division driving method (or a portion driving method) to be described below is employed. It is to be noted that the extension process itself is the same as the extension process of the first embodiment described above.

Figure 8:
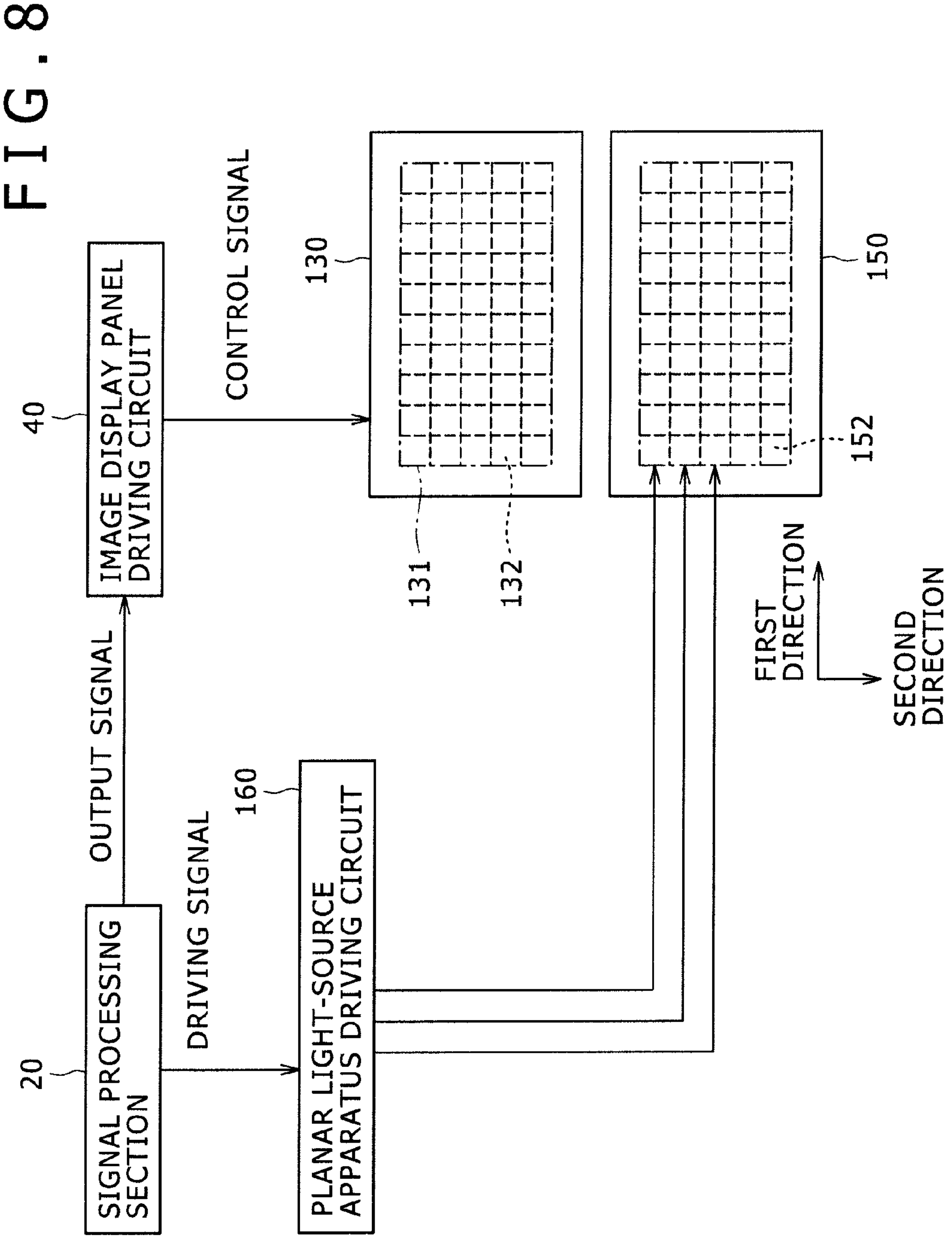
FIG. 8 is a conceptual diagram showing an image display panel and a planar light-source apparatus which form an image display apparatus assembly according to a second embodiment of the present invention.

In the case of the second embodiment, it is assumed that the display area 131 of the image display panel 130 composing the color liquid-crystal display apparatus is divided into S×T virtual display area units 132 as shown in a conceptual diagram of FIG. 8. The planar light-source apparatus 150 of a division driving method has S×T planar light-source units 152 which are each associated with one of the S×T virtual display area units 132. The light emission state of each of the S×T virtual display area units 132 is controlled individually.

As shown in the conceptual diagram of FIG. 8, the display area 131 of the image display panel 130 serving as a color image liquid-crystal display panel has (P×Q) pixels laid out to form a two-dimensional matrix which has P rows and Q columns. That is to say, P pixels are arranged in the first direction (that is, the horizontal direction) to form a row and such Q rows are laid out in the second direction (that is, the vertical direction) to form the two-dimensional matrix. As described above, it is assumed that the display area 131 is divided into S×T virtual display area units 132. Since the product S×T representing the number of virtual display area units 132 is smaller than the product (P×Q) representing the number of pixels, each of the S×T virtual display area units 132 has a configuration which includes a plurality of pixels. To put it more concretely, for example, the image display resolution conforms to the HD-TV specifications. If the number of pixels laid out to form a two-dimensional matrix is (P×Q), a pixel count representing the number of pixels laid out to form a two-dimensional matrix is represented by notation (P, Q). For example, the number of pixels laid out to form a two-dimensional matrix is (1920, 1080). In addition, as described above, it is assumed that the display area 131 composing the pixels arrayed in a two dimensional matrix is divided into S×T virtual display area units 132. In the conceptual diagram of FIG. 8, the display area 131 is shown as a large dashed-line block whereas each of the S×T virtual display area units 132 is shown as a small dotted-line block in the large dashed-line block. The virtual display area unit count (S, T) is, for example, (19, 12). In order to make the conceptual diagram of FIG. 8 simple, however, the number of virtual display area units 132, that is, the number of planar light-source units 152, is different from (19, 12). As described above, each of the S×T virtual display area units 132 has a configuration which includes a plurality of pixels. For example, the pixel count (P, Q) is (1920, 1080) while the virtual display area unit count (S, T) is only (19, 12). Thus, each of the S×T virtual display area units 132 has a configuration which includes about 10,000 pixels. In general, the image display panel 130 is driven on a line-after-line basis. To put it more concretely, the image display panel 130 has scan electrodes each extended in the first direction to form a row of the matrix cited above and data electrodes each extended in the second direction to form a column of the matrix in which the scan and data electrodes cross each other at pixels each located at an intersection corresponding to an element of the matrix. The scan circuit 42 supplies a scan signal to a specific one of the scan electrodes in order to select the specific scan electrode and scan pixels connected to the selected scan electrode. An image of one screen is displayed on the basis of data signals already supplied from the signal outputting circuit 41 to the pixels by way of the data electrodes as output signals.

Referred also to as a backlight, the planar light-source apparatus 150 of the right-below type has S×T planar light-source units 152 which are each associated with one of the S×T virtual display area units 132. That is to say, a planar light-source unit 152 radiates illuminating light to the rear face of a virtual display area unit 132 associated with the planar light-source unit 152. Light sources each employed in a planar light-source unit 152 is controlled individually. It is to be noted that, in actuality, the planar light-source apparatus 150 is placed right below the image display panel 130. In the conceptual diagram of FIG. 8, however, the image display panel 130 and the planar light-source apparatus 150 are shown separately.

As described above, it is assumed that the display area 131 of the image display panel 130 composing the pixels arrayed in a two-dimensional matrix is divided into S×T virtual display area units 132. This state of division is expressed in terms of rows and columns as follows. The S×T virtual display area units 132 can be said to be laid out on the display area 131 to form a matrix having (T rows)×(S columns). Also, each virtual display area unit 132 is composed to include $M_0 \times N_0$ pixels. For example, the pixel count ($M_0$, $N_0$) is about 10,000 as described above. By the same token, the layout of the MoxNo pixels in a virtual display area unit 132 can be expressed in terms of rows and columns as follows. The pixels can be said to be laid out on the virtual display area unit 132 to form a matrix having $N_0$ rows×$M_0$ columns.

Figure 9:
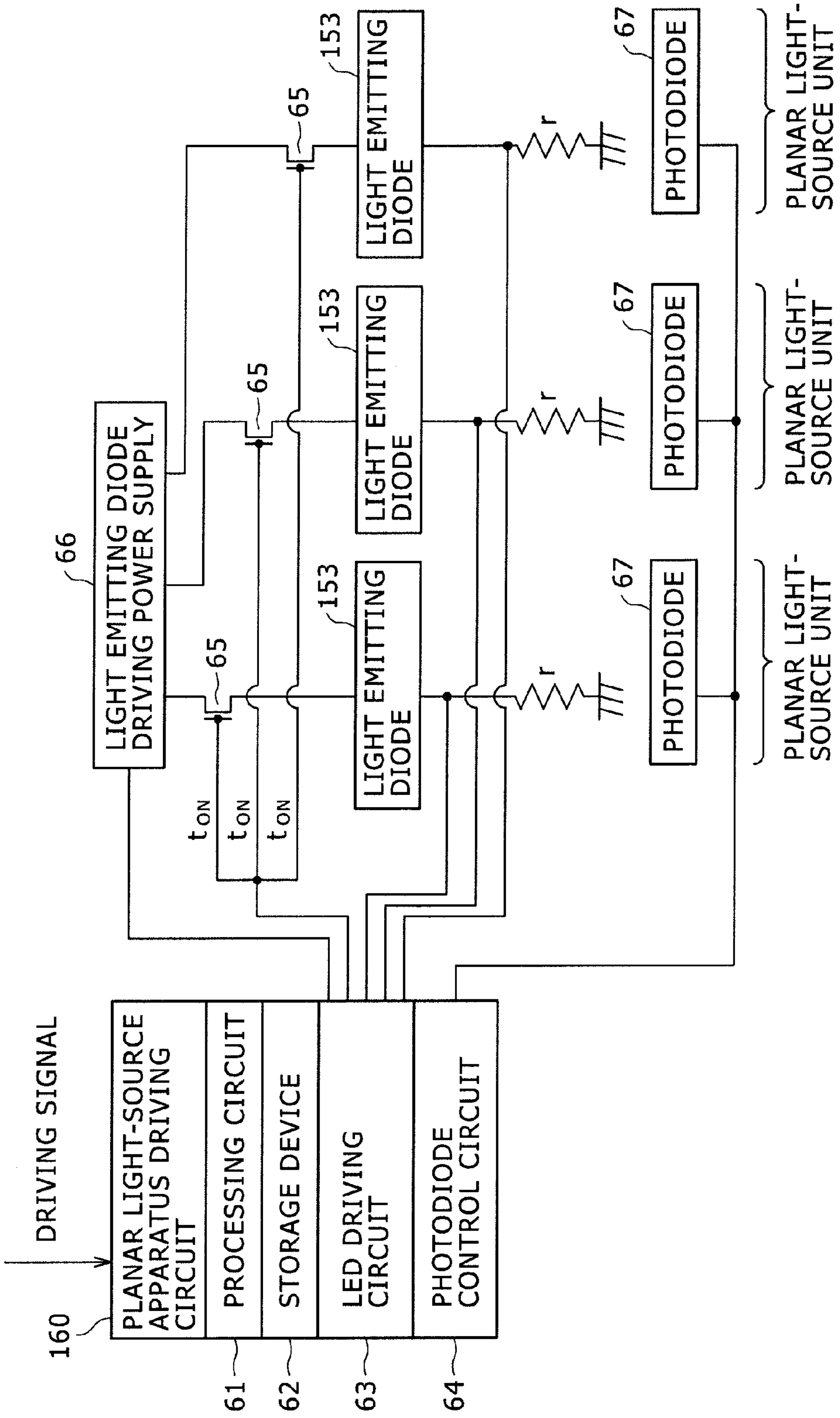
FIG. 9 is a diagram showing a planar light-source apparatus driving circuit of the planar light-source apparatus employed in the image display apparatus assembly according to the second embodiment.
Figure 10:
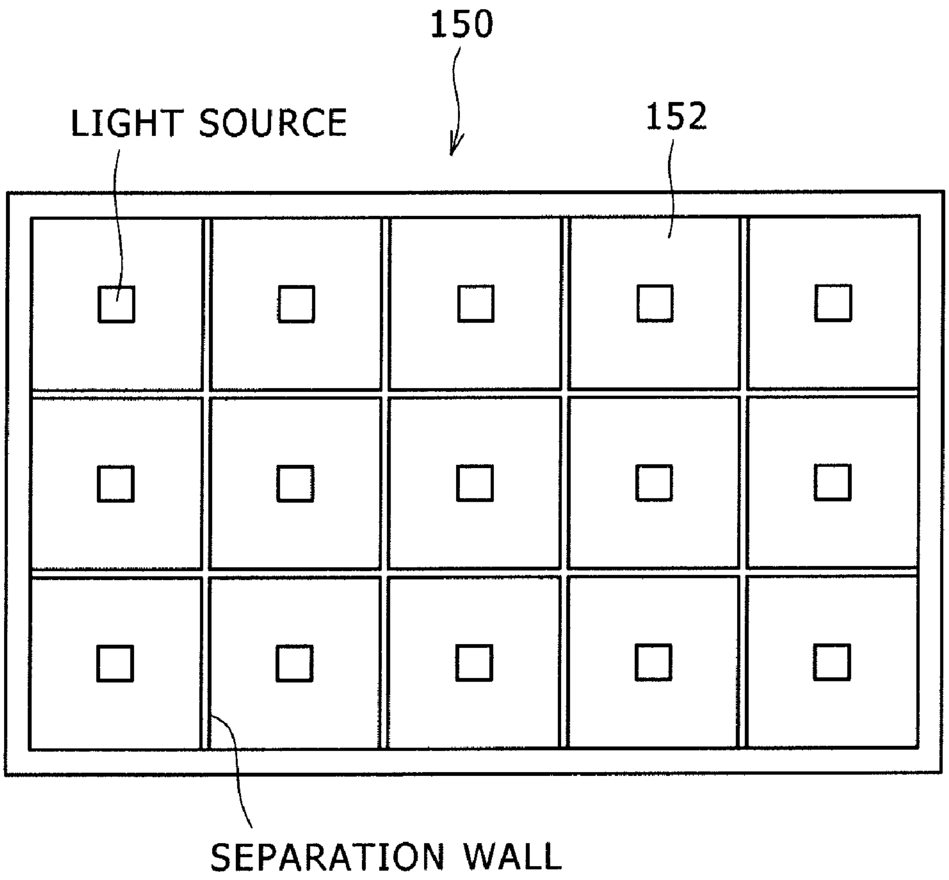
FIG. 10 is a diagram showing a model of locations and an array of elements such as planar light-source units in the planar light-source apparatus employed in the image display apparatus assembly according to the second embodiment.

FIG. 10 is a diagram showing a model of locations and an array of elements such as the planar light-source units 152 in the planar light-source apparatus 150. A light source included in each of the planar light-source units 152 is a light emitting diode 153 driven on the basis of a PWM (Pulse Width Modulation) control technique. The luminance of light generated by the planar light-source unit 152 is controlled to increase or decrease by respectively increasing or decreasing the duty ratio of the pulse modulation control of the light emitting diode 153 included in the planar light-source unit 152. The illuminating light emitted by the light emitting diode 153 is radiated to penetrate a light diffusion plate and propagate to the rear face of the image display panel 130 by way of an optical functional sheet group. The optical functional sheet group includes a light diffusion sheet, a prism sheet and a polarization conversion sheet. As shown in the diagram of FIG. 9, a photodiode 67 is provided for a planar light-source unit 152 to serve as an optical sensor. The photodiode 67 is used for measuring the luminance and chroma of light emitted by the light emitting diode 153 employed in the planar light-source unit 152 for which the photodiode 67 is provided.

As shown in the diagrams of FIGS. 8 and 9, the planar light-source apparatus driving circuit 160 for driving the planar light-source unit 152 on the basis of a planar light-source apparatus control signal received from the signal processing section 20 as a driving signal controls the light emitting diodes 153 of the planar light-source unit 152 in order to put the light emitting diodes 153 in turned-on and turned-off states by adoption of a PWM (Pulse Width Modulation) control technique. As shown in the diagram of FIG. 9, the planar light-source apparatus driving circuit 160 employs elements including a processing circuit 61, a storage device 62 to serve as a memory, an LED driving circuit 63, a photodiode control circuit 64, FETs each serving as a switching device 65 and a light emitting diode driving power supply 66 serving as a constant-current source. Commonly known circuits and/or devices can be used as these elements composing the planar light-source apparatus driving circuit 160.

The light emission state of the light emitting diode 153 for a current image display frame is measured by the photodiode 67 which then outputs a signal representing a result of the measurement to the photodiode control circuit 64. The photodiode control circuit 64 and the processing circuit 61 convert the measurement result signal into data typically representing the luminance and chroma of light emitted by the light emitting diode 153, supplying the data to the LED driving circuit 63. The LED driving circuit 63 then controls the switching device 65 in order to adjust the light emission state of the light emitting diode 153 for the next image display frame in a feedback control mechanism.

On the downstream side of the light emitting diode 153, a resistor r for detection of a current flowing through the light emitting diode 153 is connected in series with the light emitting diode 153. The current flowing through the current detection resistor r is converted into a voltage, that is, a voltage drop along the resistor r. The LED driving circuit 63 also controls the operation of the light emitting diode driving power supply 66 so that the voltage drop is sustained at a constant magnitude determined in advance. In the diagram of FIG. 9, a light emitting diode driving power supply 66 serving as a constant-current source is shown. In actuality, however, a light emitting diode driving power supply 66 is provided for every light emitting diode 153. It is to be noted that, in the diagram of FIG. 9, three light emitting diodes 153 are shown whereas, in the diagram of FIG. 10, a light emitting diode 153 is included in a planar light-source unit 152. In actuality, however, the number of light emitting diodes 153 included in a planar light-source unit 152 is by no means limited to one.

As described previously, every pixel is configured as a set of four sub-pixels, i.e., first, second, third and fourth sub-pixels. The luminance of each of the sub-pixels is controlled by adoption of an eight-bit control technique. The control of the luminance of every sub-pixel is referred to as gradation control for setting the luminance at one of $2^8$ levels, i.e., the levels of zero to 255. Thus, a PWM (Pulse Width Modulation) output signal for controlling the light emission time of every light emitting diode 153 employed in the planar light-source unit 152 is also controlled to a value PS at one of $2^8$ levels, i.e., the levels of zero to 255. However, the method for controlling the luminance of each of the sub-pixels is by no means limited to the eight-bit control technique. For example, the luminance of each of the sub-pixels can also be controlled by adoption of a ten-bit control technique. In this case, the luminance of each of the sub-pixels is controlled to a value at one of $2^{10}$ levels, i.e., the levels of zero to 1,023 whereas a PWM (Pulse Width Modulation) output signal for controlling the light emission time of every light emitting diode 153 employed in the planar light-source unit 152 is also controlled to a value PS at one of $2^{10}$ levels, i.e., the levels of zero to 1,023. In the case of the ten-bit control technique, a value at the levels of zero to 1,023 is represented by a ten-bit expression which is four times the eight-bit expression representing a value at the levels of zero to 255 for the eight-bit control technique.

Quantities related to the optical transmittance Lt (or the aperture ratio) of a sub-pixel, the display luminance y of light radiated by a display-area portion corresponding to the sub-pixel and the light-source luminance Y of light emitted by the planar light-source unit 152 are defined as follows.

A light-source luminance $Y_1$ is the highest value of the light-source luminance. In the following description, the light-source luminance $Y_1$ is also referred to as a light-source luminance first prescribed value in some cases.

An optical transmittance $Lt_1$ is the maximum value of the optical transmittance (or the aperture ratio) of a sub-pixel in a virtual display area unit 132. In the following description, the optical transmittance $Lt_1$ is also referred to as an optical-transmittance first prescribed value in some cases.

An optical transmittance $Lt_2$ is the optical transmittance (or the aperture ratio) which is displayed by a sub-pixel when it is assumed that a control signal corresponding to a signal maximum value $X_{max-(s, t)}$ in the display area unit 132 has been supplied to the sub-pixel. The signal maximum value $X_{max-(s, t)}$ is the largest value among values of output signals generated by the signal processing section 20 and supplied to the image display panel driving circuit 40 to serve as signals for driving all sub-pixels composing the virtual display area unit 132. In the following description, the optical transmittance Lt2 is also referred to as an optical-transmittance second prescribed value in some cases. It is to be noted that the following relations are satisfied: $0 \leqq Lt2 \leqq Lt1$.

A display luminance $y_2$ is a display luminance obtained on the assumption that the light-source luminance is the light-source luminance first prescribed value $Y_1$ and the optical transmittance (or the aperture ratio) of the sub-pixel is the optical-transmittance second prescribed value $Lt_2$. In the following description, the display luminance $y_2$ is also referred to as a display luminance second prescribed value in some cases.

A light-source luminance $y_2$ is a light-source luminance to be exhibited by the planar light-source unit 152 in order to set the luminance of a sub-pixel at the display luminance second prescribed value $y_2$ when it is assumed that a control signal corresponding to the signal maximum value $X_{max-(s,t)}$ in the display area unit 132 has been supplied to the sub-pixel and the optical transmittance (or the aperture ratio) of the sub-pixel has been corrected to the optical-transmittance first prescribed value $Lt_1$. In some cases, however, a correction process may be carried out on the light-source luminance $Y_2$ as a process considering the effect of the light-source luminance of the planar light-source unit 152 on the light-source luminance of another planar light-source unit 152.

Figure 11A:
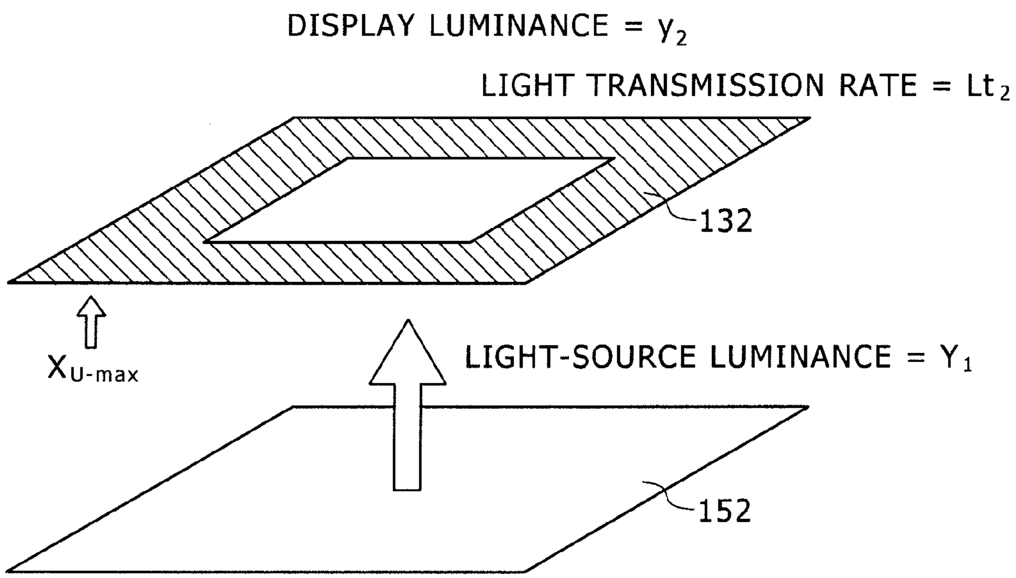
FIGS. 11A and 11B are each a conceptual diagram to be referred to in explanation of a state of increasing and decreasing a light source luminance $Y_2$ of a planar light-source unit in accordance with control executed by a planar light-source apparatus driving circuit so that the planar light-source unit produces a second prescribed value $y_2$ of the display luminance on the assumption that a control signal corresponding to a signal maximum value $X_{max-(s, t)}$ in the display area unit has been supplied to the sub-pixel.
Figure 11B:
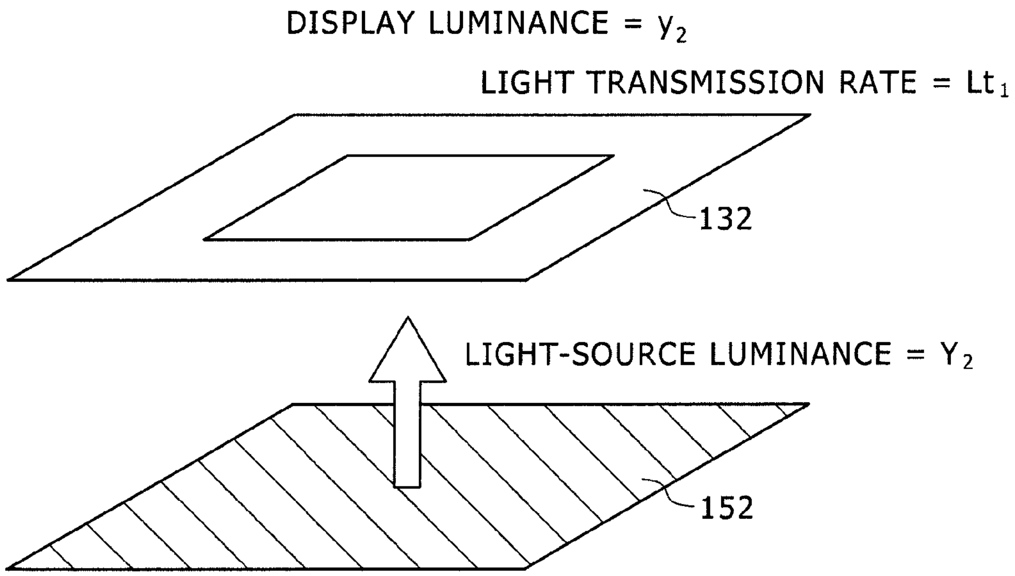

The planar light-source apparatus driving circuit 160 controls the luminance of the light emitting device employed in the planar light-source unit 152 associated with the virtual display area unit 132 so that the luminance (the display luminance second prescribed value $y_2$ at the optical-transmittance first prescribed value $Lt_1$) of a sub-pixel is obtained during the partial driving operation (or the division driving operation) of the planar light-source apparatus when it is assumed that a control signal corresponding to the signal maximum value $X_{max-(s,t)}$ in the display area unit 132 has been supplied to the sub-pixel. To put it more concretely, the light-source luminance $Y_2$ is controlled so that the display luminance $y_2$ is obtained, for example, when the optical transmittance (or the aperture ratio) of the sub-pixel is set at the optical-transmittance first prescribed value $Lt_1$. Typically, the light-source luminance $Y_2$ is decreased so that the display luminance $y_2$ is obtained. That is to say, for example, the light-source luminance $Y_2$ of the planar light-source unit 152 is controlled for every image display frame so that Eq. (A) given below is satisfied. It is to be noted that the relation $Y_2 \leqq Y_1$ is satisfied. FIGS. 11A and 11B are each a conceptual diagram showing a state of control to increase and decrease the light-source luminance $Y_2$ of the planar light-source unit 152.

$$Y_2 \cdot Lt_1 = Y_1 \cdot Lt_2 \quad \text{(A)}$$

In order to control each of the sub-pixels, the signal processing section 20 supplies the output signals $X_{1-(p,q)}$, $X_{2-(p,q)}$, $X_{3-(p,q)}$ and $X_{4-(p,q)}$ to the image display panel driving circuit 40. Each of the output signals $X_{1-(p,q)}$, $X_{2-(p,q)}$, $X_{3-(p,q)}$ and $X_{4-(p,q)}$ is a signal for controlling the optical transmittance Lt of each of the sub-pixels. The image display panel driving circuit 40 generates control signals from the output signals $X_{1-(p,q)}$, $X_{2-(p,q)}$, $X_{3-(p,q)}$ and $X_{4-(p,q)}$ and supplies (outputs) the control signals to each of the sub-pixels. On the basis of the control signals, a switching device employed in each of the sub-pixels is driven in order to apply a voltage determined in advance to first and second transparent electrodes composing a liquid-crystal cell so as to control the optical transmittance (or the aperture ratio) Lt of each of the sub-pixels. It is to be noted that the first and second transparent electrodes are shown in none of the figures. In this case, the larger the magnitude of the control signal, the higher the optical transmittance (or the aperture ratio) Lt of a sub-pixel and, thus, the higher the value of the luminance (that is, the display luminance y) of a display area portion corresponding to the sub-pixel. That is to say, the image created as a result of transmission of light through the sub-pixels is bright. The image is normally a kind of dot aggregation.

The control of the display luminance y and the light-source luminance $Y_2$ is executed for every image display frame in the image display of the image display panel 130, every display area unit and every planar light-source unit. In addition, the operations carried out by the image display panel 130 and the planar light-source apparatus 150 for every sub-pixel in an image display frame are synchronized with each other. It is to be noted that, as electrical signals, the driving circuits described above receive a frame frequency also referred to as a frame rate and a frame time which is expressed in terms of seconds. The frame frequency is the number of images transmitted per second whereas the frame time is the reciprocal of the frame frequency.

In the case of the first embodiment, the extension process of extending an input signal in order to produce an output signal is carried out on all pixels on the basis of the extension coefficient $\alpha_0$. In the case of the second embodiment, on the other hand, the extension coefficient $\alpha_0$ is found for each of the S×T display area units 132, and the extension process of extending an input signal in order to produce an output signal is carried out on each individual one of the S×T display area units 132 on the basis of the extension coefficient $\alpha_0$ found for the individual virtual display area unit 132.

Then, in the (s, t)th planar light-source unit 152 associated with the (s, t)th virtual display area unit 132, the extension coefficient $\alpha_0$ found for which is $\alpha_{0-(s,t)}$, the luminance of the light source is $1/\alpha_{0-(s,t)}$.

As an alternative, the planar light-source apparatus driving circuit 160 controls the luminance of the light source included in the planar light-source unit 152 associated with the virtual display area unit 132 in order to set the luminance of a sub-pixel at the display luminance second prescribed value $y_2$ for the optical-transmittance first prescribed value $Lt_1$ when it is assumed that a control signal corresponding to the signal maximum value $X_{max-(s,t)}$ in the display area unit 132 has been supplied to the sub-pixel. As described earlier, the signal maximum value $X_{max-(s,t)}$ is the largest value among the values $X_{1-(s,t)}$, $X_{2-(s,t)}$, $X_{3-(s,t)}$ and $X_{4-(s,t)}$ of the output signals generated by the signal processing section 20 and supplied to the image display panel driving circuit 40 to serve as signals for driving all sub-pixels composing every virtual display area unit 132. To put it more concretely, the light-source luminance $Y_2$ is controlled so that the display luminance second prescribed value $y_2$ is obtained, for example, when the optical transmittance (or the aperture ratio) of the sub-pixel is set at the optical-transmittance first prescribed value $Lt_1$. Typically, the light-source luminance $Y_2$ is decreased so that the display luminance second prescribed value $y_2$ is obtained. That is to say, for example, the light-source luminance $Y_2$ of the planar light-source unit 152 is controlled for every image display frame so that Eq. (A) given before is satisfied.

By the way, if it is assumed that the luminance of the (s, t)th planar light-source unit 152 on the planar light-source apparatus 150 is controlled where (s, t)=(1, 1), in some cases, it is necessary to consider the effects of the (S×T) other planar liquid-crystal units 152. If the (S×T) other planar liquid-crystal units 152 have effects on the (1, 1) planar light-source unit 152, the effects have been determined in advance by making use of a light emission profile of the planar liquid-crystal units 152. Thus, differences can be found by inverse computation processes. As a result, a correction process can be carried out. Basic processing is explained as follows.

Luminance values (or the values of the light-source luminance $Y_2$) required of the (S×T) other planar liquid-crystal units 152 based on the condition expressed by Eq. (A) are represented by a matrix $[L_{P \times Q}]$. In addition, when only a specific planar light-source unit 152 is driven and other planar light-source units 152 are not, the luminance of the specific planar light-source unit 152 is found. The luminance of a driven planar light-source unit 152 with other planar light-source units 152 not driven is found in advance for each of the (S×T) other planar liquid-crystal units 152. The luminance values found in this way are expressed by a matrix $[L'_{P \times Q}]$. In addition, correction coefficients are represented by a matrix $[\alpha_{P \times Q}]$. In this case, a relation among these matrixes can be represented by Eq. (B-1) given below. The matrix $[\alpha_{P\times Q}]$ of the correction coefficients can be found in advance.

$$[L_{P\times Q}]=[L'_{P\times Q}]\cdot[\alpha_{P\times Q}] \quad \text{(B-1)}$$

Thus, the matrix $[L'_{P\times Q}]$ can be found from Eq. (B-1). That is to say, the matrix $[L'_{P\times Q}]$ can be found by carrying out an inverse matrix calculation process.

In other words, Eq. (B-1) can be rewritten into the following equation:

$$[L'_{P\times Q}]=[L_{P\times Q}][\alpha_{P\times Q}]^{-1} \quad \text{(B-2)}$$

Then, the matrix $[L'_{P\times Q}]$ can be found in accordance with Eq. (B-2) given above. Subsequently, the light emitting diode 153 employed in the planar light-source unit 152 to serve as a light source is controlled so that luminance values expressed by the matrix $[L'_{P\times Q}]$ are obtained. To put it more concretely, the operations and the processing are carried out by making use of information stored as a data table in the storage device 62 which is employed in the planar light-source apparatus driving circuit 160 to serve as a memory. It is to be noted that, by controlling the light emitting diode 153, no element of the matrix $[L'_{P\times Q}]$ can have a negative value. It is thus needless to say that all results of the processing need to stay in a positive domain. Accordingly, the solution to Eq. (B-2) is not always a precise solution. That is to say, the solution to Eq. (B-2) is an approximate solution in some cases.

In the way described above, the matrix $[L'_{P\times Q}]$ of luminance values, which are obtained on the assumption that the planar light-source units are driven individually, is found on the basis of the matrix $[L'_{P\times Q}]$ of luminance values computed by the planar light-source apparatus driving circuit 160 in accordance with Eq. (A) and on the basis of the matrix $[\alpha_{P\times Q}]$ representing correction values. Then, the luminance values represented by the matrix $[L'_{P\times Q}]$ are converted into integers in the range 0 to 255 on the basis of a conversion table which has been stored in the storage device 62. The integers are the values of a PWM (Pulse Width Modulation) output signal. By doing so, the processing circuit 61 employed in the planar light-source apparatus driving circuit 160 is capable of obtaining a value of the PWM (Pulse Width Modulation) output signal for controlling the light emission time of the light emitting diode 153 which is employed in the planar light-source unit 152. Then, on the basis of the value of the PWM (Pulse Width Modulation) output signal, the planar light-source apparatus driving circuit 160 determines an on time $t_{ON}$ and an off time $t_{OFF}$ for the light emitting diode 153 employed in the planar light-source unit 152. It is to be noted that the on time $t_{ON}$ and the off time $t_{OFF}$ satisfy the following equation:

$$t_{ON}+t_{OFF}=t_{Const}$$

where notation $t_{Const}$ in the above equation denotes a constant.

In addition, the duty cycle of a driving operation based on the PWM (Pulse Width Modulation) of the light emitting diode 153 is expressed by the following equations:

$$\text{Duty cycle}=t_{ON}/(t_{ON}+t_{OFF})=t_{ON}/t_{Const}$$

Then, a signal corresponding to the on time $t_{ON}$ of the light emitting diode 153 employed in the planar light-source unit 152 is supplied to the LED driving circuit 63 so that the switching device 65 is put in a turned-on state for the on time $t_{ON}$ based on the magnitude of a signal received from the LED driving circuit 63 to serve as a signal corresponding to the on time $t_{ON}$. Thus, an LED driving current flows to the light emitting diode 153 from the light emitting diode driving power supply 66. As a result, the light emitting diode 153 emits light for the on time $t_{ON}$ in one image display frame. By doing so, the light emitted by the light emitting diode 153 illuminates the virtual display area unit 132 at an illumination level determined in advance.

Third Embodiment

A third embodiment is also obtained as a modified version of the first embodiment. The third embodiment implements an image display apparatus which is explained as follows. The image display apparatus according to the third embodiment employs an image display panel created as a two-dimensional matrix of light emitting device units UN each having a first light emitting device corresponding to a first sub-pixel for emitting a red color, a second light emitting device corresponding to a second sub-pixel for emitting a green color, a third light emitting device corresponding to a third sub-pixel for emitting a blue color and a fourth light emitting device corresponding to a fourth sub-pixel for emitting a white color. The image display panel employed in the image display apparatus according to the third embodiment is typically an image display panel having a configuration and a structure which are described below. It is to be noted that the number of aforementioned light emitting device units UN can be determined on the basis of specifications desired of the image display apparatus.

That is to say, the image display panel employed in the image display apparatus according to the third embodiment is an image display panel of a passive matrix type or an active matrix type. The image display panel employed in the image display apparatus according to the third embodiment is a color image display panel of a direct-view type. A color image display panel of a direct-view type is an image display panel which is capable of displaying a directly viewable color image by controlling the light emission and no-light emission states of each of the first, second, third and fourth light emitting devices. As an alternative, the image display panel employed in the image display apparatus according to the third embodiment can also be designed as an image display panel of a passive matrix type or an active matrix type but the image display panel serves as a color image display panel of a projection type. A color image display panel of a projection type is an image display panel which is capable of displaying a color image projected on a projection screen by controlling the light emission and no-light emission states of each of the first, second, third and fourth light emitting devices.

Figure 12:
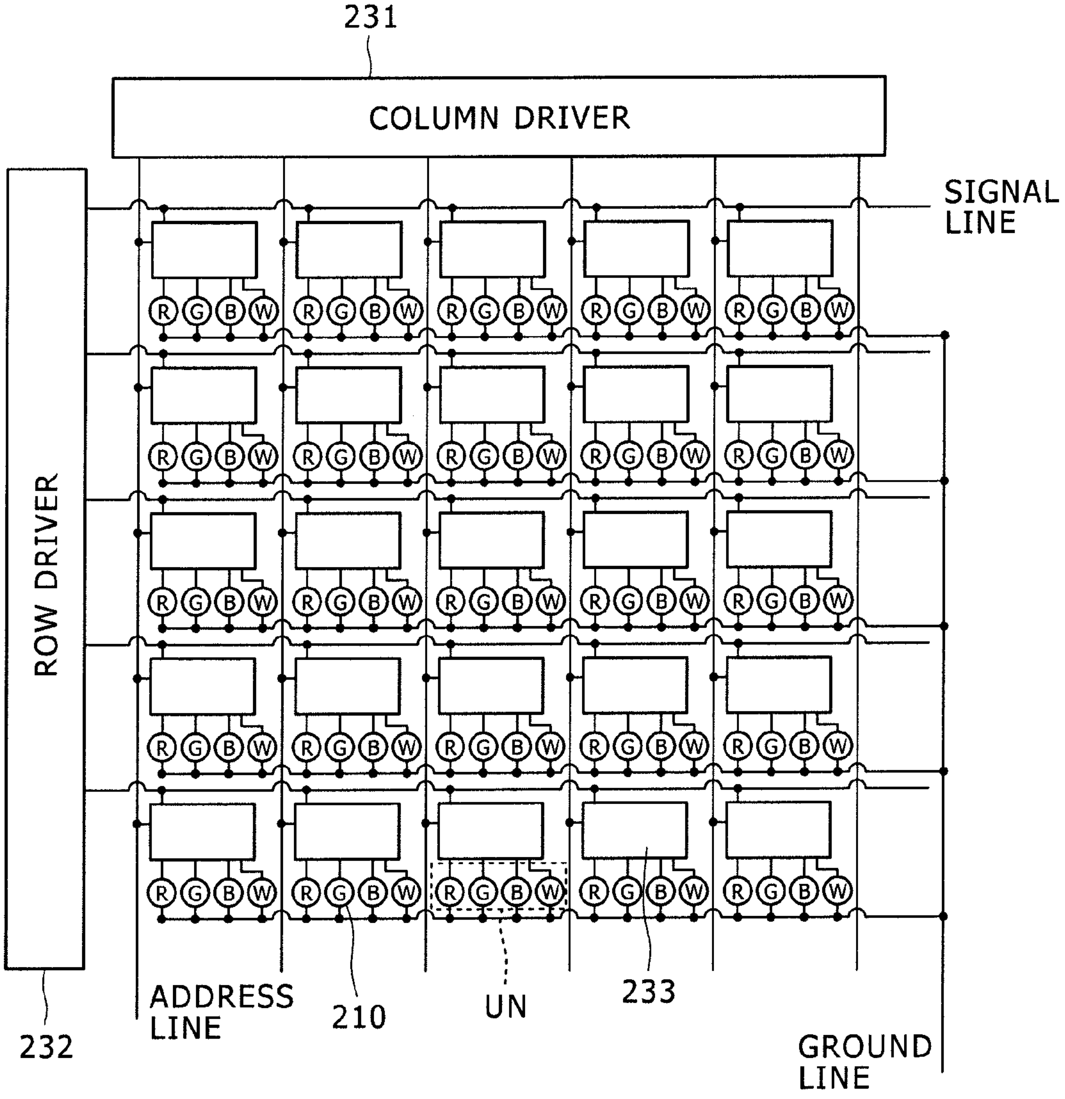
FIG. 12 is a diagram showing an equivalent circuit of an image display apparatus according to a third embodiment of the present invention.

FIG. 12 is a diagram showing an equivalent circuit of an image display apparatus according to the third embodiment. As described above, the image display apparatus according to the third embodiment generally employs a passive-matrix or active-matrix driven color image display panel of the direct-view type. In the diagram of FIG. 12, reference notation R denotes a first sub-pixel serving as a first light emitting device 210 for emitting light of the red color whereas reference notation G denotes a second sub-pixel serving as a second light emitting device 210 for emitting light of the green color. By the same token, reference notation B denotes a third sub-pixel serving as a third light emitting device 210 for emitting light of the blue color whereas reference notation W denotes a fourth sub-pixel serving as a fourth light emitting device 210 for emitting light of the white color. A specific electrode of each of the sub-pixels R, G, B and W each serving as a light emitting device 210 is connected to a driver 233. The specific electrode connected to the driver 233 can be the p-side or n-side electrode of the sub-pixel. The driver 233 is connected to a column driver 231 and a row driver 232. Another electrode of each of the sub-pixels R, G, B and W each serving as a light emitting device 210 is connected F to the ground. If the specific electrode connected to the driver 233 is the p-side electrode of the sub-pixel, the other electrode connected to the ground is the n-side electrode of the sub-pixel. If the specific electrode connected to the driver 233 is the n-side electrode of the sub-pixel, on the other hand, the other electrode connected to the ground is the p-side electrode of the sub-pixel. In execution of control of the light emission and no-light emission states of every light emitting device 210, a light emitting device 210 is selected by the driver 233 typically in accordance with a signal received from the row driver 232. Prior to the execution of this control, the column driver 231 has supplied a luminance signal for driving the light emitting device 210 to the driver 233. To put it in detail, the driver 233 selects a first sub-pixel serving as a first light emitting device R for emitting light of the red color, a second sub-pixel serving as a second light emitting device G for emitting light of the green color, a third sub-pixel serving as a third light emitting device B for emitting light of the blue color or a fourth sub-pixel serving as a fourth light emitting device W for emitting light of the white color. On a time division basis, the driver 233 controls the light emission and no-light emission states of the first sub-pixel serving as a first light emitting device R for emitting light of the red color, the second sub-pixel serving as a second light emitting device G for emitting light of the green color, the third sub-pixel serving as a third light emitting device B for emitting light of the blue color and the fourth sub-pixel serving as a fourth light emitting device W for emitting light of the white color. As an alternative, the driver 233 drives the first sub-pixel serving as a first light emitting device R for emitting light of the red color, the second sub-pixel serving as a second light emitting device G for emitting light of the green color, the third sub-pixel serving as a third light emitting device B for emitting light of the blue color and the fourth sub-pixel serving as a fourth light emitting device W for emitting light of the white color to emit light at the same time. In the case of the color image display apparatus of the direct-view type, the image observer directly views the image displayed on the apparatus. In the case of the color image display apparatus of the projection type, on the other hand, the image observer views the image, which is displayed on the screen of a projector by way of a projection lens.

Figure 13:
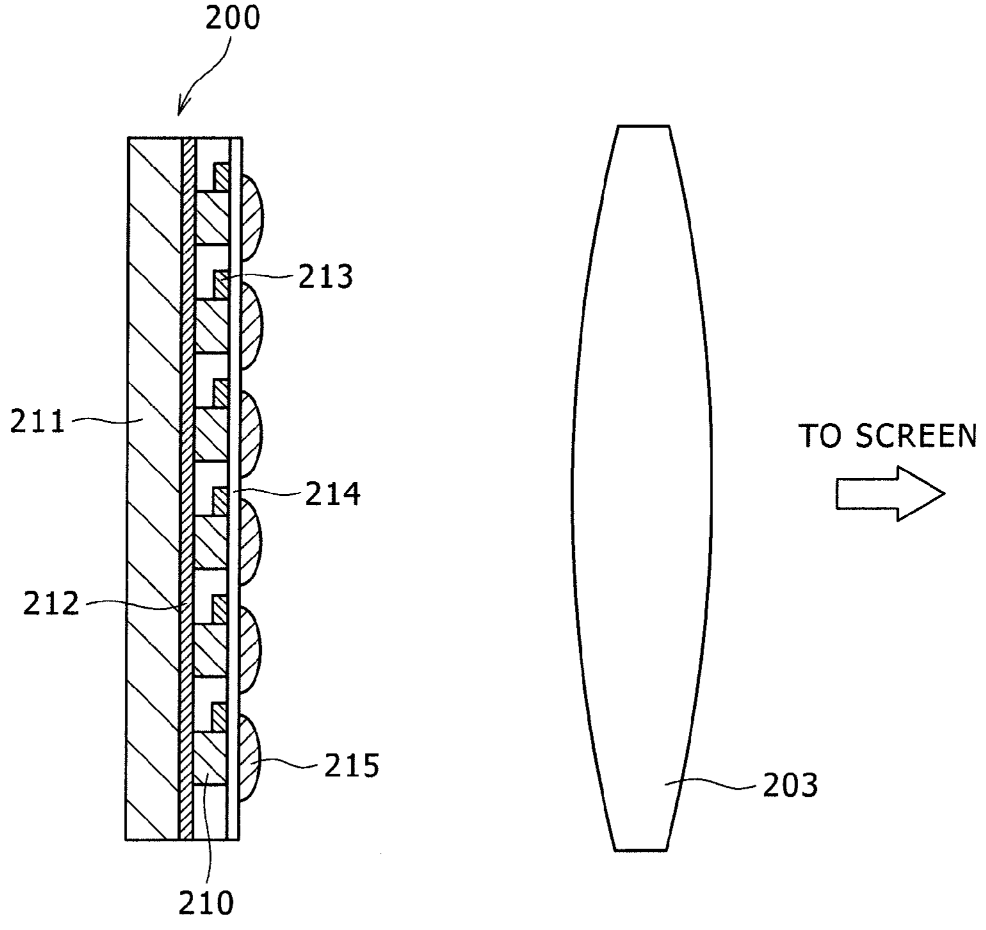
FIG. 13 is a conceptual diagram showing an image display panel employed in the image display apparatus according to the third embodiment.

It is to be noted that FIG. 13 is given to serve as a conceptual diagram showing an image display panel employed in the image display apparatus according to the third embodiment. As described above, in the case of the color image display apparatus of the direct-view type, the image observer directly views the image displayed on the apparatus. In the case of the color image display apparatus of the projection type, on the other hand, the image observer views the image, which is displayed on the screen of a projector by way of a projection lens 203. The image display panel is shown in the diagram of FIG. 13 as a light emitting device panel 200 having a configuration and a structure, which will be explained later in the description of a fourth embodiment of the present invention.

As an alternative, the image display panel employed in the image display apparatus according to the third embodiment is provided with a light-transmission control apparatus for controlling the transmission and non-transmission of light emitted by each of light emitting device units laid out on the panel to form a two-dimensional matrix. The light-transmission control apparatus is a light bulb or, to put it more concretely, a liquid-crystal display apparatus provided with thin-film transistors of a high-temperature silicon type. The technical term 'light-transmission control apparatus' used in the following description means the same thing. The light emission and no-light emission states of the first sub-pixel serving as a first light emitting device R for emitting light of the red color, the second sub-pixel serving as a second light emitting device G for emitting light of the green color, the third sub-pixel serving as a third light emitting device B for emitting light of the blue color and the fourth sub-pixel serving as a fourth light emitting device W for emitting light of the white color are controlled on a time division basis. In addition, the transmission and non-transmission of light emitted by each of the first sub-pixel serving as a first light emitting device R for emitting light of the red color, the second sub-pixel serving as a second light emitting device G for emitting light of the green color, the third sub-pixel serving as a third light emitting device B for emitting light of the blue color and the fourth sub-pixel serving as a fourth light emitting device W for emitting light of the white color are controlled. As a result, it is possible to realize an image display panel of the direct-view or projection type. In the case of the color image display apparatus of the direct-view type, the image observer directly views the image displayed on the apparatus. In the case of the color image display apparatus of the projection type, on the other hand, the image observer views the image, which is displayed on the screen of a projector by way of a projection lens.

In the case of the third embodiment, an output signal to be described below can be obtained by carrying out the same extension process as the first embodiment. The output signal is a signal for controlling the light-emission state of each of the first sub-pixels serving as a first light emitting device R for emitting light of the red color, the second sub-pixel serving as a second light emitting device G for emitting light of the green color, the third sub-pixel serving as a third light emitting device B for emitting light of the blue color and the fourth sub-pixel serving as a fourth light emitting device W for emitting light of the white color. Then, by driving the image display apparatus on the basis of the values $X_{1-(s,t)}$, $X_{2-(s,t)}$, $X_{3-(s,t)}$ and $X_{4-(s,t)}$ of the output signals, the luminance of the entire image display apparatus can be increased by $\alpha_0$ times where reference notation $\alpha_0$ denotes the extension coefficient. As an alternative, by increasing the luminance of each of the first sub-pixel serving as a first light emitting device R for emitting light of the red color, the second sub-pixel serving as a second light emitting device G for emitting light of the green color, the third sub-pixel serving as a third light emitting device B for emitting light of the blue color and the fourth sub-pixel serving as a fourth light emitting device W for emitting light of the white color by $(1/\alpha_0)$ times on the basis of the values $X_{1-(s,t)}$, $X_{2-(s,t)}$, $X_{3-(s,t)}$ and $X_{4-(s,t)}$ of the output signals, the power consumption of the entire image display apparatus can be decreased without deteriorating the quality of the displayed image.

Fourth Embodiment

A fourth embodiment of the present invention implements an image display apparatus according to the second form of the present invention and a method for driving the image display apparatus.

An image display apparatus according to the fourth embodiment employs:

(A-1): a first image display panel having a two-dimensional matrix with (P×Q) first sub-pixels each used for displaying a first elementary color;

(A-2): a second image display panel having a two-dimensional matrix with (P×Q) second sub-pixels each used for displaying a second elementary color;

(A-3): a third image display panel having a two-dimensional matrix with (P×Q) third sub-pixels each used for displaying a third elementary color;

(A-4): a fourth image display panel having a two-dimensional matrix with (P×Q) fourth sub-pixels each used for displaying a fourth color;

(B): a signal processing section 20 for receiving a first sub-pixel input signal provided with a signal value of $x_{1-(p,q)}$, a second sub-pixel input signal provided with a signal value of $x_{2-(p,q)}$ and a third sub-pixel input signal provided with a signal value of $x_{3-(p,q)}$ and for outputting a first sub-pixel output signal provided with a signal value of $X_{1-(p,q)}$ and used for determining the display gradation of the first sub-pixel, a second sub-pixel output signal provided with a signal value of $X_{2-(p,q)}$ and used for determining the display gradation of the second sub-pixel, a third sub-pixel output signal provided with a signal value of $X_{3-(p,q)}$ and used for determining the display gradation of the third sub-pixel as well as a fourth sub-pixel output signal provided with a signal value of $X_{4-(p,q)}$ and used for determining the display gradation of the fourth sub-pixel with regard to (p, q)th first, second and third sub-pixels where notations p and q are integers satisfying the equations $1 \leqq p \leqq P$ and $1 \leqq q \leqq Q$; and (C): a synthesis section 301 configured to synthesize images output by the first, second, third and fourth image display panels.

The signal processing section 20 employed in the first embodiment can be used as the signal processing section 20 of the fourth embodiment.

In addition, in the image display apparatus according to the fourth embodiment, a maximum lightness value $V_{max}(S)$ expressed as a function of variable saturation S in an HSV color space enlarged by adding the fourth color is stored in the signal processing section 20. On top of that, the signal processing section 20 also carries out the following processes of:

(B-1): finding the saturation S and the lightness value V(S) for each of a plurality of sets each having first, second and third sub-pixels on the basis of the signal values of sub-pixel input signals in the sets each having first, second and third sub-pixels;

(B-2): finding an extension coefficient $\alpha_0$ on the basis of at least one of ratios $V_{max}(S)/V(S)$ found in the sets each having first, second and third sub-pixels;

(B-3): finding the output signal value $X_{4-(p,q)}$ in the (p, q)th fourth sub-pixel on the basis of at least the input signal values $x_{1-(p,q)}$, $x_{2-(p,q)}$ and $x_{3-(p,q)}$; and (B-4): finding the output signal value $X_{1-(p,q)}$ in the (p, q)th first sub-pixel on the basis of the input signal value $x_{1-(p,q)}$, the extension coefficient $\alpha_0$ and the output signal value $X_{4-(p,q)}$, finding the output signal value $X_{2-(p,q)}$ in the (p, q)th second sub-pixel on the basis of the input signal value $x_{2-(p,q)}$, the extension coefficient $\alpha_0$ and the output signal value $X_{4-(p,q)}$ and finding the output signal value $X_{3-(p,q)}$ in the (p, q)th third sub-pixel on the basis of the input signal value $x_{3-(p,q)}$, the extension coefficient $\alpha_0$ and the output signal value $X_{4-(p,q)}$.

In addition, in accordance with a method for driving the image display apparatus according to the fourth embodiment, a maximum lightness value $V_{max}(S)$ expressed as a function of variable saturation S in an HSV color space enlarged by adding the fourth color is stored in the signal processing section 20. On top of that, the signal processing section 20 also carries out the following steps of:

(a): finding the saturation S and the lightness value V(S) for each of a plurality of sets each having first, second and third sub-pixels on the basis of the signal values of sub-pixel input signals in the sets each having first, second and third sub-pixels;

(b): finding an extension coefficient $\alpha_0$ on the basis of at least one of ratios $V_{max}(S)/V(S)$ found in the sets each having first, second and third sub-pixels;

(c): finding the output signal value $X_{4-(p,q)}$ in the (p, q)th fourth sub-pixel on the basis of at least the input signal values $x_{1-(p,q)}$, $x_{2-(p,q)}$ and $x_{3-(p,q)}$; and (d): finding the output signal value $X_{1-(p,q)}$ in the (p, q)th first sub-pixel on the basis of the input signal value $x_{1-(p,q)}$, the extension coefficient $\alpha_0$ and the output signal value $X_{4-(p,q)}$, finding the output signal value $X_{2-(p,q)}$ in the (p, q)th second sub-pixel on the basis of the input signal value $x_{2-(p,q)}$, the extension coefficient $\alpha_0$ and the output signal value $X_{4-(p,q)}$ and finding the output signal value $X_{3-(p,q)}$ in the (p, q)th third sub-pixel on the basis of the input signal value $X_{3-(p,q)}$, the extension coefficient $\alpha_0$ and the output signal value $X_{4-(p,q)}$.

To put it more concretely, in the case of the fourth embodiment, the extension process carried out on every pixel in the first embodiment is carried out on every set of first, second and third sub-pixels.

The fourth embodiment implements an image display apparatus to serve as a color image display apparatus of the direct-view or projection type. It is to be noted that the fourth embodiment is also capable of implementing an image display apparatus to serve as a field sequential system color image display apparatus of the direct-view or projection type. The image display apparatus according to the fourth embodiment is explained as follows.

Figure 14A:
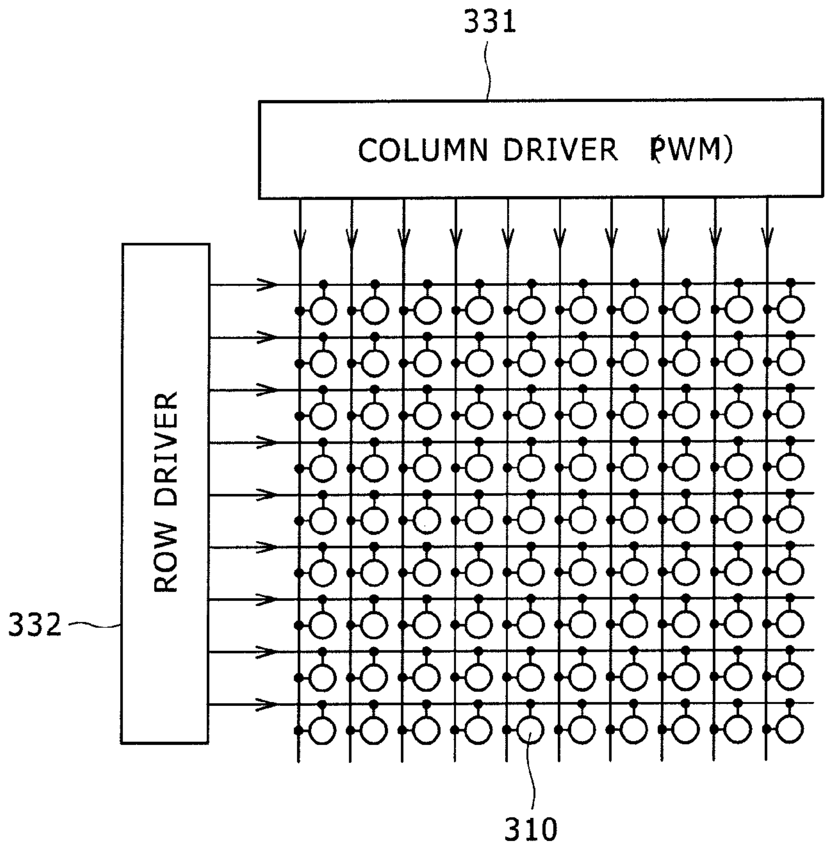
Figure 14B:
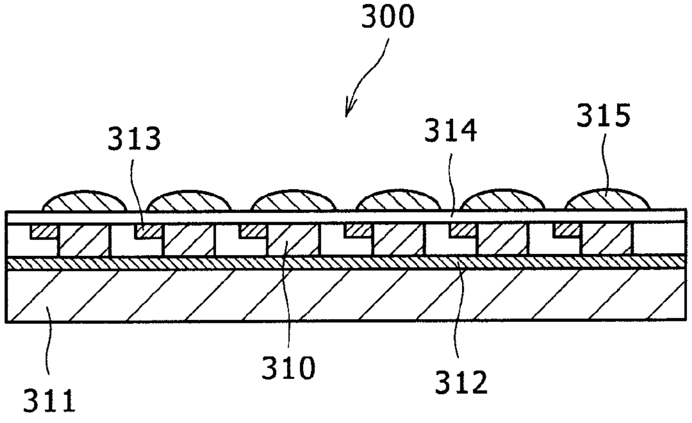
FIG. 14B is a cross-sectional diagram showing a model of a light emitting device panel employed in the image display apparatus.
Figure 15:
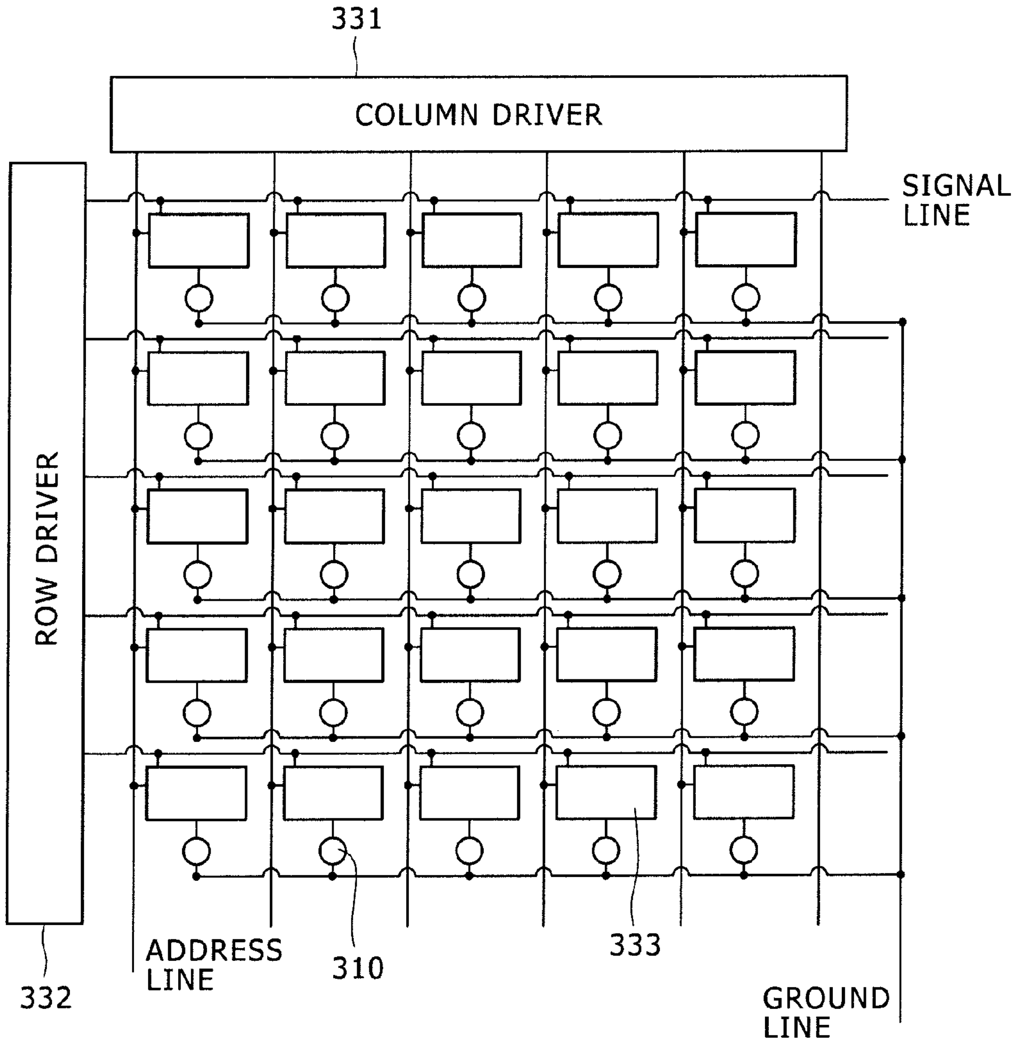
FIG. 15 is a diagram showing another equivalent circuit of the image display apparatus according to the fourth embodiment.
Figure 16:
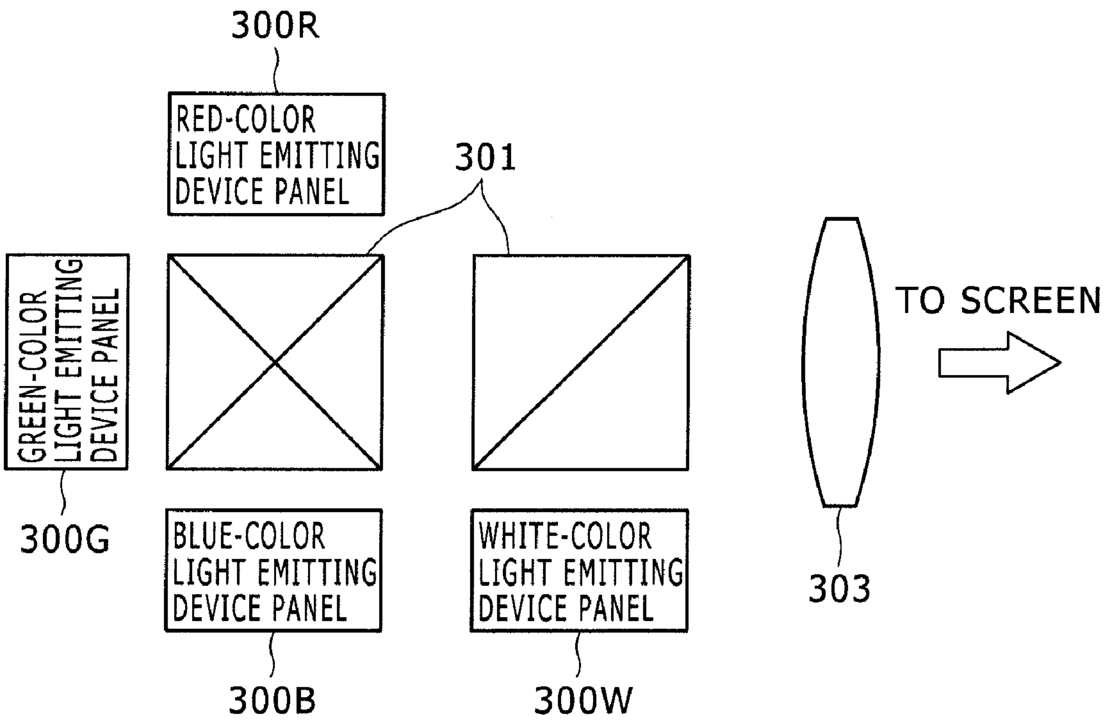
FIG. 16 is a conceptual diagram showing the image display apparatus according to the fourth embodiment.

FIG. 14A is a diagram showing an equivalent circuit of the image display apparatus according to the fourth embodiment whereas FIG. 14B is a cross-sectional diagram showing a model of a light emitting device panel employed in the image display apparatus. FIG. 15 is a diagram showing another equivalent circuit of the image display apparatus according to the fourth embodiment whereas FIG. 16 is a conceptual diagram showing the image display apparatus according to the fourth embodiment.

The fourth embodiment implements a color image display apparatus of the passive-matrix or active-matrix type and the direct-view or projection type. As shown in the conceptual diagram of FIG. 16, the image display apparatus according to the fourth embodiment employs:

(i): a red-light emitting device panel 300R having light emitting devices laid out to form a two-dimensional matrix and each used as a device for emitting light of the red color;

(ii): a green-light emitting device panel 300G having light emitting devices laid out to form a two-dimensional matrix and each used as a device for emitting light of the green color;

(iii): a blue-light emitting device panel 300B having light emitting devices laid out to form a two-dimensional matrix and each used as a device for emitting light of the blue color;

(iv): a white-light emitting device panel 300W having light emitting devices laid out to form a two-dimensional matrix and each used as a device for emitting light of the white color; and (v): dichroic prisms 301 serving as a synthesis section configured to combine the red-color light emitted by the red-light emitting device panel 300R, the green-color light emitted by the green-light emitting device panel 300G, the blue-color light emitted by the blue-light emitting device panel 300B and the white-color light emitted by the white-light emitting device panel 300W into a single light ray propagating along one optical path.

The light emitting device cited above and to be mentioned hereafter as a device for emitting light of the red color is typically an AlGaInP-based semiconductor light emitting device or a GaN-based semiconductor light emitting device. In the following description, the light emitting device for emitting light of the red color is also referred to as a red-color light emitting device. The red-light emitting device panel 300R cited above and to be mentioned hereafter is also referred to a first image display panel.

By the same token, the light emitting device cited above and to be mentioned hereafter as a device for emitting light of the green color is typically a GaN-based semiconductor light emitting device. In the following description, the light emitting device for emitting light of the green color is also referred to as a green-color light emitting device. The green-light emitting device panel 300G cited above and to be mentioned hereafter is also referred to a second image display panel.

In the same way, the light emitting device cited above and to be mentioned hereafter as a device for emitting light of the blue color is typically a GaN-based semiconductor light emitting device. In the following description, the light emitting device for emitting light of the blue color is also referred to as a blue-color light emitting device. The blue-light emitting device panel 300B cited above and to be mentioned hereafter is also referred to a third image display panel.

Likewise, in the following description, the light emitting device for emitting light of the white color is also referred to as a white-color light emitting device. The white-light emitting device panel 300W cited above and to be mentioned hereafter is also referred to a fourth image display panel.

As is obvious from the above description, the synthesis section cited above and to be mentioned hereafter employs the dichroic prisms 301.

The image display apparatus controls the light emission and no-light emission states of each of the red-color light emitting device, the green-color light emitting device, the blue-color light emitting device and the white-color light emitting device. A white-color light emitting diode can be employed as the white-color light emitting device. A typical example of the white-color light emitting diode is a diode obtained by combining an ultraviolet-light emitting diode or a blue-light emitting diode with a light emitting particle. In the following description, it is assumed that such a white-color light emitting diode is employed as the white-color light emitting device.

FIG. 14A is a diagram showing a circuit including a light emitting device panel 300 of the passive-matrix type. FIG. 14B is a cross-sectional diagram showing a model of the light emitting device panel 300 including light emitting devices 310 laid out to form a two-dimensional matrix. A specific one of the electrodes of every light emitting device 310 is connected to a column driver 331 whereas the other one of the electrodes of every light emitting device 310 is connected to a row driver 332. If the specific electrode of the light emitting device 310 is the p-side electrode of the light emitting device 310, the other electrode of the light emitting device 310 is the n-side electrode of the light emitting device 310. If the specific electrode of the light emitting device 310 is the n-side electrode of the light emitting device 310, on the other hand, the other electrode of the light emitting device 310 is the p-side electrode of the light emitting device 310. Typically, the row driver 332 controls the light emission and no-light emission states of each of the light emitting devices 310 whereas the column driver 331 supplies a driving current to every light emitting device 310 as a current for driving the light emitting device 310.

The light emitting device panel 300 includes a support body 311, a light emitting device 310, an X-direction line 312, a Y-direction line 313, a transparent base material 314 and a micro-lens 315. The support body 311 is a printed circuit board. The light emitting device 310 is attached to the support body 311. The X-direction line 312 is created on the support body 311, electrically connected to a specific one of the electrodes of the light emitting device 310 and electrically connected to the column driver 331 or the row driver 332. The Y-direction line 313 is electrically connected to the one of the electrodes of the light emitting device 310 and electrically connected to the row driver 332 or the column driver 331. If the specific electrode of the light emitting device 310 is the p-side electrode of the light emitting device 310, the other electrode of the light emitting device 310 is the n-side electrode of the light emitting device 310. If the specific electrode of the light emitting device 310 is the n-side electrode of the light emitting device 310, on the other hand, the other electrode of the light emitting device 310 is the p-side electrode of the light emitting device 310. If the X-direction line 312 is electrically connected to the column driver 331, the Y-direction line 313 is connected to the row driver 332. If the X-direction line 312 is electrically connected to the row driver 332, on the other hand, the Y-direction line 313 is connected to the column driver 331. The transparent base material 314 is a base material for covering the light emitting device 310. The micro-lens 315 is provided on the transparent base material 314. However, the light emitting device panel 300 is by no means limited to this configuration.

By the same token, the light emitting device panel 200 includes a support body 211, a light emitting device 210, an X-direction line 212, a Y-direction line 213, a transparent base material 214 and a micro-lens 215. The support body 211 is a printed circuit board. The light emitting device 210 is attached to the support body 211. The X-direction line 212 is created on the support body 211, electrically connected to a specific one of the electrodes of the light emitting device 210 and electrically connected to the column driver 231 or the row driver 232. The Y-direction line 213 is electrically connected to the one of the electrodes of the light emitting device 210 and electrically connected to the row driver 232 or the column driver 231. If the specific electrode of the light emitting device 210 is the p-side electrode of the light emitting device 210, the other electrode of the light emitting device 210 is the n-side electrode of the light emitting device 210. If the specific electrode of the light emitting device 210 is the n-side electrode of the light emitting device 210, on the other hand, the other electrode of the light emitting device 210 is the p-side electrode of the light emitting device 210. If the X-direction line 212 is electrically connected to the column driver 231, the Y-direction line 213 is connected to the row driver 232. If the X-direction line 212 is electrically connected to the row driver 232, on the other hand, the Y-direction line 213 is connected to the column driver 231. The transparent base material 214 is a base material for covering the light emitting device 210. The micro-lens 215 is provided on the transparent base material 214. However, the light emitting device panel 200 is by no means limited to this configuration.

FIG. 15 is a diagram showing a circuit including a light emitting device panel employed in the image display apparatus of the active-matrix type and the direct-view type. A specific one of the electrodes of every light emitting device 310 is connected to a driver 333 which is connected to a column driver 331 and a row driver 332 whereas the other one of the electrodes of every light emitting device 310 is connected to ground. If the specific electrode of the light emitting device 310 is the p-side electrode of the light emitting device 310, the other electrode of the light emitting device 310 is the n-side electrode of the light emitting device 310. If the specific electrode of the light emitting device 310 is the n-side electrode of the light emitting device 310, on the other hand, the other electrode of the light emitting device 310 is the p-side electrode of the light emitting device 310.

The driver 333 controls the light emission and no-light emission states of each of the light emitting devices 310 as follows. The row driver 332 controls the driver 333 to select a light emitting device 310 whereas the column driver 331 supplies a signal to the driver 333 to serve as a signal for driving the light emitting device 310.

As shown in the diagram of FIG. 16, in the image display apparatus of the direct-view type, red-color light emitted by the red-light emitting device panel 300R, green-color light emitted by the green-light emitting device panel 300G, blue-color light emitted by the blue-light emitting device panel 300B and white-color light emitted by the white-light emitting device panel 300W are supplied to dichroic prisms 301 which combine the red-color light, the green-color light, the blue-color light and the white-color light into a single light ray propagating along one optical path. The resulting image is directly viewed by an observer without making use of a projection lens 303. In the image display apparatus of the projection type, on the other hand, the resulting image is projected on a screen by way of the projection lens 303.

The (P×Q) light emitting devices composing each of the light emitting device panels 300R, 300G, 300B and 300W are controlled respectively on the basis of output signals $X_{1\text{-}(p,q)}$, $X_{2\text{-}(p,q)}$, $X_{3\text{-}(p,q)}$ and $X_{4\text{-}(p,q)}$ which are obtained by carrying out the extension process described above. The light emission and no-light emission states of each of the (P×Q) light emitting devices composing each of the light emitting device panels 300R, 300G, 300B and 300W are controlled on a time-division basis. In the following description, it is assumed that the (P×Q) light emitting devices as well as their light emission and no-light emission states are controlled in the same way.

Figure 17A:
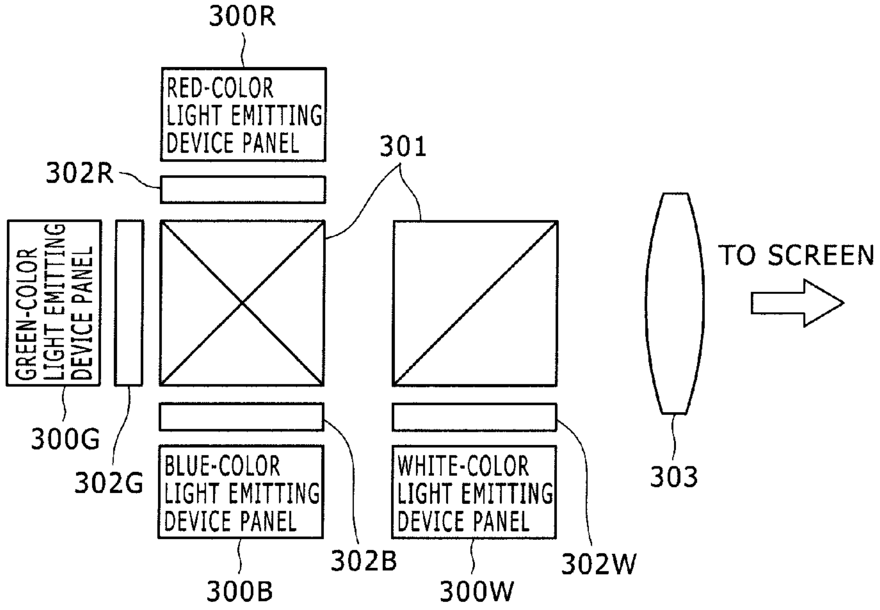
FIGS. 17A and 17B are each a conceptual diagram showing another image display apparatus according to the fourth embodiment.

As an alternative, as shown in a conceptual diagram of FIG. 17A, the image display apparatus is also a color image display apparatus of the direct-view or projection type. The color image display apparatus employs:

(i): a red-light emitting device panel 300R including light emitting devices each used for emitting light of the red color and laid out to form a two-dimensional matrix as well as a red-light transmission control apparatus 302R for controlling transmissions and no-transmissions of the red-color light emitted by the red-light emitting device panel 300R;

(ii): a green-light emitting device panel 300G including light emitting devices each used for emitting light of the green color and laid out to form a two-dimensional matrix as well as a green-light transmission control apparatus 302G for controlling transmissions and no-transmissions of the green-color light emitted by the green-light emitting device panel 300G;

(iii): a blue-light emitting device panel 300B including light emitting devices each used for emitting light of the blue color and laid out to form a two-dimensional matrix as well as a blue-light transmission control apparatus 302B for controlling transmissions and no-transmissions of the blue-color light emitted by the blue-light emitting device panel 300B;

(iv): a white-light emitting device panel 300W including light emitting devices each used for emitting light of the white color and laid out to form a two-dimensional matrix as well as a white-light transmission control apparatus 302W for controlling transmissions and no-transmissions of the white-color light emitted by the white-light emitting device panel 300W; and (v): dichroic prisms 301 serving as a synthesis section configured to combine the red-color light emitted by the red-light emitting device panel 300R and then passed on by the red-light transmission control apparatus 302R, the green-color light emitted by the green-light emitting device panel 300G and then passed on by the green-light transmission control apparatus 302G, the blue-color light emitted by the blue-light emitting device panel 300B and then passed on by the blue-light transmission control apparatus 302B as well as the white-color light emitted by the white-light emitting device panel 300W and then passed on by the white-light transmission control apparatus 302W into a single light ray propagating along one optical path.

The red-light transmission control apparatus 302R cited above and to be mentioned hereafter is also referred to as a first image display panel having light bulbs or, to put it more concretely, the red-light transmission control apparatus 302R is typically a liquid-crystal display apparatus employing thin-film transistors of the high-temperature poly-silicon type.

By the same token, the green-light transmission control apparatus 302G cited above and to be mentioned hereafter is also referred to as a second image display panel having light bulbs or, to put it more concretely, the green-light transmission control apparatus 302G is typically a liquid-crystal display apparatus employing thin-film transistors of the high-temperature poly-silicon type.

Likewise, the blue-light transmission control apparatus 302B cited above and to be mentioned hereafter is also referred to as a third image display panel having light bulbs or, to put it more concretely, the blue-light transmission control apparatus 302B is typically a liquid-crystal display apparatus employing thin-film transistors of the high-temperature poly-silicon type.

Similarly, the white-light transmission control apparatus 302W cited above and to be mentioned hereafter is also referred to as a fourth image display panel having light bulbs or, to put it more concretely, the white-light transmission control apparatus 302W is typically a liquid-crystal display apparatus employing thin-film transistors of the high-temperature poly-silicon type.

As is obvious from the above description, the synthesis section cited above and to be mentioned hereafter employs the dichroic prisms 301.

As described above, the red-light transmission control apparatus 302R controls transmissions and no-transmissions of the red-color light emitted by the red-light emitting device panel 300R serving as an image display panel, the green-light transmission control apparatus 302G controls transmissions and no-transmissions of the green-color light emitted by the green-light emitting device panel 300G serving as an image display panel, the blue-light transmission control apparatus 302B controls transmissions and no-transmissions of the blue-color light emitted by the blue-light emitting device panel 300B serving as an image display panel and the white-light transmission control apparatus 302W controls transmissions and no-transmissions of the white-color light emitted by the white-light emitting device panel 300W serving as an image display panel. As a result, an image is displayed.

As explained earlier, the red-light transmission control apparatus 302R controls transmissions and no-transmissions of the red-color light emitted by the red-light emitting device panel 300R serving as an image display panel, the green-light transmission control apparatus 302G controls transmissions and no-transmissions of the green-color light emitted by the green-light emitting device panel 300G serving as an image display panel, the blue-light transmission control apparatus 302B controls transmissions and no-transmissions of the blue-color light emitted by the blue-light emitting device panel 300B serving as an image display panel and the white-light transmission control apparatus 302W controls transmissions and no-transmissions of the white-color light emitted by the white-light emitting device panel 300W serving as an image display panel. Then, the red-color light passing through the red-light transmission control apparatus 302R, the green-color light passing through the green-light transmission control apparatus 302G, the blue-color light passing through the blue-light transmission control apparatus 302B and the white-color light passing through the white-light transmission control apparatus 302W are supplied to the dichroic prisms 301 which serve as a synthesis section. Finally, the dichroic prisms 301 serving as a synthesis section combine the red-color light passing through the red-light transmission control apparatus 302R, the green-color light passing through the green-light transmission control apparatus 302G, the blue-color light passing through the blue-light transmission control apparatus 302B and the white-color light passing through the white-light transmission control apparatus 302W into a single light ray propagating along one optical path in order to display an image. In the image display apparatus of the direct-view type, the displayed image is directly viewed by an observer without making use of the projection lens 303. In the image display apparatus of the projection type, on the other hand, the resulting image is projected on a screen by way of the projection lens 303.

Figure 17B:
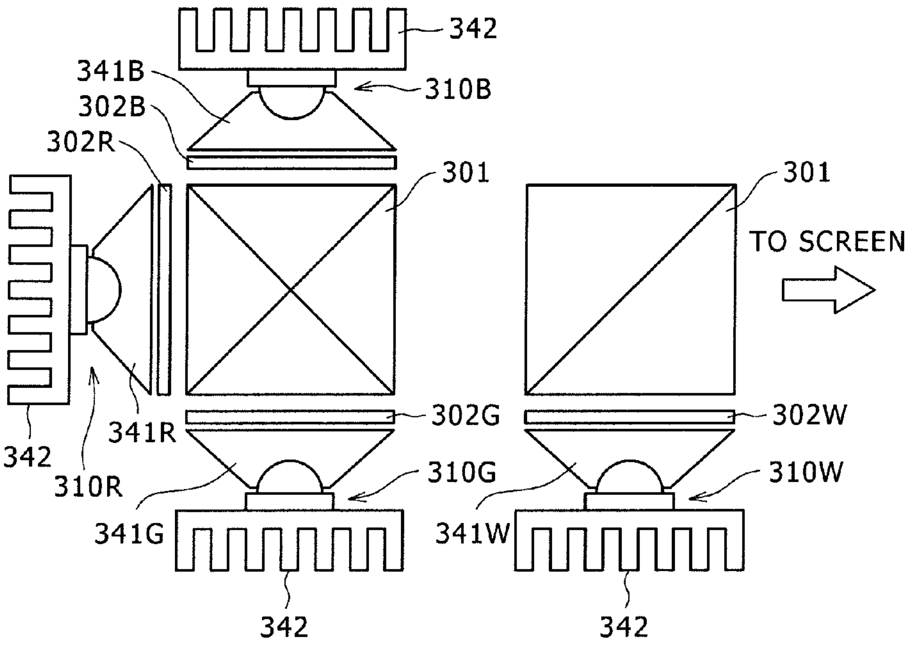

As another alternative, a conceptual diagram of FIG. 17B shows an image display apparatus which is also a color image display apparatus of the direct-view or projection type. The color image display apparatus employs:

(i): a red-light emitting device 310R for emitting light of the red color and a red-light transmission control apparatus 302R for controlling transmissions and no-transmissions of the red-color light emitted by the red-light emitting device 310R;

(ii): a green-light emitting device 310G for emitting light of the green color and a green-light transmission control apparatus 302G for controlling transmissions and no-transmissions of the green-color light emitted by the green-light emitting device 310G;

(iii): a blue-light emitting device 310B for emitting light of the blue color and a blue-light transmission control apparatus 302B for controlling transmissions and no-transmissions of the blue-color light emitted by the blue-light emitting device 310B;

(iv): a white-light emitting device 310W for emitting light of the white color and a white-light transmission control apparatus 302W for controlling transmissions and no-transmissions of the white-color light emitted by the white-light emitting device 310W; and (v): dichroic prisms 301 serving as a synthesis section configured to combine the red-color light emitted by the red-light emitting device 310R, the green-color light emitted by the green-light emitting device 310G, the blue-color light emitted by the blue-light emitting device 310B and white-color light emitted by the white-light emitting device 310W into a single light ray propagating along one optical path.

The red-light transmission control apparatus 302R cited above and to be mentioned hereafter is also referred to as a first image display panel having light bulbs or, to put it more concretely, the red-light transmission control apparatus 302R is typically a liquid-crystal display apparatus.

By the same token, the green-light transmission control apparatus 302G cited above and to be mentioned hereafter is also referred to as a second image display panel having light bulbs or, to put it more concretely, the green-light transmission control apparatus 302G is typically a liquid-crystal display apparatus.

Likewise, the blue-light transmission control apparatus 302B cited above and to be mentioned hereafter is also referred to as a third image display panel having light bulbs or, to put it more concretely, the blue-light transmission control apparatus 302B is typically a liquid-crystal display apparatus.

Similarly, the white-light transmission control apparatus 302W cited above and to be mentioned hereafter is also referred to as a fourth image display panel having light bulbs or, to put it more concretely, the white-light transmission control apparatus 302W is typically a liquid-crystal display apparatus.

As is obvious from the above description, the synthesis section cited above and to be mentioned hereafter employs the dichroic prisms 301.

As described above, the red-light transmission control apparatus 302R controls transmissions and no-transmissions of the red-color light emitted by the red-light emitting device 310R, the green-light transmission control apparatus 302G controls transmissions and no-transmissions of the green-color light emitted by the green-light emitting device 310G, the blue-light transmission control apparatus 302B controls transmissions and no-transmissions of the blue-color light emitted by the blue-light emitting device 310B and the white-light transmission control apparatus 302W controls transmissions and no-transmissions of the white-color light emitted by the white-light emitting device 310W. As a result, an image is displayed.

The number of light emitting devices is determined on the basis of specifications desired of the image display apparatus. The number of light emitting devices can be any integer ranging from 1 to any integer greater than 1. In the typical image display apparatus shown in the conceptual diagram of FIG. 17B, the number of light emitting devices is 1. The light emitting device is the red-light emitting device 310R, the green-light emitting device 310G, the blue-light emitting device 310B or the white-light emitting device 310W. Each of the red-light emitting device 310R, the green-light emitting device 310G, the blue-light emitting device 310B or the white-light emitting device 310W is mounted on a heat sink 342. The red-color light emitted by the red-light emitting device 310R is guided by a red-light guiding member 341R to a red-light transmission control apparatus 302R serving as an image display panel whereas the green-color light emitted by the green-light emitting device 310G is guided by a green-light guiding member 341G to a green-light transmission control apparatus 302G serving as an image display panel. By the same token, the blue-color light emitted by the blue-light emitting device 310B is guided by a blue-light guiding member 341B to a blue-light transmission control apparatus 302B serving as an image display panel whereas the white-color light emitted by the white-light emitting device 310W is guided by a white-light guiding member 341W to a white-light transmission control apparatus 302W serving as an image display panel. Each of the red-light guiding member 341R, the green-light guiding member 341G, the blue-light guiding member 341B and the white-light guiding member 341W is typically an optical guidance member or a light reflection member such as a mirror. The optical guidance member is typically made of a photic material such as the silicon resin, the epoxy resin or the polycarbonate resin.

Fifth Embodiment

A fifth embodiment of the present invention implements an image display apparatus according to the third form of the present invention and a method for driving the image display apparatus.

An image display apparatus according to the fifth embodiment is a field sequential system image display apparatus employing:

(A): an image display panel having a two-dimensional matrix with (P×Q) pixels; and (B): a signal processing section 20 for receiving a first input signal provided with a signal value of $x_{1-(p,\ q)}$, a second input signal provided with a signal value of $x_{2-(p,\ q)}$ and a third input signal provided with a signal value of $x_{3-(p,\ q)}$ and for outputting a first output signal provided with a signal value of $X_{1-(p,\ q)}$ and used for determining the display gradation of the first elementary color, a second output signal provided with a signal value of $X_{2-(p,\ q)}$ and used for determining the display gradation of the second elementary color, a third output signal provided with a signal value of $X_{3-(p,\ q)}$ and used for determining the display gradation of the third elementary color as well as a fourth output signal provided with a signal value of $X_{4-(p,\ q)}$ and used for determining the display gradation of the fourth color with regard to a (p, q)th pixel where notations p and q are integers satisfying the equations $1 \leqq p \leqq P$ and $1 \leqq q \leqq Q$.

In addition, in the image display apparatus according to the fifth embodiment, a maximum lightness value $V_{max}(S)$ expressed as a function of variable saturation S in an HSV color space enlarged by adding the fourth color is stored in the signal processing section. On top of that, the signal processing section also carries out the following processes of:

(B-1): finding the saturation S and the lightness value V(S) for each of a plurality of pixels on the basis of the signal values of first, second and third input signals in the pixels;

(B-2): finding an extension coefficient $\alpha_0$ on the basis of at least one of ratios $V_{max}(S)/V(S)$ found in the pixels;

(B-3): finding the output signal value $X_{4-(p,\ q)}$ in the (p, q)th pixel on the basis of at least the input signal values $x_{1-(p,\ q)}$, $x_{2-(p,\ q)}$ and $x_{3-(p,\ q)}$; and (B-4) finding the output signal value $X_{1-(p,\ q)}$ in the (p, q)th pixel on the basis of the input signal value $x_{1-(p,\ q)}$, the extension coefficient $\alpha_0$ and the output signal value $X_{4-(p,\ q)}$, finding the output signal value $X_{2-(p,\ q)}$ in the (p, q)th pixel on the basis of the input signal value $x_{2-(p,\ q)}$, the extension coefficient $\alpha_0$ and the output signal value $X_{4-(p,\ q)}$ and finding the output signal value $X_{3-(p,\ q)}$ in the (p, q)th pixel on the basis of the input signal value $X_{3-(p,\ q)}$, the extension coefficient $\alpha_0$ and the output signal value $X_{4-(p,\ q)}$.

In addition, in accordance with the method for driving the image display apparatus according to the fifth embodiment, a maximum lightness value $V_{max}(S)$ expressed as a function of variable saturation S in an HSV color space enlarged by adding the fourth color is stored in the signal processing section. The signal processing section also carries out the following steps of:

(a): finding the saturation S and the lightness value V(S) for each of a plurality of pixels on the basis of the signal values of first, second and third input signals in the pixels;

(b): finding an extension coefficient $\alpha_0$ on the basis of at least one of ratios $V_{max}(S)/V(S)$ found in the pixels;

(c): finding the output signal value $X_{4-(p,\ q)}$ in the (p, q)th pixel on the basis of at least the input signal values $x_{1-(p,\ q)}$, $x_{2-(p,\ q)}$ and $x_{3-(p,\ q)}$; and (d): finding the output signal value $X_{1-(p,\ q)}$ in the (p, q)th pixel on the basis of the input signal value $x_{1-(p,\ q)}$, the extension coefficient $\alpha_0$ and the output signal value $X_{4-(p,\ q)}$, finding the output signal value $X_{2-(p,\ q)}$ in the (p, q)th pixel on the basis of the input signal value $x_{2-(p,\ q)}$, the extension coefficient $\alpha_0$ and the output signal value $X_{4-(p,\ q)}$ and finding the output signal value $X_{3-(p,\ q)}$ in the (p, q)th pixel on the basis of the input signal value $x_{3-(p,\ q)}$, the extension coefficient $\alpha_0$ and the output signal value $X_{4-(p,\ q)}$.

To put it more concretely, in the case of the fifth embodiment, the extension process carried out on each pixel in the first embodiment is performed on every set of first, second and third input signals.

Figure 18A:
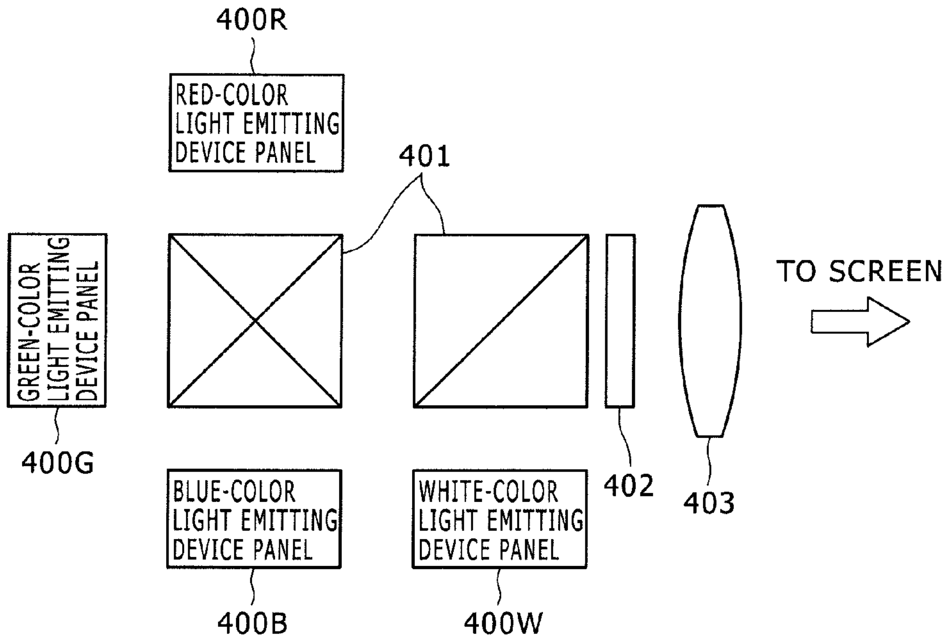
FIGS. 18A and 18B are each a conceptual diagram showing an image display apparatus according to a fifth embodiment of the present invention.

The fifth embodiment implements an image display apparatus described as follows. FIG. 18A is a conceptual diagram showing an image display apparatus according to the fifth embodiment. The image display apparatus according to the fifth embodiment is a color image display apparatus adopting a field sequential system. This image display apparatus can be an apparatus of the direct-view or projection type. As shown in the conceptual diagram of FIG. 18A, the image display apparatus according to the fifth embodiment employs:

(i): a red-light emitting device panel 400R having light emitting devices laid out to form a two-dimensional matrix and each used as a device for emitting light of the red color (the panel corresponds to a light source for emitting first elementary color light);

(ii): a green-light emitting device panel 400G having light emitting devices laid out to form a two-dimensional matrix and each used as a device for emitting light of the green color (the panel corresponds to a light source for emitting second elementary color light);

(iii): a blue-light emitting device panel 400B having light emitting devices laid out to form a two-dimensional matrix and each used as a device for emitting light of the blue color (the panel corresponds to a light source for emitting third elementary color light);

(iv): a white-light emitting device panel 400W having light emitting devices laid out to form a two-dimensional matrix and each used as a device for emitting light of the white color (the panel corresponds to a light source for emitting fourth color light);

(v): dichroic prisms 401 serving as a synthesis section configured to combine the red-color light emitted by the red-light emitting device panel 400R, the green-color light emitted by the green-light emitting device panel 400G, the blue-color light emitted by the blue-light emitting device panel 400B and the white-color light emitted by the white-light emitting device panel 400W into a single light ray propagating along one optical path; and (vi): a light-transmission control apparatus 402 for controlling the transmission and non-transmission of the light emitted by the synthesis section (dichroic prisms 401).

The light emitting device cited above and to be mentioned hereafter as a device for emitting light of the red color is typically an AlGaInP-based semiconductor light emitting device or a GaN-based semiconductor light emitting device. The red-light emitting device panel 400R cited above and to be mentioned hereafter is also referred to a first image display panel.

By the same token, the light emitting device cited above and to be mentioned hereafter as a device for emitting light of the green color is typically a GaN-based semiconductor light emitting device. The green-light emitting device panel 400G cited above and to be mentioned hereafter is also referred to a second image display panel.

In the same way, the light emitting device cited above and to be mentioned hereafter as a device for emitting light of the blue color is typically a GaN-based semiconductor light emitting device. The blue-light emitting device panel 400B cited above and to be mentioned hereafter is also referred to a third image display panel.

Likewise, the light emitting device cited above and to be mentioned hereafter as a device for emitting light of the white color is typically a GaN-based semiconductor light emitting device. The white-light emitting device panel 400W cited above and to be mentioned hereafter is also referred to a fourth image display panel.

The light-transmission control apparatus 402 is an image display panel or a liquid-crystal display apparatus composed of light bulbs and, to put it more concretely, provided with thin-film transistors of a high-temperature silicon type. The technical term 'light-transmission control apparatus used in the following description means the same thing.

The light-transmission control apparatus 402 controls the transmission and non-transmission of the red-color light emitted by the red-light emitting device panel 400R, the transmission and non-transmission of the green-color light emitted by the green-light emitting device panel 400G, the transmission and non-transmission of the blue-color light emitted by the blue-light emitting device panel 400B and the transmission and non-transmission of the white-color light emitted by the white-light emitting device panel 400W in order to generate an image to be displayed.

It is to be noted that, as described above, the light-transmission control apparatus 402 corresponds to an image display panel. The light-transmission control apparatus 402 controls the transmission and non-transmission of the lights by making use of the output signal values $X_{1-(p,\ q)}$, $X_{2-(p,\ q)}$, $X_{3-(p,\ q)}$ and $X_{4-(p,\ q)}$ which have been obtained as a result of the execution of the same extension process as the first embodiment. Then, by driving the image display apparatus on the basis of the output signal values $X_{1-(s,\ t)}$, $X_{2-(s,\ t)}$, $X_{3-(s,\ t)}$ and $X_{4-(s,\ t)}$ which have been obtained as a result of the extension process, the luminance of the entire image display apparatus can be increased by a multiplication factor equal to the extension coefficient $\alpha_0$. As an alternative, by multiplying the luminance of light emitted by each of the red-light emitting device panel 400R, the green-light emitting device panel 400G, the blue-light emitting device panel 400B and the white-light emitting device panel 400W by $1/\alpha_0$ on the basis of the output signal values $X_{1(s,\ t)}$, $X_{2-(s,\ t)}$, $X_{3-(s,\ t)}$ and $X_{4-(s,\ t)}$, the power consumption of the entire image display apparatus can be decreased without deteriorating the quality of the displayed image.

The lights emitted by each of the red-light emitting device panel 400R, the green-light emitting device panel 400G, the blue-light emitting device panel 400B and the white-light emitting device panel 400W which each include light emitting devices 410 laid out to from a two-dimensional matrix are supplied to the dichroic prisms 401 which eventually combine these lights into a single light ray propagating along one optical path. Then, the transmission and non-transmission of the light ray radiated by the dichroic prisms 401 is controlled by the light-transmission control apparatus 402 in order to display an image. In the image display apparatus of the direct-view type, the displayed image is directly viewed by an observer. In the image display apparatus of the projection type, on the other hand, the resulting image is projected on a screen by way of the projection lens 403. The configuration and structure of each of the red-light emitting device panel 400R, the green-light emitting device panel 400G, the blue-light emitting device panel 400B and the white-light emitting device panel 400W can be designed into a configuration and a structure which are identical respectively with the configuration and structure of the light emitting device panels 300 employed in the fourth embodiment.

Figure 18B:
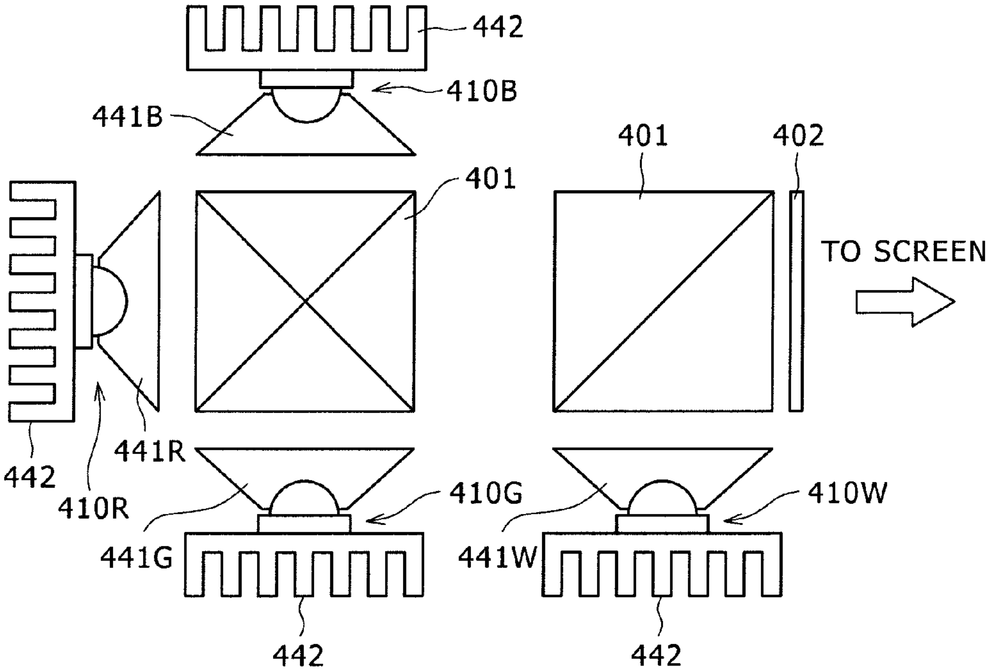

As another alternative, a conceptual diagram of FIG. 18B shows an image display apparatus adopting the field sequential system. The image display apparatus shown in the conceptual diagram of FIG. 18B as an image display apparatus adopting the field sequential system is also a color image display apparatus of the direct-view or projection type. The color image display apparatus employs:

(i): a red-light emitting device 410R serving as a device for emitting light of the red color and corresponding to a light source for emitting first elementary color light;

(ii): a green-light emitting device 410G serving as a device for emitting light of the green color and corresponding to a light source for emitting second elementary color light;

(iii): a blue-light emitting device 410B serving as a device for emitting light of the blue color and corresponding to a light source for emitting third elementary color light;

(iv): a white-light emitting device 410W serving as a device for emitting light of the white color and corresponding to a light source for emitting fourth color light;

(v): dichroic prisms 401 serving as a synthesis section configured to combine the red-color light emitted by the red-light emitting device 410R, the green-color light emitted by the green-light emitting device 410G, the blue-color light emitted by the blue-light emitting device 410B and the white-color light emitted by the white-light emitting device 410W into a single light ray propagating along one optical path; and (vi): a light-transmission control apparatus 402 for controlling the transmission and non-transmission of the light emitted by the dichroic prisms 401 which is the synthesis section configured to combine the lights into a single light ray propagating along one optical path.

The light-transmission control apparatus 402 cited above and to be mentioned hereafter is also referred to as an image display panel having light bulbs.

As described above, the light-transmission control apparatus 402 controls the transmission and non-transmission of the light supplied form the light emitting devices. As a result, an image is displayed.

The number of light emitting devices is determined on the basis of specifications required of the image display apparatus. The number of light emitting devices can be any integer ranging from 1 to any integer greater than 1. In the typical image display apparatus shown in the conceptual diagram of FIG. 18B, the number of light emitting devices 410R, 410G, 410B or 410W is 1. Each of the light emitting devices 410R, 410G, 410B or 410W is mounted on a heat sink 442. The red-color light emitted by the red-light emitting device 410R is guided by a red-light guiding member 441R to the dichroic prisms 401 whereas the green-color light emitted by the green-light emitting device 410G is guided by a green-light guiding member 441G to the dichroic prisms 401. By the same token, the blue-color light emitted by the blue-light emitting device 410B is guided by a blue-light guiding member 441B to the dichroic prisms 401 whereas the white-color light emitted by the white-light emitting device 410W is guided by a white-light guiding member 441W to the dichroic prisms 401. The red-light guiding member 441R, the green-light guiding member 441G, the blue-light guiding member 441B and the white-light guiding member 441W are the same as those used in the fourth embodiment.

The present invention has been exemplified by making use of preferred embodiments as examples. However, implementations of the present invention are by no means limited to these embodiments which implement a color liquid-crystal display apparatus assembly, a color liquid-crystal display apparatus, a planar light-source apparatus, a planar light-source unit and driving circuits. The configuration and structure of each of the preferred embodiments are merely typical. In addition, members employed in the embodiments and materials for making the members are also typical as well. That is to say, the configurations, the structures, the members and the materials can be properly changed.

In the embodiments, all the (P×Q) pixels (or all the (P×Q) sets each having first, second and third sub-pixels) are used as a plurality of pixels (or a plurality of sets each having first, second and third sub-pixels) for finding the saturation S and the lightness value V(S). However, implementations of the present invention are by no means limited to such embodiments. For example, every pixel (or every set having first, second and third sub-pixels) to be used in the process of finding the saturation S and the lightness value V(S) can be selected from four or eight pixels (or four or eight sets each having first, second and third sub-pixels).

In the case of the first embodiment, the extension coefficient $\alpha_0$ is found on the basis of, among other information, the values of the first sub-pixel input signal, the second sub-pixel input signal and the third sub-pixel input signal. As an alternative, however, the extension coefficient $\alpha_0$ can also be found on the basis of the value of one input signal selected from the first sub-pixel input signal, the second sub-pixel input signal and the third sub-pixel input signal (or on the basis of one input signal selected from sub-pixel input signals in a set of first, second and third sub-pixels or on the basis of one input signal selected from the first input signal, the second input signal and the third input signal). To put it more concretely, the input signal value $x_{2-(p,q)}$ for the green color is used as the value of the selected input signal for finding the extension coefficient $\alpha_0$. Also in the case of this alternative, the extension coefficient $\alpha_0$ is then used for finding the output signal values $X_{4-(p,q)}$, $X_{1-(p,q)}$, $X_{2-(p,q)}$ and $X_{3-(p,q)}$ in the same way as the first embodiment. It is to be noted that, in this case, the saturation $S_{(p,q)}$ of Eq. (2-1) and the lightness value $V_{(p,q)}$ of Eq. (2-2) are not used. Instead, the value of 1 is used as the saturation $S_{(p,q)}$. That is to say, the input signal value $X_{2-(p,q)}$ is used as the value of $Max_{(p,q)}$ in Eq. (2-1) and the value of 0 is used as $Min_{(p,q)}$ in Eq. (2-1). On the other hand, the input signal value $x_{2-(p,q)}$ is used as the lightness value $V_{(p,q)}$. As another alternative, the extension coefficient $\alpha_0$ can also be found on the basis of the values of two different input signals selected from the first sub-pixel input signal, the second sub-pixel input signal and the third sub-pixel input signal (or on the basis of the values of two different input signals selected from sub-pixel input signals in a set of first, second and third sub-pixels or on the basis of the values of two different input signals selected from the first input signal, the second input signal and the third input signal). To put it more concretely, the input signal value $x_{1-(p,q)}$ for the red color and the input signal value $x_{2-(p,q)}$ for the green color are used as the values of the selected input signals for finding the extension coefficient $\alpha_0$. Also in the case of this other alternative, the extension coefficient $\alpha_0$ is then used for finding the output signal values $X_{4-(p,q)}$, $X_{1-(p,q)}$, $X_{2-(p,q)}$ and $X_{3-(p,q)}$ in the same way as the first embodiment. It is to be noted that, in this case, the saturation $S_{(p,q)}$ of Eq. (2-1) and the lightness value $V_{(p,q)}$ of Eq. (2-2) are not used. Instead, for $x_{1-(p,q)} \geqq x_{2-(p,q)}$, the saturation $S_{(p,q)}$ and the lightness value $V_{(p,q)}$ are found in accordance with the following equations:

$$S_{(p,q)}=(x_{1-(p,q)}-x_{2-(p,q)})/x_{1-(p,q)}$$

$$V_{(p,q)}=x_{1-(p,q)}$$

For $x_{1-(p,q)}<x_{2-(p,q)}$, on the other hand, the saturation $S_{(p,q)}$ and the lightness value $V_{(p,q)}$ are found in accordance with the following equations:

$$S_{(p,q)}=(x_{2-(p,q)}-x_{1-(p,q)})/x_{2-(p,q)}$$

$$V_{(p,q)}=x_{2-(p,q)}$$

In the case of an operation to display a single-color image on a color-image display apparatus for example, the extension processes described above are sufficient.

As a further alternative, in a range where the image observer is not capable of perceiving changes in image quality, an extension process can also be carried out. To put it more concretely, in the case of the yellow color with a high luminosity factor, a gradation collapse phenomenon becomes striking with ease. Thus, in an input signal having a particular hue such as the phase of the yellow color, it is desirable to carry out an extension process so that the output signal obtained as a result of the extension is assured not to exceed $V_{max}$. As a still further alternative, if the ratio of the input signal having a particular hue such as the phase of the yellow color to the entire input signal is low, the extension coefficient $\alpha_0$ can also be set at a value greater than the minimum value.

Figure 19:
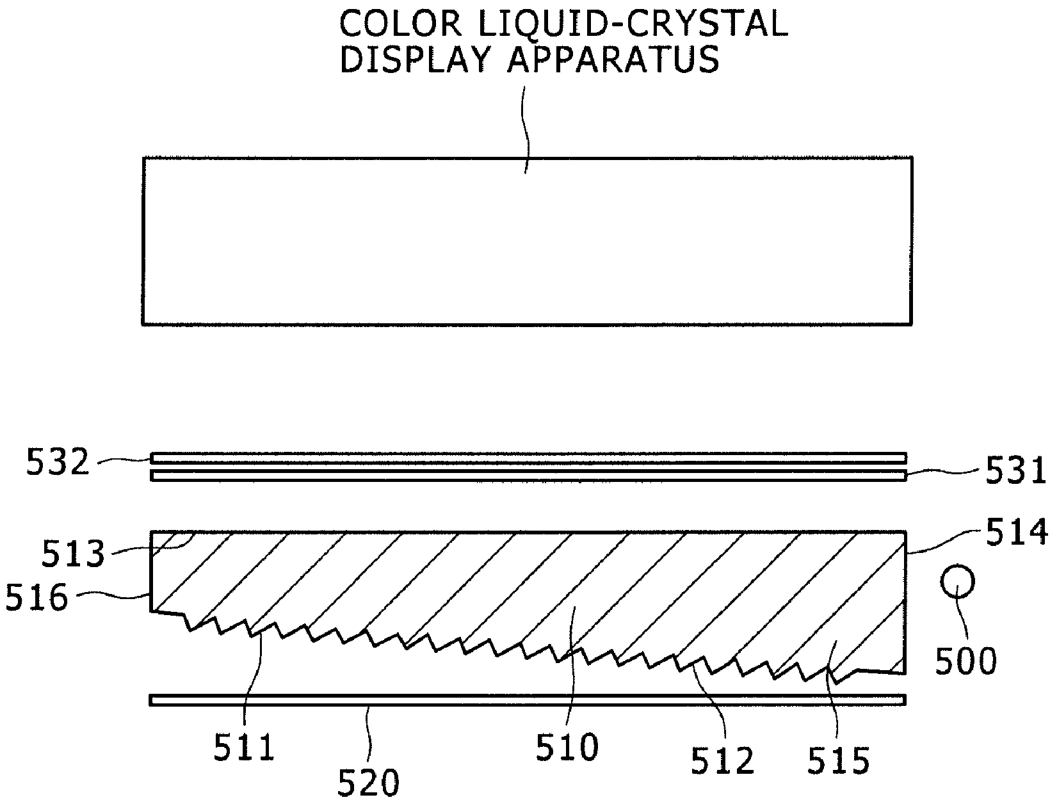
FIG. 19 is a conceptual diagram showing a planar light-source apparatus of an edge-light type (or a side-light type).

A planar light-source apparatus of the edge-light type (or the side-light type) can also be employed. FIG. 19 is a conceptual diagram showing a planar light-source apparatus of an edge-light type (or a side-light type). As shown in the conceptual diagram of FIG. 19, a light guiding plate 510 made of typically polycarbonate resin employs a first face (bottom face) 511, a second face (top face) 513 which faces the first face 511, a first side face 514, a second side face 515, a third side face 516 which faces the first side face 514 and a fourth side face which faces the second side face 515.

A typical example of a more concrete whole shape of the light guiding plate is a top-cut square conic shape resembling a wedge. In this case, the two mutually facing side faces of the top-cut square conic shape correspond to the first and second faces 511 and 513 respectively whereas the bottom face of the top-cut square conic shape corresponds to the first side face 514. In addition, it is desirable to provide the surface of the bottom face serving as the first face 511 with an unevenness portion 512 having protrusions and/or dents.

The cross-sectional shape of the contiguous protrusions (or contiguous dents) in the unevenness portion 512 for a case in which the light guiding plate 510 is cut over a virtual plane vertical to the first face 511 in the direction of light incident to the light guiding plate 510 is typically the shape of a triangle. That is to say, the shape of the unevenness portion 512 provided on the lower surface of the first face 511 is the shape of a prism.

On the other hand, the second face 513 of the light guiding plate 510 can be a smooth face. That is to say, the second face 513 of the light guiding plate 510 can be a mirror face or can be textured by blasting so that the face has a light diffusion effect. (That is, the face 513 can have a surface with an infinitesimal unevenness surface.)

In the planar light-source apparatus provided with the light guiding plate 510, it is desirable to provide a light reflection member 520 facing the first face 511 of the light guiding plate 510. In addition, an image display panel such as a color liquid-crystal display panel is placed to face the second face 513 of the light guiding plate 510. On top of that, a light diffusion sheet 531 and a prism sheet 532 are placed between this image display panel and the second face 513 of the light guiding plate 510.

First elementary color light is radiated by a light source 500 to the light guiding plate 510 by way of the first side face 514, which is typically a face corresponding to the bottom of the top-cut square conic shape, collides with the unevenness portion 512 of the first face 511 and is dispersed. The dispersed light leaves the first face 511 and is reflected by a light reflection member 520. The reflected light again arrives at the first face 511 and is radiated from the second face 513. The radiated light passes through the light diffusion sheet 531 and the prism sheet 532, illuminating the image display panel of the first embodiment.

As a light source, a fluorescent lamp (or a semiconductor laser) for radiating light of the blue color as the first elementary color light can also be used in place of the light emitting diode. In this case, the wavelength $\lambda_1$ of the first elementary color light radiated by the fluorescent lamp or the semiconductor laser as light corresponding to light of the blue color serving as the first elementary color is typically 450 nm. In addition, a green-color light emitting particle corresponding to a second elementary color light emitting particle excited by the fluorescent lamp or the semiconductor laser can typically be a green-color light emitting fluorescent particle made of $SrGa_2S_4$:Eu whereas a red-color light emitting particle corresponding to a third elementary color light emitting particle excited by the fluorescent lamp or the semiconductor laser can typically be a red-color light emitting fluorescent particle made of CaS:Eu.

As an alternative, if a semiconductor laser is used, the wavelength $\lambda_1$ of the first elementary color light radiated by the semiconductor laser as light corresponding to light of the blue color serving as the first elementary color is typically 457 nm. In this case, a green-color light emitting particle corresponding to a second elementary color light emitting particle excited by the semiconductor laser can typically be a green-color light emitting fluorescent particle made of $SrGa_2S_4$:Eu whereas a red-color light emitting particle corresponding to a third elementary color light emitting particle excited by the semiconductor laser can typically be a red-color light emitting fluorescent particle made of CaS:Eu.

As another alternative, as the light source of the planar light-source apparatus, a CCFL (Cold Cathode Fluorescent Lamp), an HCFL (Heated Cathode Fluorescent Lamp) or an EEFL (External Electrode Fluorescent Lamp) can also be used.

The present application contains subject matter related to that disclosed in Japanese Priority Patent Applications JP 2008-163100 filed in the Japan Patent Office on Jun. 23, 2008 and JP 2009-081605 filed in the Japan Patent Office on Mar. 30, 2009, the entire content of which is hereby incorporated by reference.

In addition, it should be understood by those skilled in the art that a variety of modifications, combinations, sub-combinations and alterations may occur, depending on design requirements and other factors insofar as they are within the scope of the appended claims or the equivalents thereof.

What is claimed is:

1. An image display apparatus comprising:

(A) an image display panel having a two-dimensional matrix with (P×Q) pixels each including a first sub-pixel for displaying a first elementary color, a second sub-pixel for displaying a second elementary color, a third sub-pixel for displaying a third elementary color and a fourth sub-pixel for displaying a fourth color; and (B) a signal processing section configured to receive
a first sub-pixel input signal provided with a signal value of $x_{1-(p, q)}$,
a second sub-pixel input signal provided with a signal value of $x_{2-(p, q)}$ and
a third sub-pixel input signal provided with a signal value of $x_{3-(p, q)}$, and to output
a first sub-pixel output signal provided with a signal value of $X_{1-(p, q)}$ and used for determining the display gradation of said first sub-pixel,
a second sub-pixel output signal provided with a signal value of $X_{2-(p, q)}$ and used for determining the display gradation of said second sub-pixel,
a third sub-pixel output signal provided with a signal value of $X_{3-(p, q)}$ and used for determining the display gradation of said third sub-pixel as well as
a fourth sub-pixel output signal provided with a signal value of $X_{4-(p, q)}$ and used for determining the display gradation of said fourth sub-pixel with regard to a (p, q)th pixel where notations p and q are integers satisfying equations $1 \leqq p \leqq P$ and $1 \leqq q \leqq Q$, wherein a maximum lightness value $V_{max}(S)$ expressed as a function of variable saturation S in an HSV color space enlarged by adding said fourth color is stored in said signal processing section, and said signal processing section carries out the following processes of (B-1) finding said saturation S and said lightness value V(S) for each of a plurality of pixels on the basis of the signal values of sub-pixel input signals in said pixels, (B-2) finding an extension coefficient $\alpha_0$ on the basis of at least one of ratios $V_{max}(S)/V(S)$ found in said pixels, (B-3) finding said output signal value $X_{4-(p, q)}$ in said (p, q)th pixel on the basis of at least said input signal values $x_{1-(p, q)}$, $x_{2-(p, q)}$ and $x_{3-(p, q)}$, and (B-4) finding said output signal value $X_{1-(p, q)}$ in said (p, q)th pixel on the basis of said input signal value $x_{1-(p, q)}$ said extension coefficient $\alpha_0$ and said output signal value $X_{4-(p, q)}$, finding said output signal value $X_{2-(p, q)}$ in said (p, q)th pixel on the basis of said input signal value $x_{2-(p, q)}$, said extension coefficient $\alpha_0$ and said output signal value $X_{4-(p, q)}$ and finding said output signal value $X_{3-(p, q)}$ in said (p, q)th pixel on the basis of said input signal value $x_{3-(p, q)}$, said extension coefficient $\alpha_0$ and said output signal value $X_{4-(p, q)}$.

2. The image display apparatus according to claim 1 wherein said signal processing section is capable of finding output signal values $X_{1-(p, q)}$, $X_{2-(p, q)}$ and $X_{3-(p, q)}$ on the basis of the following equations:

$$X_{1-(p,q)}=\alpha_0 \cdot x_{1-(p,q)}-\chi \cdot X_{4-(p,q)};$$

$$X_{2-(p,q)}=\alpha_0 \cdot x_{2-(p,q)}-\chi \cdot X_{4-(p,q)}; \text{ and}$$

$$X_{3-(p,q)}=\alpha_0 \cdot x_{3-(p,q)}-\chi \cdot X_{4-(p,q)},$$

where, in said above equations, reference notation $\chi$ denotes a constant dependent on said image display apparatus whereas reference notations $X_{1-(p, q)}$, $X_{2-(p, q)}$ and $X_{3-(p, q)}$ each denote an output signal value in said (p, q)th pixel.

3. The image display apparatus according to claim 2 wherein said constant $\chi$ is expressed by the following equation:

$$\chi=BN_4/BN_{1-3}$$

where, in said above equation, reference notation $BN_{1-3}$ denotes the luminance of a set of first, second and third sub-pixels for a case in which a signal having a value corresponding to the maximum signal value of said first sub-pixel output signal is supplied to said first sub-pixel, a signal having a value corresponding to the maximum signal value of said second sub-pixel output signal is supplied to said second sub-pixel, and a signal having a value corresponding to the maximum signal value of said third sub-pixel output signal is supplied to said third sub-pixel whereas reference notation $BN_4$ denotes the luminance of said fourth sub-pixel for a case in which a signal having a value corresponding to the maximum signal value of said fourth sub-pixel output signal is supplied to said fourth sub-pixel.

4. The image display apparatus according to claim 1 wherein a saturation $S_{(p, q)}$ and a lightness value $V_{(p, q)}$ in said HSV color space in a (p, q)th pixel are found on the basis of the following equations:

$$S_{(p,q)}=(Max_{(p,q)}-Min_{(p,q)})/Max_{(p,q)};\text{ and}$$

$$V_{(p,q)}=Max_{(p,q)},$$

where, in said above equations, notation $Max_{(p, q)}$ denotes the maximum value of the signal values of said three sub-pixel input signals $x_{1-(p, q)}$, $x_{2-(p, q)}$ and $x_{3-(p, q)}$, notation $Min_{(p, q)}$ denotes the minimum value of the signal values of said three sub-pixel input signals $x_{1-(p, q)}$, $x_{2-(p, q)}$ and $x_{3-(p, q)}$, said saturation S can have a value in the range 0 to 1 and said lightness value V can have a value in said range 0 to $(2^n-1)$ whereas notation n in the expression $(2^n-1)$ is an integer representing the number of display gradation bits.

5. The image display apparatus according to claim 4 wherein said output signal value $X_{4-(p, q)}$ is determined on the basis of said minimum value $Min_{(p, q)}$ and said extension coefficient $\alpha_0$.

6. The image display apparatus according to claim 1 wherein the smallest value among the values of said ratios $V_{max}(S)/V(S)$ found in said pixels is taken as said extension coefficient $\alpha_0$.

7. The image display apparatus according to claim 1 wherein said fourth color is the white color.

8. The image display apparatus according to claim 1 wherein said image display apparatus is a color liquid-crystal display apparatus which includes a first color filter placed between said first sub-pixel and the image observer to serve as a filter for passing light of said first elementary color, a second color filter placed between said second sub-pixel and said image observer to serve as a filter for passing light of said second elementary color, and a third color filter placed between said third sub-pixel and said image observer to serve as a filter for passing light of said third elementary color.

9. The image display apparatus according to claim 1 wherein all (P×Q) pixels are taken as a plurality of pixels for each of which said saturation S and said lightness value V(S) are to be found.

10. The image display apparatus according to claim 1 wherein $(P/P_0 \times Q/Q_0)$ pixels are taken as a plurality of pixels for each of which said saturation S and said lightness value V(S) are to be found where notations $P_0$ and $Q_0$ represent values satisfying equations $P \geqq P_0$ and $Q \geqq Q_0$ whereas at least one of ratios $P/P_0$ and $Q/Q_0$ are integers each equal to or greater than 2.

11. The image display apparatus according to claim 1 wherein said extension coefficient $\alpha_0$ is determined for every image display frame.

12. An image display apparatus comprising:

(A-1) a first image display panel having a two-dimensional matrix with (P×Q) first sub-pixels each used for displaying a first elementary color;

(A-2) a second image display panel having a two-dimensional matrix with (P×Q) second sub-pixels each used for displaying a second elementary color;

(A-3) a third image display panel having a two-dimensional matrix with (P×Q) third sub-pixels each used for displaying a third elementary color;

(A-4) a fourth image display panel having a two-dimensional matrix with (P×Q) fourth sub-pixels each used for displaying a fourth color;

(B) a signal processing section configured to receive a first sub-pixel input signal provided with a signal value of $x_{1-(p, q)}$, a second sub-pixel input signal provided with a signal value of $x_{2-(p, q)}$ and a third sub-pixel input signal provided with a signal value of $x_{3-(p, q)}$, and to output a first sub-pixel output signal provided with a signal value of $X_{1-(p, q)}$ and used for determining the display gradation of said first sub-pixel, a second sub-pixel output signal provided with a signal value of $X_{2-(p, q)}$ and used for determining the display gradation of said second sub-pixel, a third sub-pixel output signal provided with a signal value of $X_{3-(p, q)}$ and used for determining the display gradation of said third sub-pixel as well as a fourth sub-pixel output signal provided with a signal value of $X_{4-(p, q)}$ and used for determining the display gradation of said fourth sub-pixel with regard to (p, q)th first, second and third sub-pixels where notations p and q are integers satisfying equations $1 \leqq p \leqq P$ and $1 \leqq q \leqq Q$; and (C) synthesis means for synthesizing images output by said first, second, third and fourth image display panels, wherein a maximum lightness value $V_{max}(S)$ expressed as a function of variable saturation S in an HSV color space enlarged by adding said fourth color is stored in said signal processing section, and said signal processing section carries out the following processes of (B-1) finding said saturation S and said lightness value V(S) for each of a plurality of sets each having said first, second and third sub-pixels on the basis of the signal values of sub-pixel input signals in said sets each having said first, second and third sub-pixels, (B-2) finding an extension coefficient $\alpha_0$ on the basis of at least one of ratios $V_{max}(S)/V(S)$ found in said sets each having said first, second and third sub-pixels, (B-3) finding said output signal value $X_{4-(p, q)}$ in said (p, q)th fourth sub-pixel on the basis of at least said input signal values $x_{1-(p, q)}$, $x_{2-(p, q)}$ and $x_{3-(p, q)}$, and (B-4) finding said output signal value $X_{1-(p, q)}$ in said (p, q)th first sub-pixel on the basis of said input signal value $x_{1-(p, q)}$, said extension coefficient $\alpha_0$ and said output signal value $X_{4-(p, q)}$, finding said output signal value $X_{2-(p, q)}$ in said (p, q)th second sub-pixel on the basis of said input signal value $x_{2-(p, q)}$, said extension coefficient $\alpha_0$ and said output signal value $X_{4-(p, q)}$ and finding said output signal value $X_{3-(p, q)}$ in said (p, q)th third sub-pixel on the basis of said input signal value $x_{3-(p, q)}$, said extension coefficient $\alpha_0$ and said output signal value $X_{4-(p, q)}$.

13. An image display apparatus adopting a field sequential system, comprising:

(A) an image display panel having a two-dimensional matrix with (P×Q) pixels; and (B) a signal processing section configured to receive a first input signal provided with a signal value of $x_{1-(p, q)}$, a second input signal provided with a signal value of $x_{2-(p, q)}$ and a third input signal provided with a signal value of $x_{3-(p, q)}$, and to output a first output signal provided with a signal value of $X_{1-(p, q)}$ and used for determining the display gradation of a first elementary color, a second output signal provided with a signal value of $X_{2-(p, q)}$ and used for determining the display gradation of a second elementary color, a third output signal provided with a signal value of $X_{3-(p, q)}$ and used for determining the display gradation of a third elementary color as well as a fourth output signal provided with a signal value of $X_{4-(p, q)}$ and used for determining the display gradation of a fourth color with regard to a (p, q)th pixel where notations p and q are integers satisfying said equations $1 \leqq p \leqq P$ and $1 \leqq q \leqq Q$, wherein a maximum lightness value $V_{max}(S)$ expressed as a function of variable saturation S in an HSV color space enlarged by adding said fourth color is stored in said signal processing section, and said signal processing section carries out the following processes of (B-1) finding said saturation S and said lightness value V(S) for each of a plurality of pixels on the basis of the signal values of first, second and third input signals in said pixels, (B-2) finding an extension coefficient $\alpha_0$ on the basis of at least one of ratios $V_{max}(S)/V(S)$ found in said pixels, (B-3) finding said output signal value $X_{4-(p, q)}$ in said (p, q)th pixel on the basis of at least said input signal values $x_{1-(p, q)}$, $x_{2-(p, q)}$ and $x_{3-(p, q)}$, and (B-4) finding said output signal value $X_{1-(p, q)}$ in said (p, q)th pixel on the basis of said input signal value $x_{1-(p, q)}$, said extension coefficient $\alpha_0$ and said output signal value $X_{4-(p, q)}$, finding said output signal value $X_{2-(p, q)}$ in said (p, q)th pixel on the basis of said input signal value $x_{2-(p, q)}$, said extension coefficient $\alpha_0$ and said output signal value $X_{4-(p, q)}$ and finding said output signal value $X_{3-(p, q)}$ in said (p, q)th pixel on the basis of said input signal value $x_{3-(p, q)}$, said extension coefficient $\alpha_0$ and said output signal value $X_{4-(p, q)}$.

14. An image display apparatus assembly comprising:

an image display apparatus including (A) an image display panel having a two-dimensional matrix with (P×Q) pixels each including a first sub-pixel for displaying a first elementary color, a second sub-pixel for displaying a second elementary color, a third sub-pixel for displaying a third elementary color and a fourth sub-pixel for displaying a fourth color, and (B) a signal processing section configured to receive a first sub-pixel input signal provided with a signal value of $x_{1-(p, q)}$, a second sub-pixel input signal provided with a signal value of $x_{2-(p, q)}$ and a third sub-pixel input signal provided with a signal value of $x_{3-(p, q)}$, and to output a first sub-pixel output signal provided with a signal value of $X_{1-(p, q)}$ and used for determining the display gradation of said first sub-pixel, a second sub-pixel output signal provided with a signal value of $X_{2-(p, q)}$ and used for determining the display gradation of said second sub-pixel, a third sub-pixel output signal provided with a signal value of $X_{3-(p, q)}$ and used for determining the display gradation of said third sub-pixel as well as a fourth sub-pixel output signal provided with a signal value of $X_{4-(p, q)}$ and used for determining the display gradation of said fourth sub-pixel with regard to a (p, q)th pixel where notations p and q are integers satisfying equations $1 \leqq p \leqq P$ and $1 \leqq q \leqq Q$; and a planar light-source apparatus for radiating light to the rear face of said image display apparatus, wherein a maximum lightness value $V_{max}(S)$ expressed as a function of variable saturation S in an HSV color space enlarged by adding said fourth color is stored in said signal processing section, and said signal processing section carries out the following processes of (B-1) finding said saturation S and said lightness value V(S) for each of a plurality of pixels on the basis of the signal values of sub-pixel input signals in said pixels, (B-2) finding an extension coefficient $\alpha_0$ on the basis of at least one of ratios $V_{max}(S)/V(S)$ found in said pixels, (B-3) finding said output signal value $X_{4-(p, q)}$ in said (p, q)th pixel on the basis of at least said input signal values $x_{1-(p, q)}$, $x_{2-(p, q)}$ and $x_{3-(p, q)}$, and (B-4) finding said output signal value $X_{1-(p, q)}$ in said (p, q)th pixel on the basis of said input signal value $x_{1-(p, q)}$, said extension coefficient $\alpha_0$ and said output signal value $X_{4-(p, q)}$, finding said output signal value $X_{2-(p, q)}$ in said (p, q)th pixel on the basis of said input signal value $x_{2-(p, q)}$, said extension coefficient $\alpha_0$ and said output signal value $X_{4-(p, q)}$, and finding said output signal value $X_{3-(p, q)}$ in said (p, q)th pixel on the basis of said input signal value $x_{3-(p, q)}$, said extension coefficient $\alpha_0$ and said output signal value $X_{4-(p, q)}$.

15. The image display apparatus assembly in accordance with claim 14 wherein the luminance of said planar light-source apparatus is reduced on the basis of said extension coefficient $\alpha_0$.

16. A method for driving an image display apparatus including (A) an image display panel having a two-dimensional matrix with (P×Q) pixels each including a first sub-pixel for displaying a first elementary color, a second sub-pixel for displaying a second elementary color, a third sub-pixel for displaying a third elementary color and a fourth sub-pixel for displaying a fourth color, and (B) a signal processing section configured to receive a first sub-pixel input signal provided with a signal value of $x_{1-(p, q)}$, a second sub-pixel input signal provided with a signal value of $x_{2-(p, q)}$ and a third sub-pixel input signal provided with a signal value of $x_{3-(p, q)}$, and to output a first sub-pixel output signal provided with a signal value of $X_{1-(p, q)}$ and used for determining the display gradation of said first sub-pixel, a second sub-pixel output signal provided with a signal value of $X_{2-(p, q)}$ and used for determining the display gradation of said second sub-pixel, a third sub-pixel output signal provided with a signal value of $X_{3-(p, q)}$ and used for determining the display gradation of said third sub-pixel as well as a fourth sub-pixel output signal provided with a signal value of $X_{4-(p, q)}$ and used for determining the display gradation of said fourth sub-pixel with regard to a (p, q)th pixel where notations p and q are integers satisfying equations $1 \leqq p \leqq P$ and $1 \leqq q \leqq Q$, wherein a maximum lightness value $V_{max}(S)$ expressed as a function of variable saturation S in an HSV color space enlarged by adding said fourth color is stored in said signal processing section, and said signal processing section carries out the following steps of:

(a) finding said saturation S and said lightness value V(S) for each of a plurality of pixels on the basis of said signal values of sub-pixel input signals in said pixels;

(b) finding an extension coefficient $\alpha_0$ on the basis of at least one of ratios $V_{max}(S)/V(S)$ found in said pixels;

(c) finding said output signal value $X_{4-(p, q)}$ in said (p, q)th pixel on the basis of at least said input signal values $x_{1-(p, q)}$, $x_{2-(p, q)}$ and $x_{3-(p, q)}$; and (d) finding said output signal value $X_{1-(p, q)}$ in said (p, q)th pixel on the basis of said input signal value $x_{1-(p, q)}$, said extension coefficient $\alpha_0$ and said output signal value $X_{4-(p, q)}$, finding said output signal value $X_{2-(p, q)}$ in said (p, q)th pixel on the basis of said input signal value $x_{2-(p, q)}$, said extension coefficient $\alpha_0$ and said output signal value $X_{4-(p, q)}$ and finding said output signal value $X_{3-(p, q)}$ in said (p, q)th pixel on the basis of said input signal value $x_{3-(p, q)}$, said extension coefficient $\alpha_0$ and said output signal value $X_{4-(p, q)}$.

17. A method for driving an image display apparatus including (A-1) a first image display panel having a two-dimensional matrix with (P×Q) first sub-pixels each used for displaying a first elementary color, (A-2) a second image display panel having a two-dimensional matrix with (P×Q) second sub-pixels each used for displaying a second elementary color, (A-3) a third image display panel having a two-dimensional matrix with (P×Q) third sub-pixels each used for displaying a third elementary color, (A-4) a fourth image display panel having a two-dimensional matrix with (P×Q) fourth sub-pixels each used for displaying a fourth color, (B) a signal processing section configured to receive a first sub-pixel input signal provided with a signal value of $x_{1-(p, q)}$, a second sub-pixel input signal provided with a signal value of $x_{2-(p, q)}$ and a third sub-pixel input signal provided with a signal value of $x_{3-(p, q)}$, and to output a first sub-pixel output signal provided with a signal value of $X_{1-(p, q)}$ and used for determining the display gradation of said first sub-pixel, a second sub-pixel output signal provided with a signal value of $X_{2-(p, q)}$ and used for determining the display gradation of said second sub-pixel, a third sub-pixel output signal provided with a signal value of $X_{3-(p, q)}$ and used for determining the display gradation of said third sub-pixel as well as a fourth sub-pixel output signal provided with a signal value of $X_{4-(p, q)}$ and used for determining the display gradation of said fourth sub-pixel with regard to (p, q)th first, second and third sub-pixels where notations p and q are integers satisfying equations $1 \leqq p \leqq P$ and $1 \leqq q \leqq Q$, and (C) synthesis means for synthesizing images output by said first, second, third and fourth image display panels, wherein a maximum lightness value $V_{max}(S)$ expressed as a function of variable saturation S in an HSV color space enlarged by adding said fourth color is stored in said signal processing section, and said signal processing section carries out the following steps of:

(a) finding said saturation S and said lightness value V(S) for each of a plurality of sets each having said first, second and third sub-pixels on the basis of said signal values of sub-pixel input signals in said sets each having said first, second and third sub-pixels;

(b) finding an extension coefficient $\alpha_0$ on the basis of at least one of ratios $V_{max}(S)/V(S)$ found in said sets each having said first, second and third sub-pixels;

(c) finding said output signal value $X_{4-(p, q)}$ in said (p, q)th fourth sub-pixel on the basis of at least said input signal values $x_{1-(p, q)}$, $x_{2-(p, q)}$ and $x_{3-(p, q)}$; and (d) finding said output signal value $X_{1-(p, q)}$ in said (p, q)th first sub-pixel on the basis of said input signal value $x_{1-(p, q)}$, said extension coefficient $\alpha_0$ and said output signal value $X_{4-(p, q)}$, finding said output signal value $X_{2-(p, q)}$ in said (p, q)th second sub-pixel on the basis of said input signal value $x_{2-(p, q)}$, said extension coefficient $\alpha_0$ and said output signal value $X_{4-(p, q)}$ and finding said output signal value $X_{3-(p, q)}$ in said (p, q)th third sub-pixel on the basis of said input signal value $x_{3-(p, q)}$, said extension coefficient $\alpha_0$ and said output signal value $X_{4-(p, q)}$.

18. A method for driving an image display apparatus adopting a field sequential system, said image display apparatus including (A) an image display panel having a two-dimensional matrix with (P×Q) pixels, and (B) a signal processing section configured to receive a first input signal provided with a signal value of $x_{1-(p, q)}$, a second input signal provided with a signal value of $x_{2-(p, q)}$ and a third sub-pixel input signal provided with a signal value of $x_{3-(p, q)}$, and to output a first output signal provided with a signal value of $X_{1-(p, q)}$ and used for determining the display gradation of a first elementary color, a second output signal provided with a signal value of $X_{2-(p, q)}$ and used for determining the display gradation of a second elementary color, a third output signal provided with a signal value of $X_{3-(p, q)}$ and used for determining the display gradation of a third elementary color as well as a fourth output signal provided with a signal value of $X_{4-(p, q)}$ and used for determining the display gradation of said fourth color with regard to a (p, q)th pixel where notations p and q are integers satisfying said equations $1 \leqq p \leqq P$ and $1 \leqq q \leqq Q$, wherein a maximum lightness value $V_{max}(S)$ expressed as a function of variable saturation S in an HSV color space enlarged by adding said fourth color is stored in said signal processing section, and said signal processing section carries out the following steps of:

(a) finding said saturation S and said lightness value V(S) for each of a plurality of pixels on the basis of the signal values of first, second and third input signals in said pixels;

(b) finding an extension coefficient $\alpha_0$ on the basis of at least one of ratios $V_{max}(S)/V(S)$ found in said pixels;

(c) finding said output signal value $X_{4-(p, q)}$ in said (p, q)th pixel on the basis of at least said input signal values $x_{1-(p, q)}$, $x_{2-(p, q)}$ and $x_{3-(p, q)}$; and (d) finding said output signal value $X_{1-(p, q)}$ in said (p, q)th pixel on the basis of said input signal value $x_{1-(p, q)}$, said extension coefficient $\alpha_0$ and said output signal value $X_{4-(p, q)}$, finding said output signal value $X_{2-(p, q)}$ in said (p, q)th pixel on the basis of said input signal value $x_{2-(p, q)}$, said extension coefficient $\alpha_0$ and said output signal value $X_{4-(p, q)}$ and finding said output signal value $X_{3-(p, q)}$ in said (p, q)th pixel on the basis of said input signal value $x_{3-(p, q)}$, said extension coefficient $\alpha_0$ and said output signal value $X_{4-(p, q)}$.

19. A method for driving an image display apparatus assembly comprising an image display apparatus including (A) an image display panel having a two-dimensional matrix with (P×Q) pixels each including a first sub-pixel for displaying a first elementary color, a second sub-pixel for displaying a second elementary color, a third sub-pixel for displaying a third elementary color and a fourth sub-pixel for displaying a fourth color, and (B) a signal processing section configured to receive a first sub-pixel input signal provided with a signal value of $x_{1-(p, q)}$, a second sub-pixel input signal provided with a signal value of $x_{2-(p, q)}$ and a third sub-pixel input signal provided with a signal value of $x_{3-(p, q)}$ and to output a first sub-pixel output signal provided with a signal value of $X_{1-(p, q)}$ and used for determining the display gradation of said first sub-pixel, a second sub-pixel output signal provided with a signal value of $X_{2-(p, q)}$ and used for determining the display gradation of said second sub-pixel, a third sub-pixel output signal provided with a signal value of $X_{3-(p, q)}$ and used for determining the display gradation of said third sub-pixel as well as a fourth sub-pixel output signal provided with a signal value of $X_{4-(p, q)}$ and used for determining the display gradation of said fourth sub-pixel with regard to a (p, q)th pixel where notations p and q are integers satisfying equations $1 \leqq p \leqq P$ and $1 \leqq q \leqq Q$, and a planar light-source apparatus for radiating light to the rear face of said image display apparatus, wherein a maximum lightness value $V_{max}(S)$ expressed as a function of variable saturation S in an HSV color space enlarged by adding said fourth color is stored in said signal processing section, and said signal processing section carries out the following steps of:

(a) finding said saturation S and said lightness value V(S) for each of a plurality of pixels on the basis of the signal values of sub-pixel input signals in said pixels;

(b) finding an extension coefficient $\alpha_0$ on the basis of at least one of ratios $V_{max}(S)/V(S)$ found in said pixels;

(c) finding said output signal value $X_{4-(p, q)}$ in said (p, q)th pixel on the basis of at least said input signal values $x_{1-(p, q)}$, $x_{2-(p, q)}$ and $x_{3-(p, q)}$;

(d) finding said output signal value $X_{1-(p, q)}$ in said (p, q)th pixel on the basis of said input signal value $x_{1-(p, q)}$, said extension coefficient $\alpha_0$ and said output signal value $X_{4-(p, q)}$, finding said output signal value $X_{2-(p, q)}$ in said (p, q)th pixel on the basis of said input signal value $x_{2-(p, q)}$, said extension coefficient $\alpha_0$ and said output signal value $X_{4-(p, q)}$ and finding said output signal value $X_{3-(p, q)}$ in said (p, q)th pixel on the basis of said input signal value $x_{3-(p, q)}$, said extension coefficient $\alpha_0$ and said output signal value $X_{4-(p, q)}$; and (e) reducing the luminance of said planar light-source apparatus on the basis of said extension coefficient $\alpha_0$.

* * * * *